United States Patent [19]

Allan et al.

[11] Patent Number: 5,156,772
[45] Date of Patent: Oct. 20, 1992

[54] CIRCUIT WRITER MATERIALS

[75] Inventors: G. Graham Allan, Seattle, Wash.; Kenneth N. Bates, Sunnyvale, Calif.; Amar N. Neogi, Seattle, Wash.

[73] Assignee: Ariel Electronics, Inc., Sunnyvale, Calif.

[21] Appl. No.: 193,291

[22] Filed: May 11, 1988

[51] Int. Cl.$^5$ ............................................. H01B 1/06
[52] U.S. Cl. .................................. 252/514; 252/512; 523/457
[58] Field of Search .............. 252/512, 514; 524/439; 174/685; 523/457

[56] References Cited

U.S. PATENT DOCUMENTS

| | | | |
|---|---|---|---|
| 2,866,764 | 12/1958 | West et al. | 260/30.4 |
| 3,982,941 | 9/1976 | Inskip | 96/34 |
| 4,049,844 | 9/1977 | Bolon | 427/54 |
| 4,187,339 | 2/1980 | Cayrol | 428/208 |
| 4,402,135 | 9/1983 | Schweingruber et al. | 29/832 |
| 4,652,398 | 3/1987 | Goswami et al. | 252/514 |
| 4,696,764 | 9/1987 | Yamakaki | 252/503 |
| 4,748,068 | 5/1988 | Fahner et al. | 428/201 |
| 4,775,573 | 10/1988 | Turek | 428/209 |
| 4,818,439 | 4/1989 | Wiley | 252/411 |
| 4,874,548 | 10/1989 | Hajovsky | 252/511 |

OTHER PUBLICATIONS

Brochure "EPO-TEK H Series Epoxies", Epoxy Technology Inc., 1978.
IBM Technical Disclosure Bulletin "Extrusion Printing" vol. 15, No. 10, Mar. 1973.

*Primary Examiner*—Josephine Barr
*Attorney, Agent, or Firm*—Limbach & Limbach

[57] ABSTRACT

Materials are disclosed which are used to produce traces on a circuit board by means of extrusion. The materials are polymer thick films (PTF) which are thixotropic. Conductive traces are composed of conductive particles, a resin and hardener, and two solvents, one having a relatively high volatility and one having a relatively low volatility. Thus when a newly deposited trace is subjected to a stream of hot air, the fast solvent will substantially evaporate leaving a firm paste behind over which another layer of PTF can be written without causing interference between the layers. The slow solvent then permits the various layers of traces to be polymerized together at the same time in a one step operation. The insulative material is similar to the conductive material in that it includes a resin and hardener and two solvents of differening volatility. In addition, in the preferred mode, it includes a gelling agent.

5 Claims, 38 Drawing Sheets

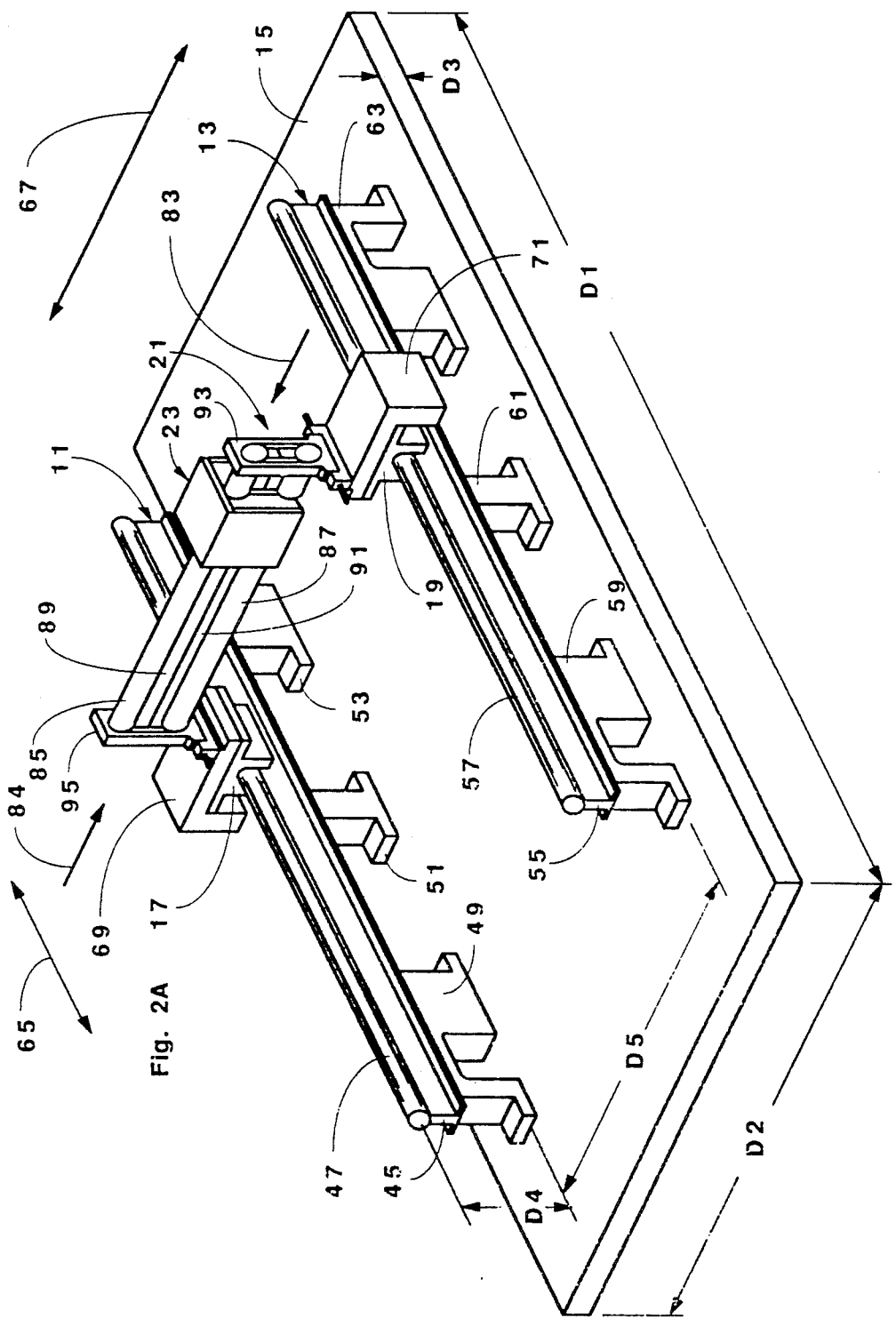

FIG. 2B
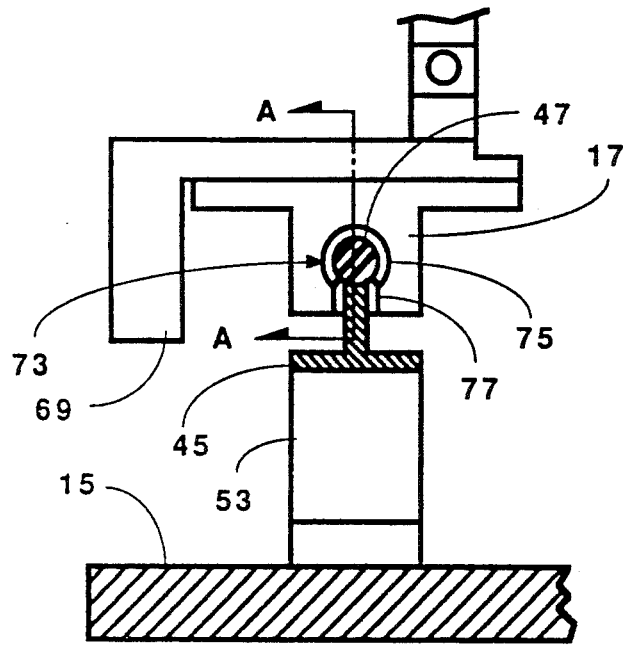
FIG. 2C (Section A-A)
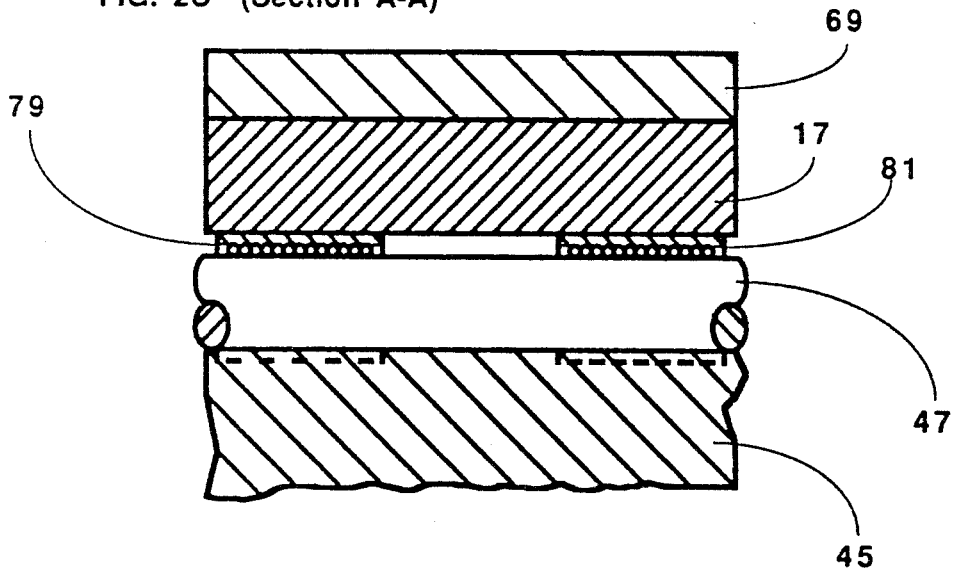

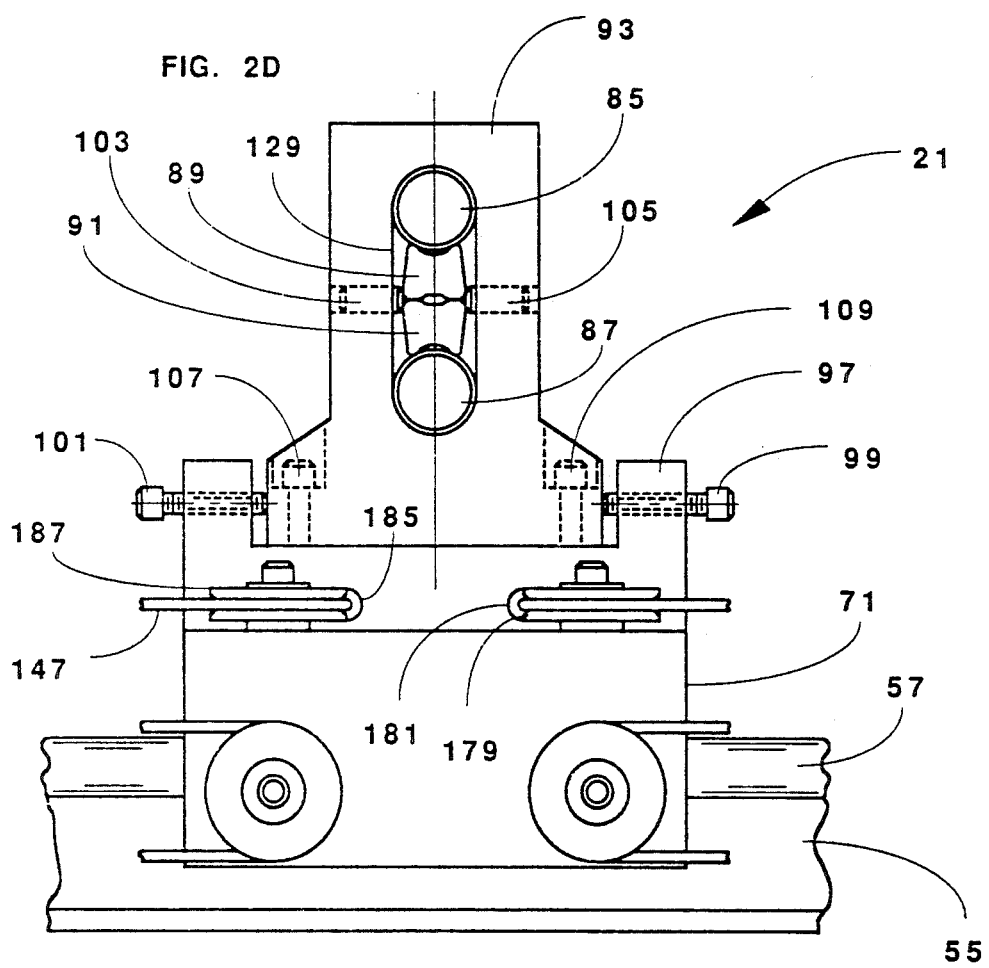

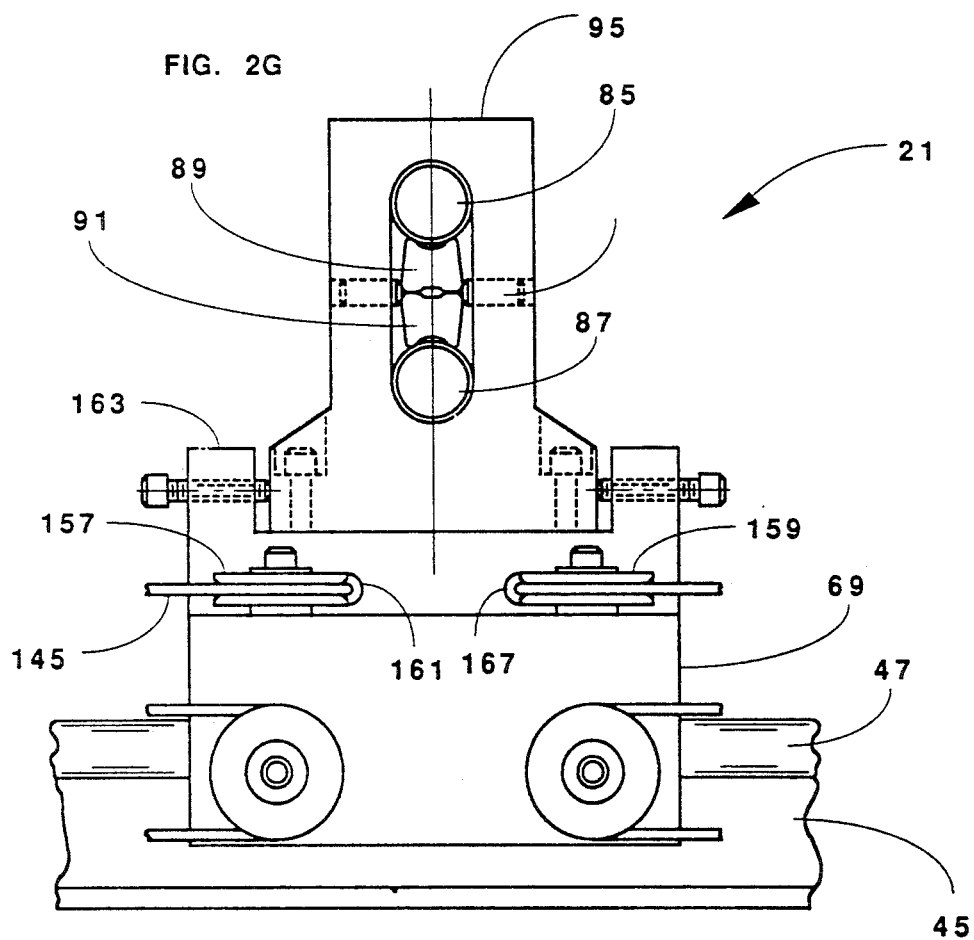

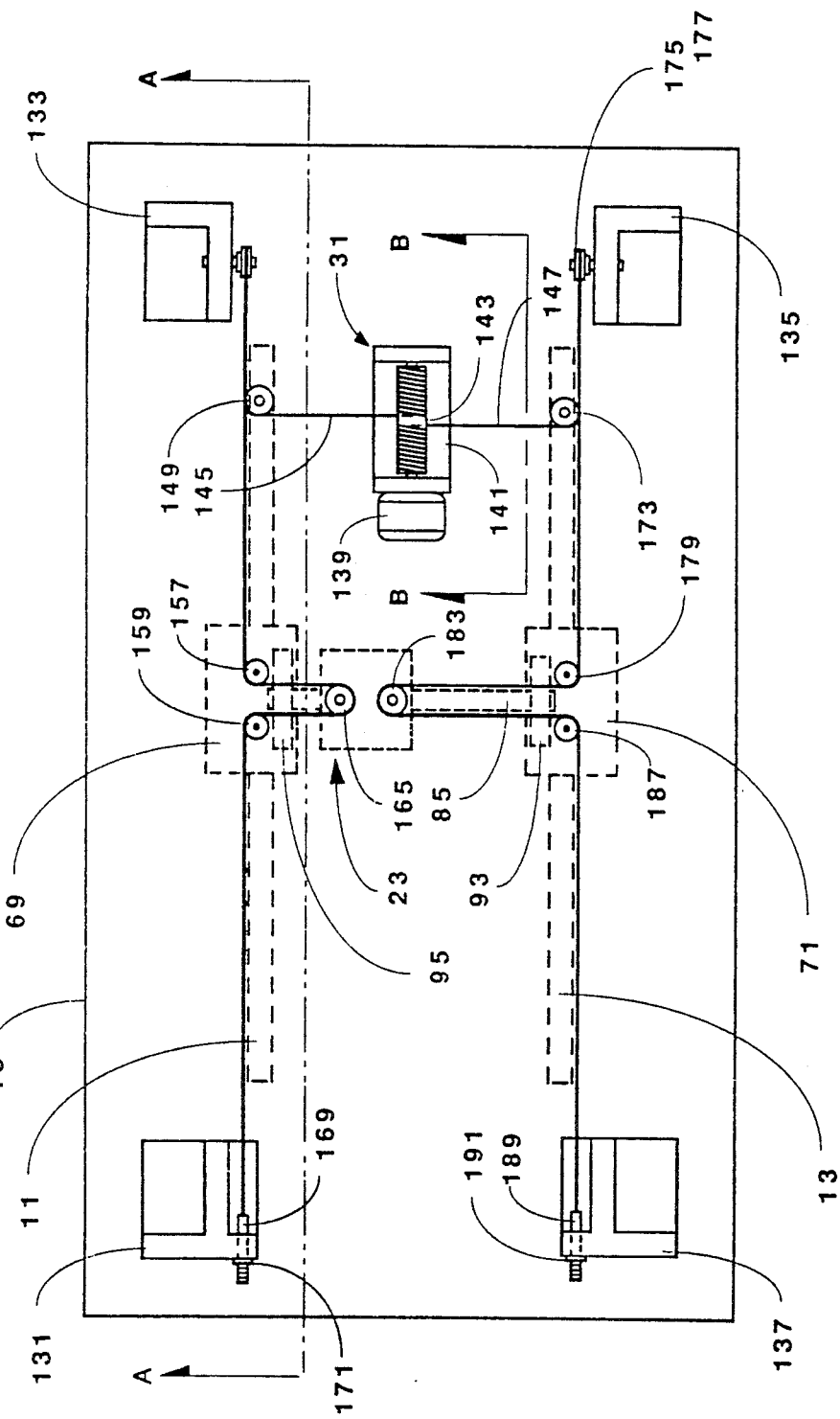

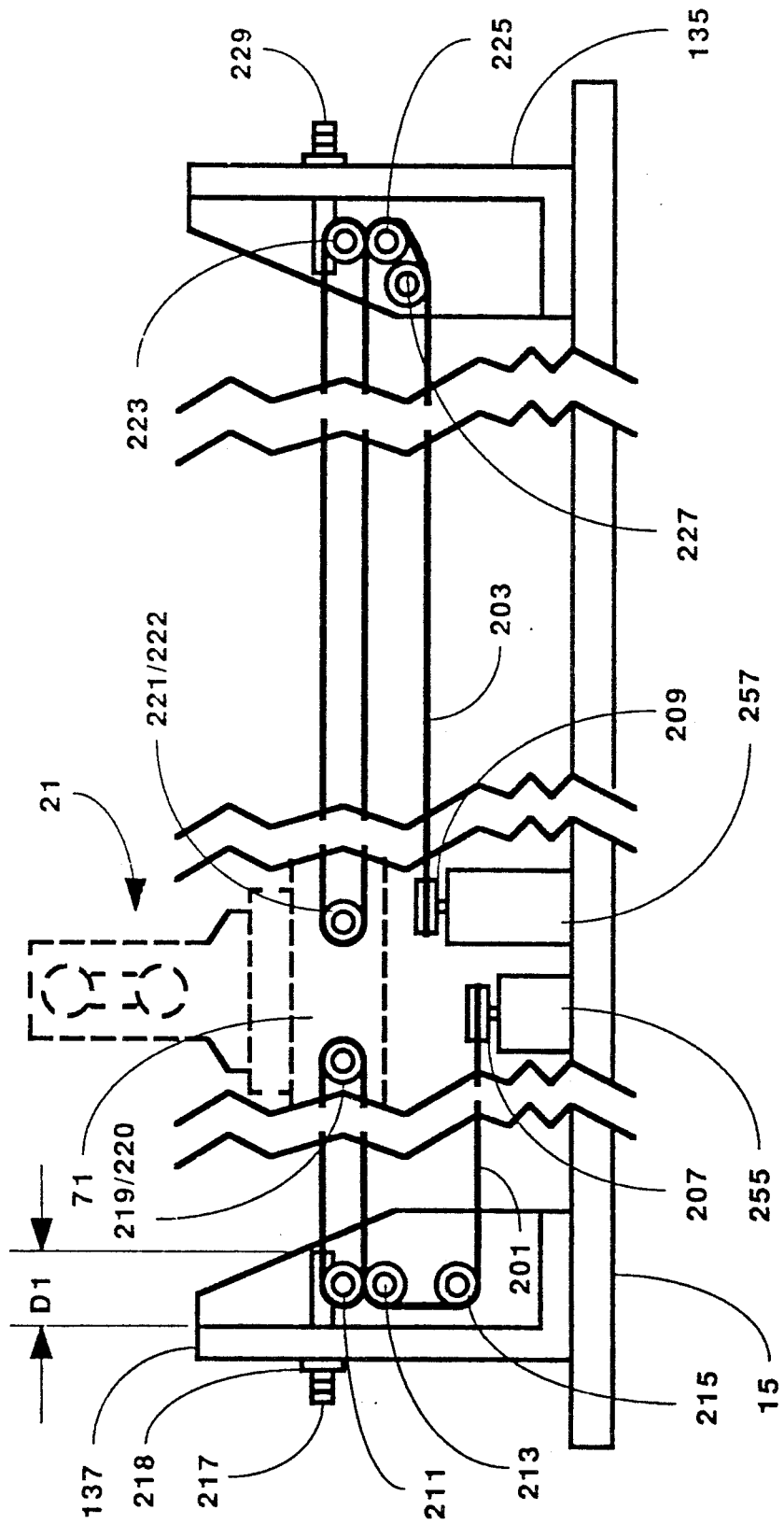

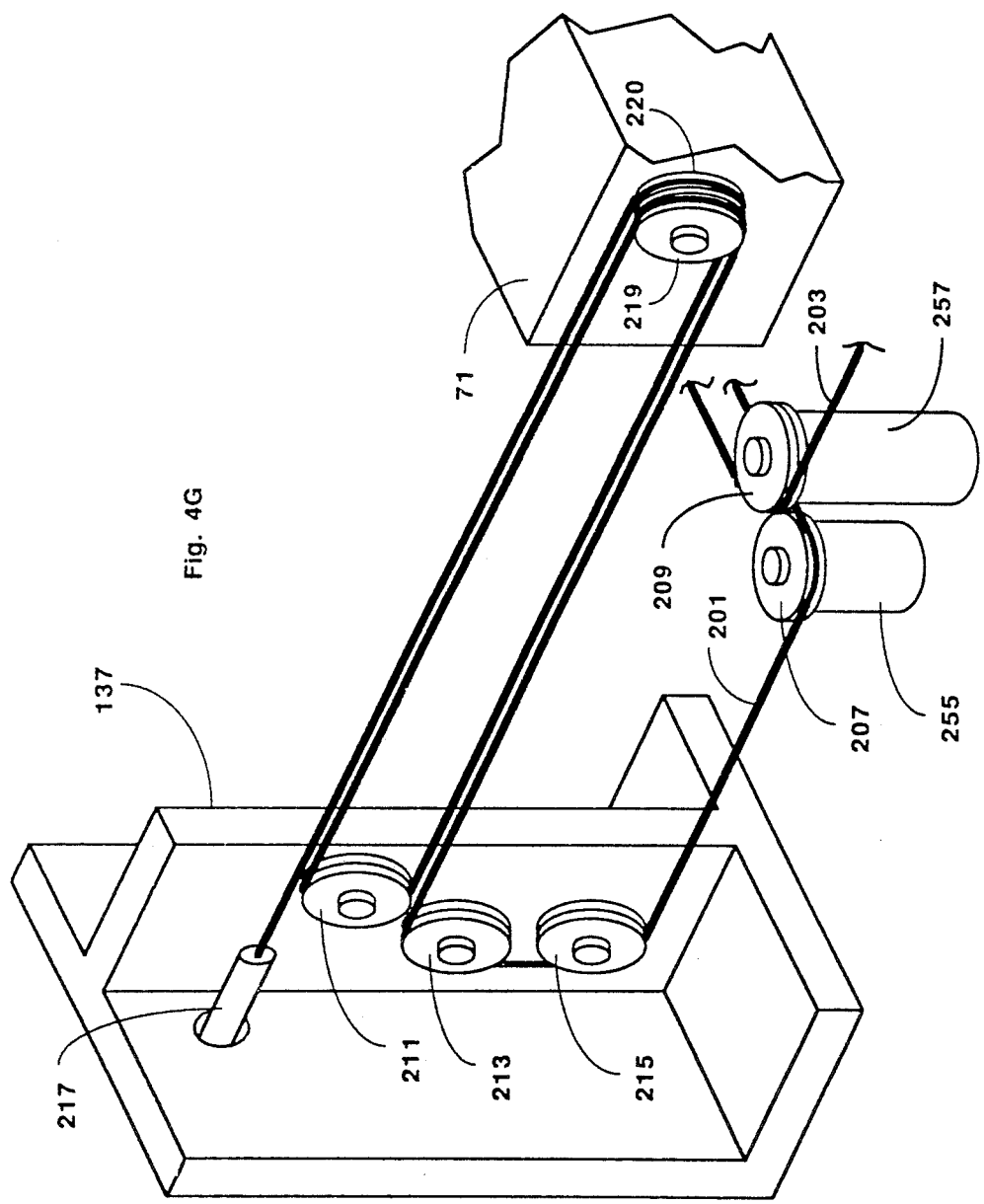

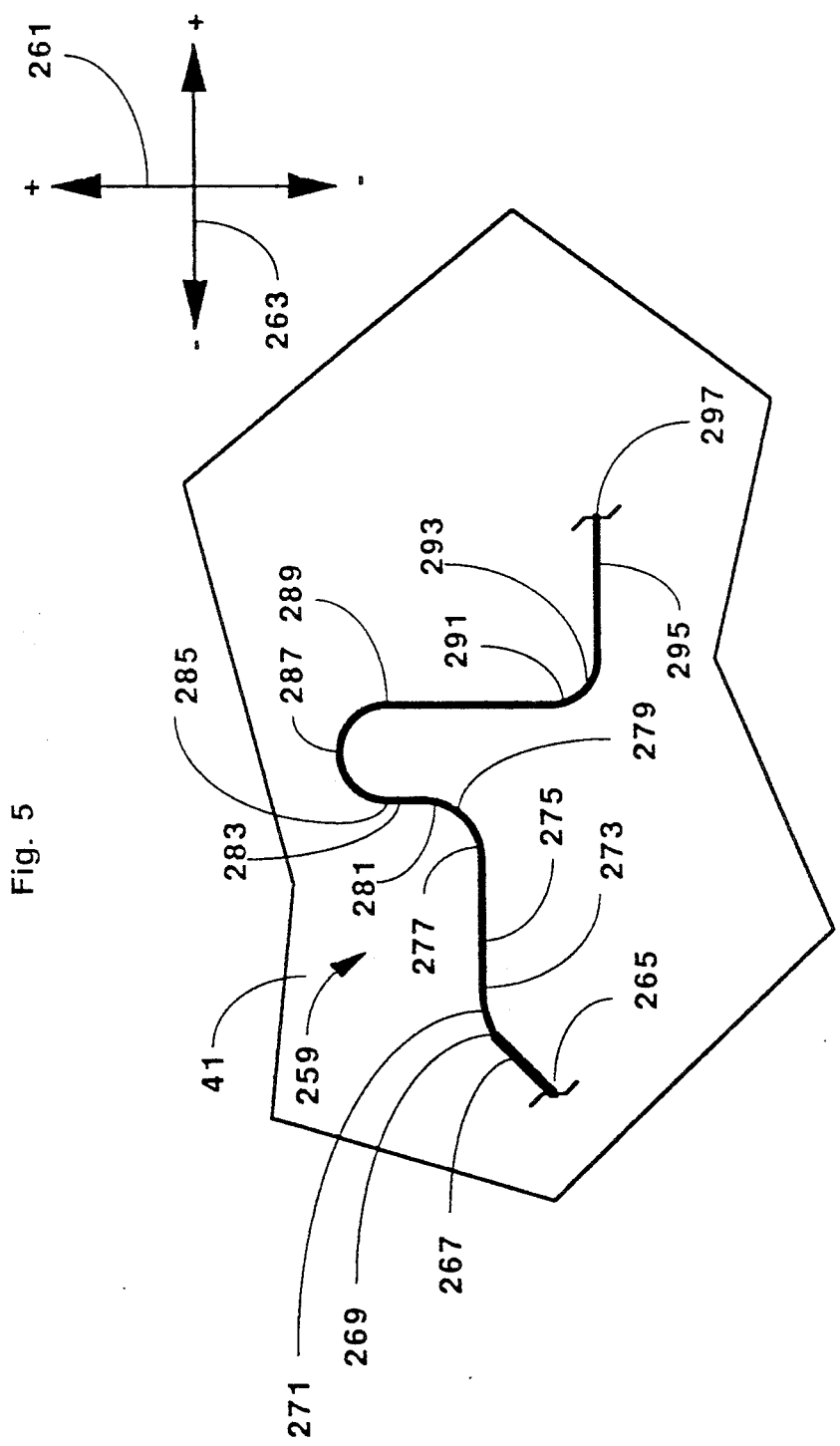

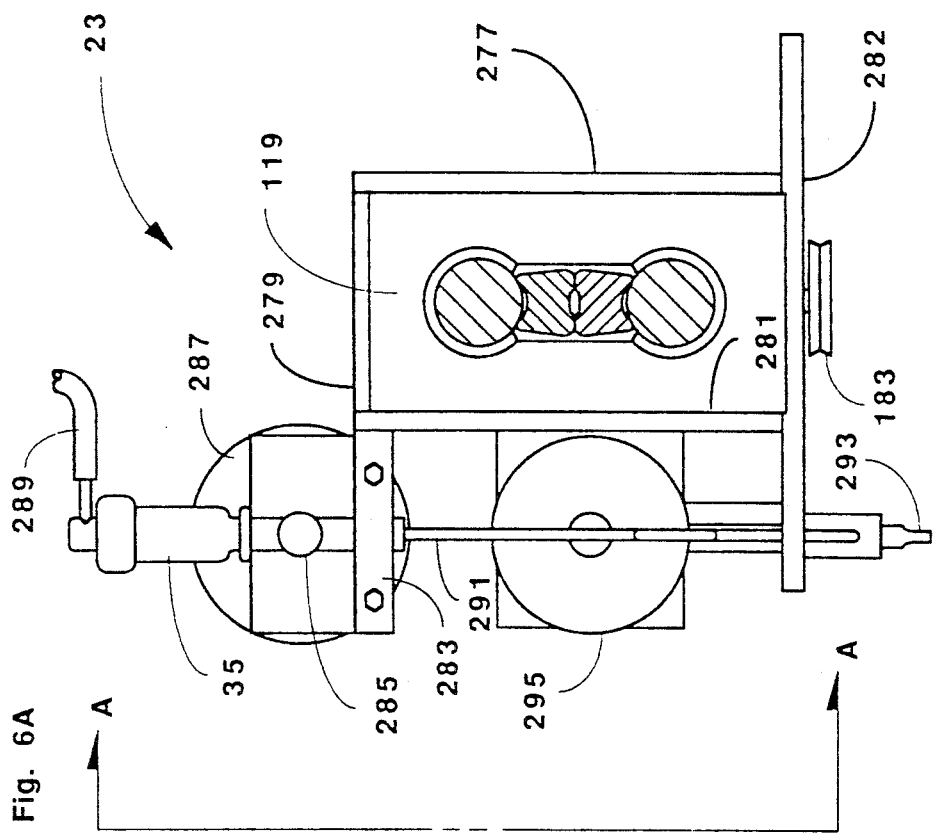

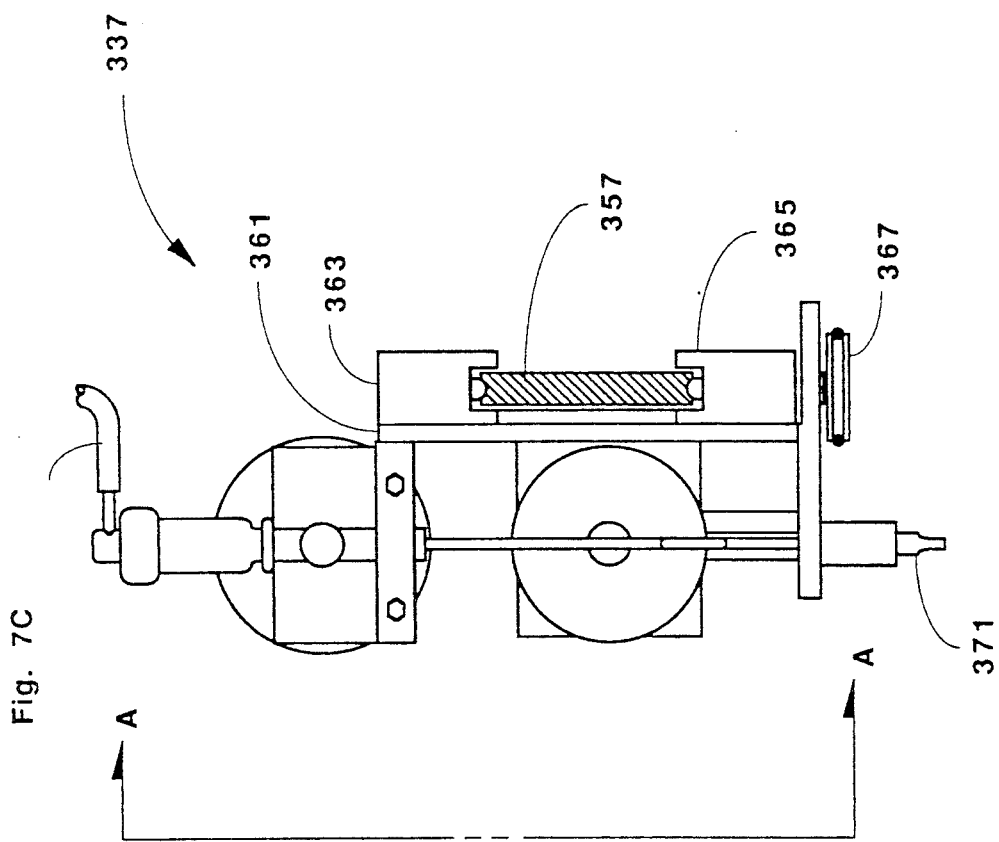

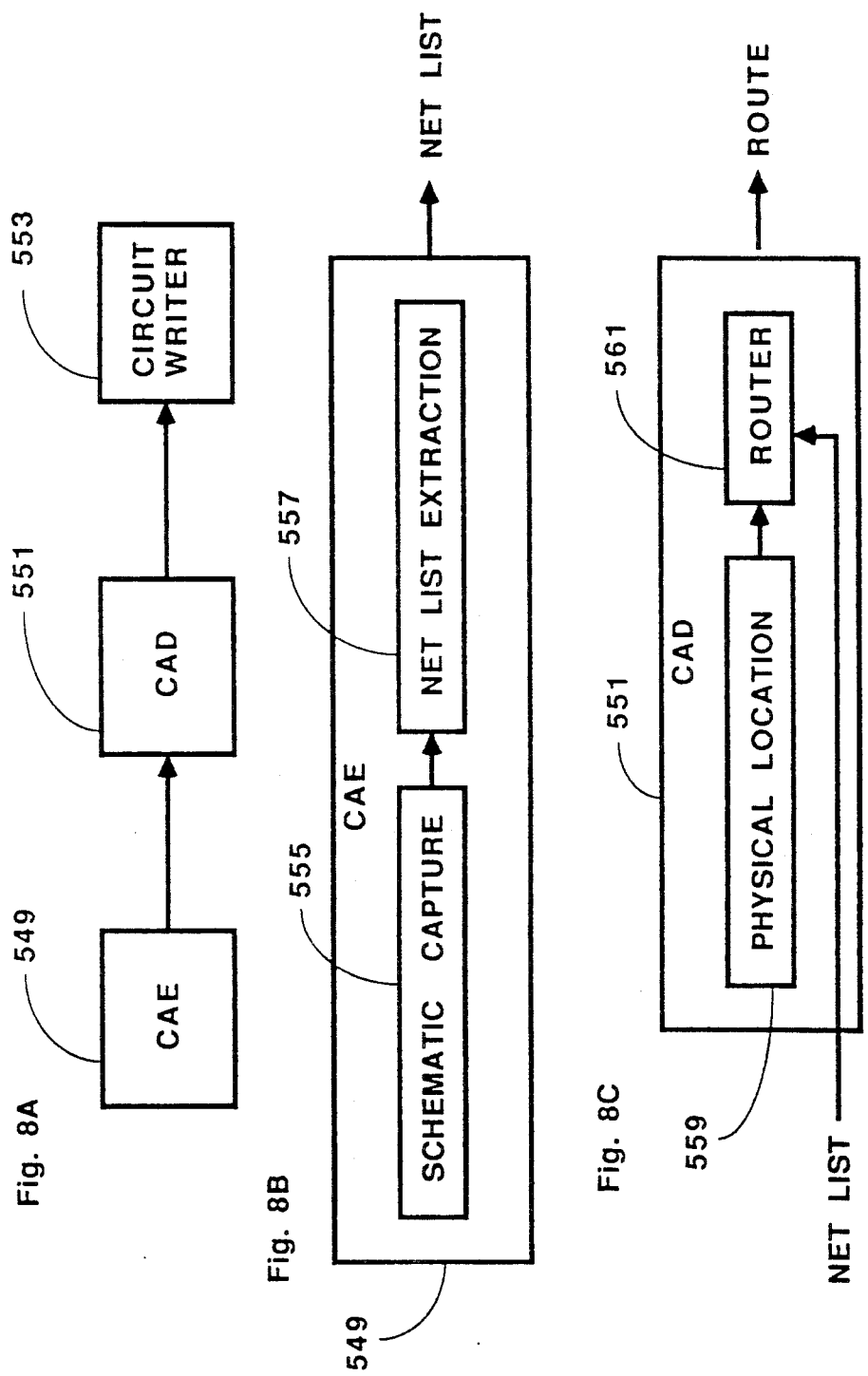

693

693

5,156,772

CIRCUIT WRITER MATERIALS

FIELD OF THE INVENTION

The present invention pertains to materials for the production of circuit boards; in particular to polymer thick film materials to be used with apparatus and methods for forming conductive circuitry between points on such boards by extrusion.

BACKGROUND OF THE INVENTION

For at least the past twenty-five years, there has been in the U.S. and around the world a rapidly growing electronics industry in which an integral and important part has been the development and manufacture of printed circuit boards. These printed circuit boards are typically formed of electrically conductive traces supported by nonconductive substrates (i.e. boards) in such a manner that electrical and electronic components, for example resistors, capacitors, integrated circuits, and transistors, may be mounted so that the result is an electrical circuit incorporating these components. The electrically conductive traces are the "wires" of the circuit, and the board provides structural integrity, facility for mounting to chassis frames, and support for interconnection to other circuitry. Printed circuit boards are an integral part of almost every electronic product and are often the most complicated and expensive parts of the entire device. All of the working parts and electronic memory of may computers, for example, are implemented on one or more printed circuit boards.

The desktop computer is a good example of a product that makes extensive use of printed circuit boards. The development of integrated circuits has been instrumental in the development of desktop computers, which are based on powerful central processing units (CPUs) and memory chips capable of storing large amounts of digital information. The motivation for more and more processing power, such as sophisticated graphics generation and display, has led to miniaturization techniques to put more and more devices on a single integrated circuit chip. By the same motivation, larger numbers of memory chips and processors have been brought into action in limited space environments, such as the chassis of a desktop computer, by innovative techniques for increasing the density of printed circuits.

Just as in the development of any product, certain techniques have emerged over the years for producing printed circuit boards that have been proven to be useful and effective, and have come to be used by many manufacturers. According to one such process, as described in the *Handbook of Printed Circuit Manufacturing*, by Raymond N. Clark, published in 1985 by Van Nostrand, a typical printed circuit board begins with a sheet of nonconductive polymer material, such as fiberglass reinforced epoxy. The material that will eventually form the traces is copper foil, and a thin sheet of the foil is mounted to one or both sides of the fiberglass sheet, typically with epoxy resin as an adhesive to form a blank. Holes usually drilled into the laminated blank. Some holes are for such purposes as registration, alignment and mounting of the board to other elements of an assembly, many are for accepting wire leads of electrical components to be finally mounted to the finished board, and many are to provide for electrical contact through the laminate between the eventual traces on one side and the traces on the other.

After holes are drilled, electroless plating operations are used in those cases where needed to plate conductive metal, usually copper, through the holes. Imaging techniques are subsequently used to lay a pattern over the copper foil defining the circuit traces to be formed. The two commonly used techniques are silk screening and dry film photoresist. In each of these, the pattern, called artwork, has to be separately determined and rendered in masks as part of the process. In the silk-screening process, plating resist material is applied to the foil through openings in the mask. In the dry film photoresist process the entire copper foil area is coated, then a pattern is cured through a mask by radiation, such as ultraviolet light. The uncured resist is then washed away. In either case the result is a pattern of plating resist material in the foil, covering those areas of the foil that will be eventually be removed to leave the circuit pattern. The resist does not conform the pattern of the circuit traces, but rather to the pattern that is not the circuit, i.e. the negative of the traces.

The next step in the typical process is the plate up of the circuit pattern. Conventional plating techniques are employed to increase the thickness of the exposed copper foil in the circuit pattern to a predetermined thickness to provide adequate current carrying cross-section and structural integrity. The plating operating is typically finished by applying a layer of a material such as tin-lead alloy (solder) over the traces. The resist is then removed, usually by solvent wash, and the foil under the resist is removed by chemical etching. The overplate of solder material protects the circuit traces from the etchant. The conductive circuitry is left on the surface or surfaces of the board.

There are a number of operations performed that are not detailed in this description, such as reflow and solder mask. The purpose here is not to teach the manufacture of printed circuit boards by conventional techniques, but to show that it is indeed a complicated, time consuming, and expensive process. A single board, even mass produced, can cost hundreds of dollars, and to apply these techniques to a limited quantity of boards can costs thousands per board.

In the development of circuit board production techniques, particularly to increase complexity and density, a number of innovations have been made. One development path involves the lamination of boards together so that there are inner layers of complex circuitry. Connection to board components and to other circuitry in other layers is made through holes and vias through the nonconductive board materials. These are known in the art as multilayer boards, and through their use, the amount of circuitry that can be accommodated in the same board space has been increased several-fold.

Another development has been the use of polymer thick film materials in the preparation of printed circuit boards, particularly multilayer boards. Polymer thick films are polymer materials (i.e. plastic resins) that are thixotropic through the use of additives such as when loaded with conductive materials, e.g. fine particles of silver, or with thixotropic additives (e.g. fused silica). These are silk screened directly onto the surface of a nonconductive board, forming the conductive traces directly. Used in multilayer technology, layers of silk screened circuits may be interlayered with other materials and printed circuits in multiple layers, and interconnection between layers is made by vias and drilled and plated holes. In general, polymer thick film multilayer boards can cost half of what laminated copper multilayers cost.

With these new developments and others, there are, however, still significant problems that haven't been adequately addressed, problems which have carried over from one technology to plague the next. One of these is in the application of artwork to the formation of the traces on a board. The first steps to the production of a board are engineering steps. The theoretical circuit is conceived and circuit performance is calculated. Typically, then, components are specified from commercially available stocks, such as one manufacturer's CPU, another's DRAMs, and other elements from still other manufactures, and calculations are made to determine the desireable traces. There may be, for example, certain restrictions on the length of certain traces where ultra high speed is required in the transmission of signals, or in the cross-section and conductivity, where high current loads are to be borne. There are other engineering considerations, too, such as expansion and contractions of traces versus the supporting materials, and the requirements for cooling and heat dissipation. In these calculations, a design engineer is limited, too, by the nature of the prototyping and production equipment that is to be used to implement the design. These limitations are known as design rules.

In present work environment, the design engineer is now aided in many cases by new and powerful computer programs that take all the design rules into account, calculate, and prepare graphic displays of trace patterns. The patterns created are called routes and the software tools are called routers. A router engine is the basic calculator tool for quickly doing the multitude of alternative layouts that are possible, still obeying all the router rules. Of importance is the fact that at the end of the routing and iterative process of choosing the options that a computer creates, the route has to be implemented in artwork to be transferred to the board prototype or production process. The conventional process requires masks for the photoresist or for the silkscreening of plating resist. The polymer thick film process requires silkscreens for the application of the uncured materials to the board surfaces.

The implementation of the network introduces expensive and time consuming intermediate steps that also increase chances for error, such as misalignment.

Another problem that still prevails, and which becomes ever more complex, is the absolute necessity of verifying a design before dedicating the design to a hugely expensive and cumbersome production process. This process is known as breadboarding, which is the practice of preparing a limited number of boards in, hopefully, a relatively inexpensive way, to verify that a circuit which appears to be functional and for which engineering calculations have shown it to be functional, actually works in the real world. One way that has been used to breadboard is to mount the circuit components on standard boards without circuit traces, but with edge pads and some other more or less standard features, and to connect the components by hand soldering or wire wrapping, using fine wires and other hand manipulatable trace materials. This process is, of course, cumbersome and prone to error. Other breadboarding techniques involve essentially the same techniques that are used in production, but incorporating manually operated systems and smaller-than-production dedicated facilities, such as small plating tanks to do one or a few boards at a time. Again the process is expensive and time consuming.

Another problem that is very typical occurs when breadboarding is finished, the iterative correction process is complete, and a large number of boards have been prepared. An engineering change is often required, such as adding a component or two to upgrade performance. The result is a large stock of finished boards, representing a large amount of money that must either be scrapped, at an unacceptable cost, or reworked. This rework process to make the stock into useable or salable product involves cutting traces and adding jumpers. The process of doing the cuts and jumpers is prone to error, because it is most generally a hand work process, and is quite expensive for the same reason. Moreover, the changes made, since they are most often made in a way foreign to the production process, are clearly visible. The presence of cuts and jumpers is considered by many to be a good way to judge the engineering foresight of a company that manufactures printed circuit boards. Many product reviewers also judge products partially according to the prevalence of cuts and jumpers on the printed circuit boards used.

What is needed is an apparatus that can be computer controlled so that computer aided engineering and computer generated routing and associated artwork can be generated directly on the control computer, or loaded to the control computer, so that traces of a printed circuit board can be generated directly by the apparatus. Such an apparatus would eliminate the intermediate steps of implementing the artwork in other forms, such as masks for applying photoresist or plating resist, and the resist and plate-up operations as well would be eliminated. To achieve maximum utility, such an apparatus should also generate traces that can cross one another (i.e. provide crossovers), then the density of multilayer boards could be provided as well. The direct writing of traces from digitized data would integrate all of the complicated steps of preparation of printed circuit boards, and would particularly facilitate the process of breadboarding. Such a direct circuit writing apparatus could also significantly improve the process of providing rework in the form of cuts and jumpers. On a board made by such a circuit writer, cuts and jumpers could be programmed and automated, and would be difficult to distinguish from original traces. Such as apparatus could also be used on conventional boards (with accessible traces) to provide jumpers, if appropriately programmed and automated, thereby eliminating much expensive and error-prone hand rework.

SUMMARY OF THE INVENTION

In accordance with preferred embodiments of the invention, an apparatus and method are disclosed for preparing electrically conductive traces on a circuit board using an additive technology, rather than a subtractive technology as in wet processing. The traces are directly written in a serial process, rather than in a parallel process as with silk-screening techniques, with each trace being able to be individually insulated. Hence, cross-overs are customary and permit via-less electrical contact to components, while at the same time simulating multilayer boards prepared by other processes. The intrinsic freedom to follow substantially any pattern is particularly important in that complicated circuits can be easily and quickly breadboarded, usually in a matter of hours rather than days or weeks. Furthermore, the apparatus in the preferred mode is computer controlled, and can be operated according to instructions provided by computer generated routing and computer aided engineering programs. Furthermore, jumpers can be easily programmed for existing boards. Also, due to the automated direct writing capabilities, small production runs which are generally very expensive on a per board basis for parallel production processes, can be very economically and quickly accommodated.

Generally, the apparatus according to the invention includes an extrusion element for extruding a first material and a stage. The purpose of the stage is for holding the extrusion element and the circuit board in relative proximity and for producing relative motion between the extrusion element and the circuit board in order to extrude the first material onto the surface of the circuit board along preselected paths to produce the electrically conductive traces. In a preferred embodiment, the electrically conductive traces are then similarly covered with an insulating material to provide insulated conductive traces.

In accordance with the method of invention, a first polymerizable material is extruded onto a circuit substrate support along preselected paths to form traces, and the first polymerizable material is polymerized, the first polymerizable material being conductive after polymerization. In a preferred mode, a second polymerizable material is then applied over the support at a plurality of points overlying the first polymerizable material. Then, if a two or more layer board is desired, a third layer of material for conductive traces can be applied which can cross over the first set of traces where they are insulated. Similarly, additional traces can be built up on the substrate. In another embodiment, each of the electrically conductive traces is covered with insulator along its entire length.

Similarly, in accordance with preferred embodiments of the invention, a circuit board for holding electrical components is disclosed which includes a circuit substrate support and a plurality of electrically conductive traces. The traces are adhered to the circuit substrate support between locations for the electrical components, the traces being formed of a polymer thick film by extrusion from an orifice onto the support along paths defining the location of the traces. In a preferred mode, the traces have a maximum thickness in a single pass that is at least 25% of their minimum width, and preferably a thickness of at least 50% of the minimum width. Furthermore, the traces can be made even thicker by putting down successive layers of electrically conductive material without putting down insulator between passes. In one preferred embodiment, the substrate support has a plurality of electrically conductive pads to which the electrical components are to be electrically connected. The traces then begin and end on top of the pads to form electrical pathways between the pads.

In accordance with preferred embodiments of the invention, the materials used for traces are polymer thick films (PTF) which are thixotropic. The materials used for conductive traces are composed of conductive particles, a resin and hardener, and two solvents, one having a relatively high volatility and one having a relatively low volatility. Thus when a newly deposited trace is subjected to a stream of hot air, the fast solvent will substantially evaporate leaving a firm paste behind over which another layer of PTF can be written without causing interference between the layers. The slow solvent then permits the various layers of traces to be polymerized together at the same time in a one step operation. The insulative material is similar to the conductive material in that it includes a resin and hardener and two solvents of differening volatility. In addition, in the preferred mode, it includes a gelling agent.

BRIEF DESCRIPTION OF THE DRAWINGS

FIG. 2A shows a perspective view of a typical base plate and rail arrangement of the first preferred embodiment, showing only main framing elements and bearing and rail arrangements to provide precise X, Y, and Z movement needed for circuit writing.

FIG. 2B shows a cross section through a rail assembly adjacent to a saddle carriage viewed in the x-direction, perpendicular to the length of the rail assembly, and illustrates elements making up the saddle carriage.

FIG. 2C shows a section view along cut A—A of FIG. 2B.

FIG. 2D shows an end view of a cross-rail assembly according to the invention.

FIG. 2G shows the opposite end view of the cross-rail assembly and is similar to FIG. 2D.

FIGS. 3A and 3B show one preferred method by which the write carriage may be moved in the y-direction.

FIG. 4F shows an expanded view through section A—A of FIG. 4A.

FIG. 4G shows an oblique view of a portion of one end of a preferred embodiment of the invention.

FIG. 4I shows an oblique view of a touch pad as used in a preferred embodiment for set up purposes.

FIG. 5 shows an example of a trace that may be drawn by the apparatus of the invention.

FIG. 6A shows a side elevation view of the write carriage, from the same direction as FIG. 2E.

FIG. 7C shows a view of a cross rail assembly taken through section B—B of FIG. 7A.

FIGS. 8A, 8B, and 8C show a block diagram illustrating the broad flow of information used in automating the invention.

DESCRIPTION OF THE PREFERRED EMBODIMENTS

Figure 1:
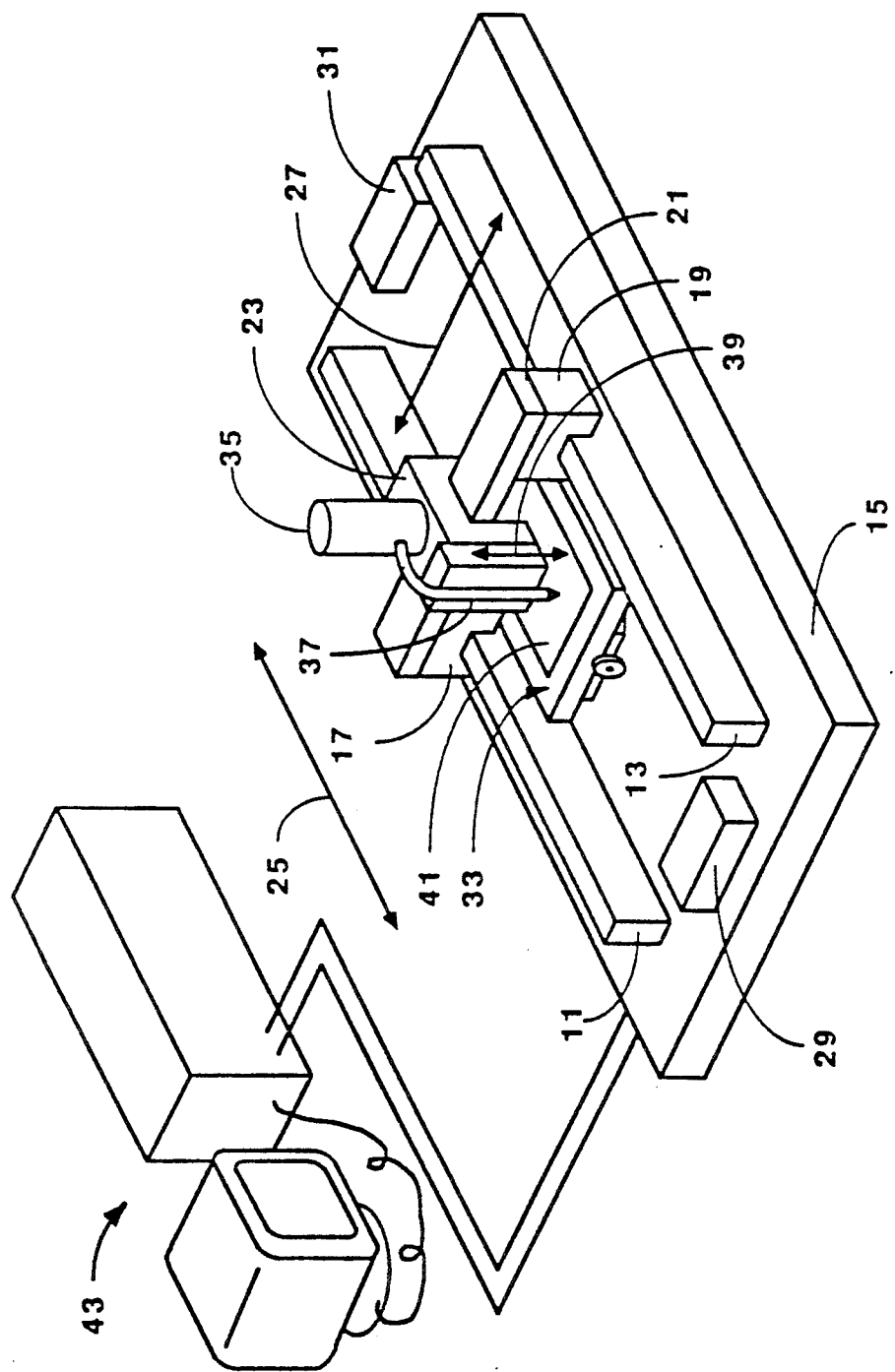
FIG. 1 shows a block drawing of a first preferred embodiment of the invention.

Shown in FIG. 1 is an exemplary system (hereinafter called a circuit writer) for writing traces on a circuit board by applying a conductive material, such as a metal filled epoxy, in a pre-determined pattern onto a surface of a support blank, in the preferred mode, the conductive material is applied by extrusion in a paste or in a semi-liquid form, and cures after application to form permanent electrically-conductive paths between circuit elements that are later added to the resulting printed-circuit board (pcb). The circuit writer is used also in some instances to apply an electrically insulating material, also in paste or semi-liquid form. The support blank is typically a rectangular sheet of reinforced plastic, glass reinforced epoxy for example, and is typically electrically non-conductive. There may be holes of varying small diameter in the blank through which metal wire leads of circuit elements are passed, the leads then being fixed to a portion of an electrically conductive path applied by the circuit writer. In a more advanced pcb design, the circuit elements may be surface mounted, a method in which the element leads do not pass through holes in the board, and the resulting board is said to be SMT (surface mount technology). In either case, fixing of an element lead to a portion of a conductive path on a board may be by soldering or by electrically conductive adhesive material, metal-filled epoxy material for example.

In the first preferred embodiment illustrated in FIG. 1, the circuit writer includes two parallel rail assemblies 11 and 13 mounted to a stable metal baseplate 15. A saddle carriage 17 rides along rail assembly 11 and a saddle carriage 19 rides along rail assembly 13 so that the saddle carriages and rail assemblies form an x-direction rail-and-bearing subsystem. Saddle carriages 17 and 19 are rigidly connected by a cross-rail assembly 21, and a write-carriage 23 rides along rail assembly 21 so that bearings in the write carriage together with the cross-rail assembly form a y-direction rail-and-bearing subsystem. As a result of this right-angle arrangement of the two rail-and-bearing subsystems, write carriage 23 has two degrees of freedom and may move in the x-direction indicated by the arrow 25 and also in the y-direction indicated by the arrow 27. An x-drive 29 propels the joined saddle carriages 17 and 19 in the x-direction, and a y-drive 32 propels write carriage 23 in the y-direction. A table 33 within x-y system serves to carry a blank 41 upon which a circuit may be written.

A metering subsystem is provided that is capable of starting, stopping, and controlling the flow of PTF and includes a reservoir 35 of uncured PTF that is carried along with write carriage 23, and is metered by other elements (not shown) through a write extension 37 that extends from the carriage in a substantially vertical orientation. In other embodiments the material reservoir may be stationary relative to the frame of the system, and the material conducted through flexible tubing to the write-carriage. Write extension 37 is moveable vertically in the direction of arrow 39 (the z-direction) to within close proximity of pcb blank 41 on write tables 33.

A computerized control system 43 is connected to the mechanical system, and powers and controls movement of the write element, and start, stop and metering of material in response to programmed information. In FIG. 1 the control system and its connections to the mechanical system are not shown in detail.

In the perspective view of FIG. 2A, a typical base plate and rail arrangement of the preferred embodiment are illustrated, showing only the main framing elements and the bearing and rail arrangements to provide the precise x, y, and z movements needed for circuit writing. In the preferred mode, baseplate 15 is machined from a single, solid piece of steel, about 990 mm. in length (D1), about 840 mm. in width (D2) and about 25 mm. thick, (D3), to provide rigidity. In the preferred mode, cutouts are made in the main body of the baseplate for the purpose of reducing the weight of the member, although these cutouts are not shown in FIG. 2A, and are not otherwise functional.

It should be apparent to those skilled in the art that traces made on a printed circuit board by the circuit writer must typically be quite small in cross section. With the apparatus of the invention, a trace of 12 miles in width and 6 mils high is typical, although narrower or wider traces can be written. The traces typcially have an arcuate cross-sectional shape and are generally semicircular of hemi-elliptical in cross-section so that at times the thickness is somewhat less than 50% of the width, but in general the thickness is in the preferred mode typically at least 25% of width and preferably much thicker than the 25%. By having traces that are narrower but thicker, the trace density on the surface of the circuit board may be increased. Also, a trace may be required to be quite long in a circuit plan in order to electrically connect elements mounted on a board, and separate traces may be required to be quite close together. It is not unusual for traces that must not touch in a wiring scheme to be within 10 mils of one another. Because of the small and critical dimensions of the typical geometry of a printed circuit board, it is very important that the mechanisms that transport the write carriage be mounted to a flat and stable base, or that any variations in the flatness or stability of the base be accounted for in the drive apparatus. Hence, in the preferred embodiment, the base and other framing elements are relatively massive to provide the needed stability. A further advantage of using massive framing elements is that they also exhibit a correspondingly high thermal mass, and are therefore slow to change in dimension in response to changes in ambient temperature.

In the typical arrangement of FIG. 2A, rail assembly 11 includes a T-rail 45, a hardened, ground shaft 47, and three supports 49, 51, and 53 respectively. Supports 49, 51, and 53 are machined from single blocks of steel and are relatively massive to provide dimensional stability. The supports are mounted to the base plate by fasteners (not shown), and the T-rail is mounted to the supports by fasteners (not shown). Ground shafting 47 is mounted to the top of the T-rail by bolts (not shown) so that the shaft is centered laterally on the rail. The assembly is such that the center of shaft 47 is typcially 125 mm. (D4) above the upper surface of base plate 15, and the centerline of the shaft is parallel to the long side of the base plate.

Rail assembly 13 is similar to rail assembly 11 and includes T-rail 55, ground shaft 57, and supports 59, 61 and 63. Shaft 57 is at the same height (D4) above the top surface of base 15 as is shaft 47, and is parallel to shaft 47, so that the two shafts together form a parallel dual-track for restraint of the write carriage in the x-direction. Spacing D5 between the shafts is typically about 840 mm., and commercially available ground shafting, such as Case 60 shafts from Thompson Industries is suitable, although other forms of shafting may be used. The x-direction rail set is substantially centered on base 15 in both the x and y directions, which directions are noted by arrows 65 and 67 respectively.

As indicated earlier, there are two saddle carriages 17 and 19 that carry linear bearings to constrain movement in the x-direction. Saddle carriage 17 is associated with rail assembly 11 and saddle carriage 19 is associated with rail assembly 13. Each saddle carriage supports a mounting block. Mounting block 69 is fixedly attached to saddle carriage 17 and mounting block 71 is fixedly attached to saddle carriage 19. Cross-rail assembly 21 fastens to both mounting blocks so that they are rigidly held together and move together in the x-direction carrying cross-rail assembly 21.

As illustrated in FIG. 2B, which shows a cross-section through rail assembly 11 adjacent to saddle carriage 17 viewed in the x-direction, perpendicular to the length of the rail assembly, saddle carriage 17 has a lengthwise opening 73 having a round through-bore 75 and a rectangular slot 77.

As illustrated in FIG. 2C, which corresponds to section A—A of FIG. 2B along the length of through-bore 75 and rectangular slot 77, linear bearings 79 and 81 mount to the inside of through-bore 75 and engage shaft 47, constraining saddle carriage 17 to travel along shaft 47. Bearings 79 and 81 may be split ball bushings, such as Series XR extra rigid open type ball bushings made by Thompson Industries, although other similar products may be used. The open type ball bushing does not completely enclose the shaft, but has an opening so that the shaft the bearing engages may be supported along the entire length of the shaft, adding to the rigidity of the mechanical system. FIG. 2B shows bearing 79 from the end view, with the bearing open for the width of slot 77. Slot 77 is wider than the upright portion of T-rail 45 so that carriage 17 may move along the length of shaft 47 without interference. The mounting of saddle carriage 19 on shaft 57 is accomplished with an assembly similar to the assembly shown for saddle carriage 17.

In the end view of cross-rail assembly 21 shown in FIG. 2D, a stanchion saddle 97 is shown rigidly attached to mounting block 71, which rides on saddle carriage 19 (not shown). A cross-rail stanchion 93 is mounted to stanchion saddle 97 by means of fasteners 107 and 109, and adjustment screws 101 and 99, each threaded through a separate upright portion of stanchion saddle 97, bear on opposite lower faces of stanchion 93. The holes in stanchion 93 through which fasteners 107 and 109 pass are sufficiently large relative to the diameter of the fasteners that the position of stanchion 93 may be adjusted relative to saddle 97 within the limits imposed by the saddle. The use of this adjustment, along with a similar arrangement associated with saddle carriage 17 on the opposite x-direction rail assembly, is to square the cross-rail assembly with the x-direction rail assembly. When the positions are correct, the fasteners holding stanchion 93 and a similar stanchion 95 on the opposite x-direction rail assembly may be secured, providing a rigid assembly. FIG. 2G provides a view from the opposite end of the cross-rail assembly looking in the direction of arrow 84 of FIG. 2A, and shows elements that make up that end of the cross-rail assembly.

Cross-rail assembly 21 has two hardened and precision ground shafts that are similar to shafts 47 and 57 of the x-direction rail assemblies. The shafts are arranged horizontally in the assembly, one above the other, and orthogonal to the x-direction rail assemblies. Shaft 85 is the upper of the two and shaft 87 the lower. The two shafts fit into a vertical slot 129 that is machined through stanchion 93 and has rounded upper and lower ends. The radius of each rounded end is substantially the radius of shafts 85 and 87. The shafts are spaced apart and held in position by two spacer rails 89 and 91, which are themselves held in position by set screws 102 and 105. Stanchion 95, carried on saddle carriage 17 (FIG. 2A), supports the opposite ends of shafts 85 and 87 and spacer rails 89 and 91 so that shafts 85 and 87 form an over-under cross-rail assembly at right angles to the x-direction rail assemblies. Movement in the direction of the length of the cross-rail assembly is (convention) the y-direction.

Figure 2E:
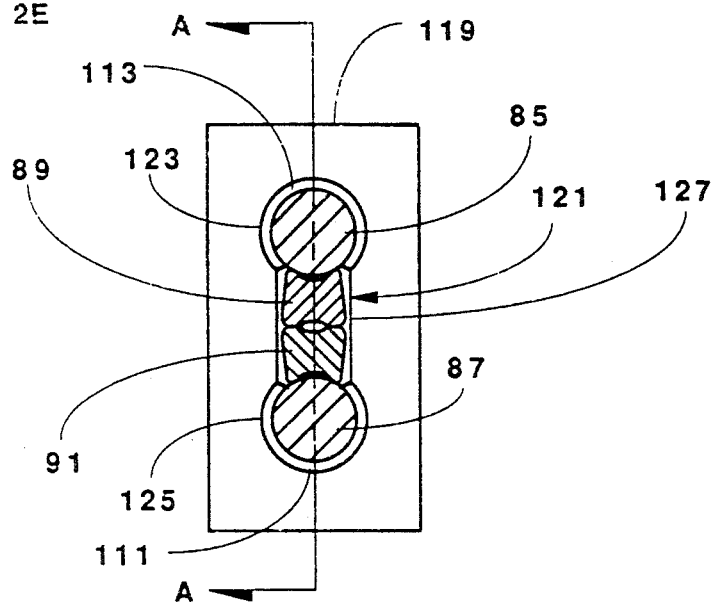
FIG. 2E shows a cross-sectional view taken through shafts and spacer rails that are adjacent to a write carriage according to the invention.

The section view of FIG. 2E taken through shafts 85 and 87 and spacer rails 89 and 91 adjacent to write carriage 23 (FIG. 2A) shows a solid base block 119 that has a machined passage 121 with two round bores 123 and 125 and a connecting rectangular slot 127. The center spacing between bores 123 and 125 is the same as the center spacing between shafts 85 and 87 in the cross-rail assembly.

Figure 2F:
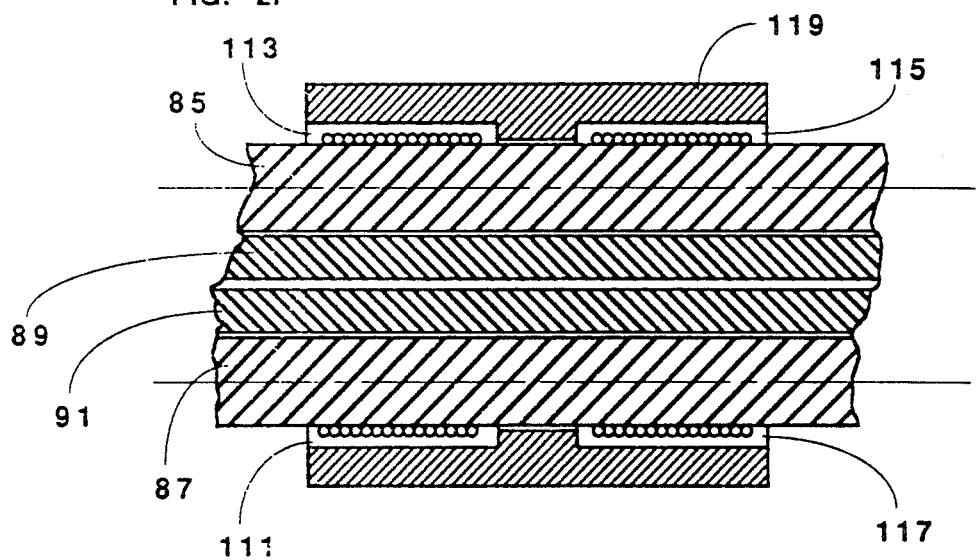
FIG. 2F shows a view through section A—A of FIG. 2E through a write carriage base block according to the invention.

As illustrated in FIG. 2F, which is a view of section A—A of FIG. 2E through the write carriage base block, linear bearings 111 and 113 are assembled into bore 125 and 123 respectively on one side of block 119, and engage shafts 87 and 85. Linear bearings 115 and 117 assemble into block 119 on the opposite side from bearings 113 and 111, and also engage shafts 85 and 87. The bearings are split linear ball bushings of the same kind used in the x-direction rail assemblies, and the arrangement constrains carriage base block 119 to travel only in the y-direction relative to shafts 85 and 87. Block 119 forms a base upon which elements of the write carriage may be firmly mounted. Structural plates, framing elements, and other elements of the write carriage are mounted to the block by means of tapped holes (not shown) in the block.

Figure 2H:
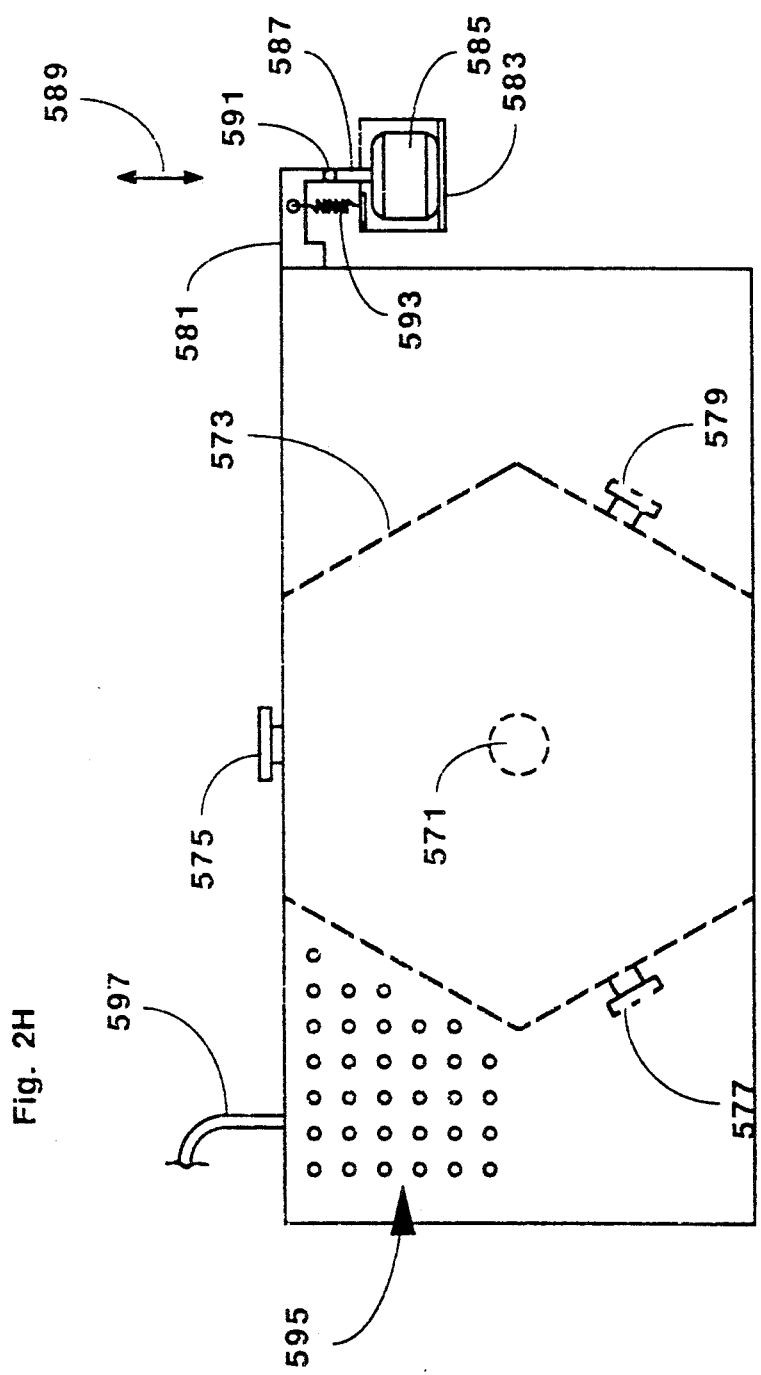
FIG. 2H is a plan view of a write table as used with preferred embodiments of the invention showing elements not shown in other figures.

FIG. 2H is a plan view of a write table 33 of general utility with various embodiments of the circuit writer showing elements not seen in other views. The write table is mounted pivitolly to a pivot pin 571 that is in turn firmly attached to base plate 15. A lower portion 573 of the write table has three wheels 575, 577, and 579 that are attached to portion 573 and that roll on the upper surface of base 15. The arrangement is such that the write table may rotate relative to the base around the center of the pivot pin, which, in the preferred mode, is located substantially at the center of the write table. The weight of the table is borne by the wheels. The mounting of the table to the pivot pin and of the wheels to the table is with a minimum of mechanical clearance, typically less than one-half mil, so that there can be little motion of the table in any way other than rotationally around pivot pin 571.

A bracket 581 is fixed to one corner of table 33 as an operating arm for controlling the rotational position of the table relative to the base and other elements of the circuit writer. A separate bracket 583 is mounted to base 15 and holds a linear actuator 585. A shaft 587 of the linear actuator extends or retracts in the directions shown by arrow 589, and has a spherical end cap 591. A tension spring 593 attached at one end to bracket 581 and at the other end to bracket 593 urges the table bracket at all times against the actuator shaft. Linear actuator 585 is operated through computerized control system 43, and is used to rotate the write table within a relatively small arc, typically five degrees, in alignment procedures after mounting a blank to the write table and before circuit writing commences.

One method by which a pcb blank may be fixed to the write table for a circuit to be written is to use a vacuum. In a preferred embodiment, the upper portion of the write table is a vacuum chuck. In FIG. 2H a number of small holes 595 are shown opening to the upper surface of the write table. The holes are shown only over a small area of the upper surface to avoid obliterating other details, but in the actual device, there are similar holes over substantially all of the upper surface of the write table where a blank pcb might contact. The holes are connected internally and terminate at a tubing connection 597 that leads to vacuum apparatus (not shown in FIG. 2H). A typical approach for providing these holes in the upper surface of the write table is to use sintered metal spheres for the write table surface. Although vacuum alone could be used as a board hold down mechanism, such an approach would be excessively noisy, since the pcb blank typically has holes in it for mounting components. Hence, in the preferred mode, a sheet of tape such as that typically used in the semiconductor industry (i.e. a tape which leaves no residue when removed) is placed over the upper surface of the write table and the vacuum holds the tape securely in place. Then the pcb blank is placed on top of the tape and the blank is held in place by the adhesive quality of the tape.

Figure 3B:
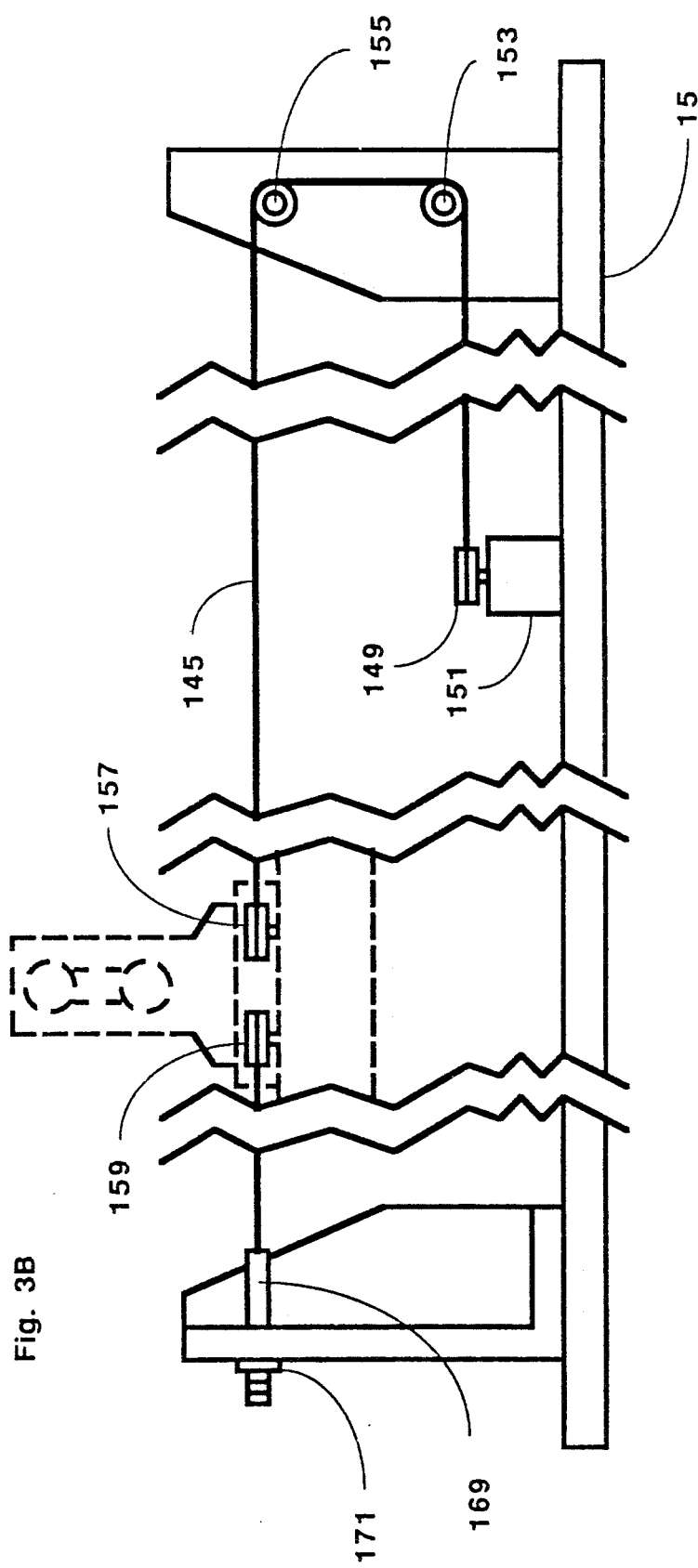

The method in the preferred embodiment by which write carriage 23 is moved in the Y-direction is shown in FIGS. 3A and 3B. In FIG. 3A, rail assemblies 11 and 13, mounting blocks 69 and 71, stanchions 93 and 95, upper cross-rail shaft 85, and write carriage 23 all are shown in phantom view. Four relatively massive corner posts 131, 133, 135 and 137 are mounted firmly to baseplate 15 with conventional fasteners (not shown). The corner posts serve as anchors to the frame for drum-driven cable assemblies by which both x- and y-direction movement are accomplished.

FIG. 3B, which is a view of section A—A of FIG. 3A, shows corner posts 131 and 133 in elevation, as well as the placement of various elements of the cable arrangement by which y-motion is accomplished.

Figure 3C:
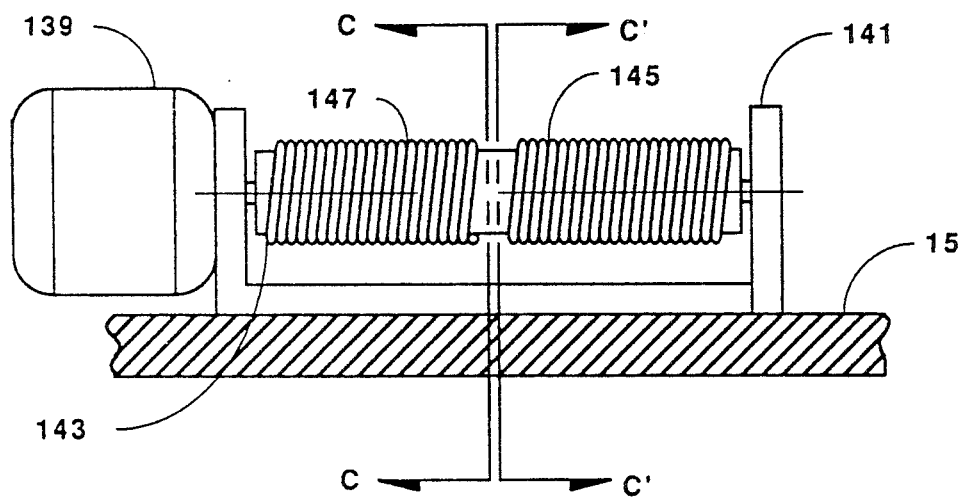
FIG. 3C shows a view through section B—B of FIG. 3A, and illustrates, in elevation, a y-drive system according to the invention.

Motive power for moving the write carriage in the y-direction is provided by drive 31, which includes a stepper motor 139, a framing assembly 141 and a cable drum 143. FIG. 3A shows y-drive 31 in plan view. FIG. 3C, which is a view of section B—B of FIG. 3A, shows y-drive 31 in elevation. Drum 143 is pivoted between two upright portions of frame assembly 141, and is driven by the output shaft of motor 139 from one end. The frame assembly is firmly mounted to base 15 by fasteners (not shown).

Figures 3D, 3E:
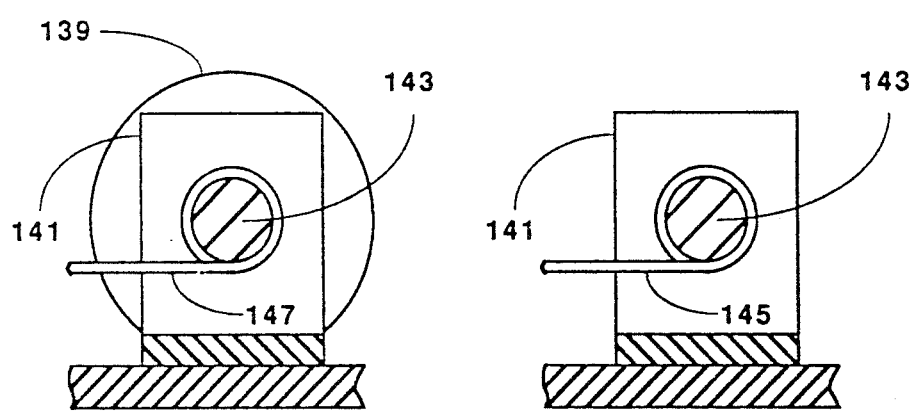
FIG. 3D shows a view through section C—C of FIG. 3C.
FIG. 3E shows a view through C'—C' of FIG. 3C.

In the preferred mode, there are two high-strength, braided steel cables involved in the operation of the y-drive. Cable 147 is wrapped on drum 143 beginning at the end closest to the motor, and anchored at that end of the drum, and exits the drum from underneath, extending toward the side of the circuit writer occupied by corner brackets 135 and 137. The wrap on the drum is single, with each turn around the drum immediately adjacent the next. FIG. 3D shows a view of section C—C through the drum, and shows cable 147 as it exits from under the drum. Cable 145 is wrapped on the drum beginning at the end opposite the motor connection, and also exits from under the drum, but in the opposite direction from cable 147, toward the side of the circuit writer occupied by corner brackets 131 and 133. FIG. 3E is a view along section line C'—C' of FIG. 3C showing cable 145 as it exits from the drum.

Because cable is wrapped at just one level on the drum, and the two cables are wrapped around the drum in opposite rotation from one another, rotation of the drum in one direction will cause one cable to be wrapped on the drum and the other to be played out from the drum at the same rate. In the view toward the motor of FIG. 3D, rotation of the drum clockwise will cause cable 147 to pay out from the drum, and cable 145 to be taken up on the drum at the same rate.

Cable 145 extends from drum 143 to a bearing-mounted pulley 149 where it turns 90 degrees toward corner post 133. The positions of the pulley and cable show in plan view in FIG. 3A. FIG. 3B (section A—A of FIG. 3A) shows pulley 149 mounted atop a rigid support 151 which is firmly mounted to base plate 15. FIG. 3B is broken into four sections so the full length of the Circuit Writer can be portrayed in the one figure.

At corner post 133 there are two pulleys, pulley 153 and pulley 155, similar to pulley 149, but arranged with the flat plane of the pulleys vertical, to change the height and direction of cable 145 while serving as a stable anchor point. Cable 145 passes around pulleys 153 and 155 and extends horizontally back in the x-direction at a height above the base plate just above the top surface of mounting block 69, which rides on saddle carriage 17. There are two pulleys, pulley 157 and pulley 159, on mounting block 69, arranged in a horizontal plane, and placed substantially side-by-side. The position of these two pulleys on block 69 relative to other elements is shown in elevation in FIG. 2G.

Cable 145 from pulley 155 turns 90 degrees around pulley 157, passes through a hole 161 in a stanchion saddle 163 (similar to stanchion saddle 97), and extends in the y-direction toward write carriage 23. Base block 119 of the write carriage has a pulley 165 mounted to the underneath side in a horizontal plane at the same height as pulleys 157 and 159. Cable 145 makes a 180 degree turn around this pulley, extends in the y-direction back toward mounting block 69, passes through a second hole 167 in stanchion saddle 163 and turns 90 degrees around pulley 159 to extend toward corner bracket 131. At corner post 131 cable 145 is firmly anchored to an anchor pin 169 that passes through a portion of the corner post. Pin 169 is threaded and includes a nut 171 so that turning nut 171 will tend to take up cable 145 and loosening the nut will provide slack in cable 145. Cable 145 is anchored to drum 143, so tightening nut 171 will add tension to the cable.

Cable 147, also anchored to drum 143 at the opposite end of the drum from cable 145, extends from the drum to a pulley 173, similar to pulley 149, mounted on a support similar to support 151, attached to base 15. Cable 145 turns 90 degrees around pulley 173 and extends toward corner post 135. At the corner post, cable 147 turns around pulleys 175 and 177, and extends back toward saddle carriage 19, where it turns 90 degrees around a pulley 179, passes through a hole 181 (FIG. 2D) in stanchion saddle 97 and extends to a pulley 183, which is mounted underneath write carriage 23 near pulley 165. Both pulley 165 and pulley 183 and securely mounted to base block 119, which forms the base of the write carriage.

Cable 147 turns 180 degrees around pulley 183, extends back toward mounting block 71, and passes through a hole 185 in stanchion saddle 97. The cable turns 90 degrees around a pulley 187 and extends to a corner post 137 where it is firmly attached to an anchor pin 189 similar to anchor pin 169 that anchors cable 145 at corner post 131. Anchor pin 189 has a nut 191 which is used to adjust tension in the cable system.

Clockwise rotation of drum 143 (FIG. 3D) wraps cable 145 onto the drum and unwraps cable 147 from the drum at exactly the same rate. This action causes the overall length of cable 145 in the arrangement of pulleys between drum 143 and anchor 169 at corner post 131 to shorten, and the overall length of cable 147 between the drum and anchor 189 at corner 137 to lengthen by the same amount. The distance between the drive assembly and each of pulleys 149 and 173 cannot change, because all three are securely mounted to base 15, as are all four corner posts. The only place that the dimension change can be accommodated is in the position of the write carriage, which is mounted on ball bushings and can move along the cross-rail assembly.

Rotation of drum 143 clockwise shortens the effective length of cable 145, which moves the write carriage toward x-direction rail assembly 11. Specifically, the write carriage will move by a distance equal to one-half the dimension that the cable is shortened. If, for example, the drum is rotated by an amount sufficient to shorten the effective length of cable 145 by 4 cm., the write carriage will move 2 cm. The same rotation will add 4 cm. to the effective length of cable 147, so the write carriage won't be constrained from moving by cable 147 around pulley 183.

To perform the precise movements required for circuit writing, backlash or dimensional instability can cause serious errors in making circuit connections. Hence, in the preferred mode, this dimensional instability is typically limited to ±2 mils maximum. The adjustable anchor pins are used accordingly to preload the cables to a tension near (but not equal to) the elastic limit of the cables. In addition the cables are worked and stressed prior to installation to eliminate any minute kinking. Together, these efforts eliminates any plastic or non-linear elastic deformation in the cables during operation and substantially all backlash. Another important result of the arrangement of the cables on the drum is that any elastic deformation on one side of the apparatus is precisely balanced by an equal amount of elastic deformation on the other side. For example, in the y-direction cable assembly, the angle between each of cables 145 and 147 and the axis of rotation of drum 143 is 90 degrees only at the point in operation that the write carriage is midway in its limit of travel, i.e. halfway between saddle-carriage 17 and saddle carriage 19. As the drum rotates, cables 143 and 145 wrap and unwrap on drum 143, the angle changes, and the tangential points of contact of the two cables with the drum (i.e. where they leave the drum and extend toward pulleys 173 and 179, respectively) move together, along the length of the drum, one direction or the other, depending on which direction the drum is rotating. This movement of the tangential points of contact (or, equivalently, the change in angle between the cables and the axis of the drum) results in stretching and relaxing of the cables. Ensuring that the points of contact move together, e.g. by using the single wrap of each cable from opposite ends of the drum, and that they are substantially equidistant from pulleys 173 and 179, so that each cable is stretched or relaxed by substantially the same amount as the drum rotates, ensures that stress in each cable is identical, so that precise movements of the carriage assembly are directly related to how far the cables are moved, and are not a function of the stress in the cables.

The operation of the write carriage in the y-direction is independent of the position of the cross-rail assembly in the x-direction. Movement in the x-direction along rail assemblies 11 and 13 will cause pullies 159, 157, 165, 183, 179 and 187 to rotate, but will not affect the effective length (off the drum) of either y-direction cable.

Figure 4A:
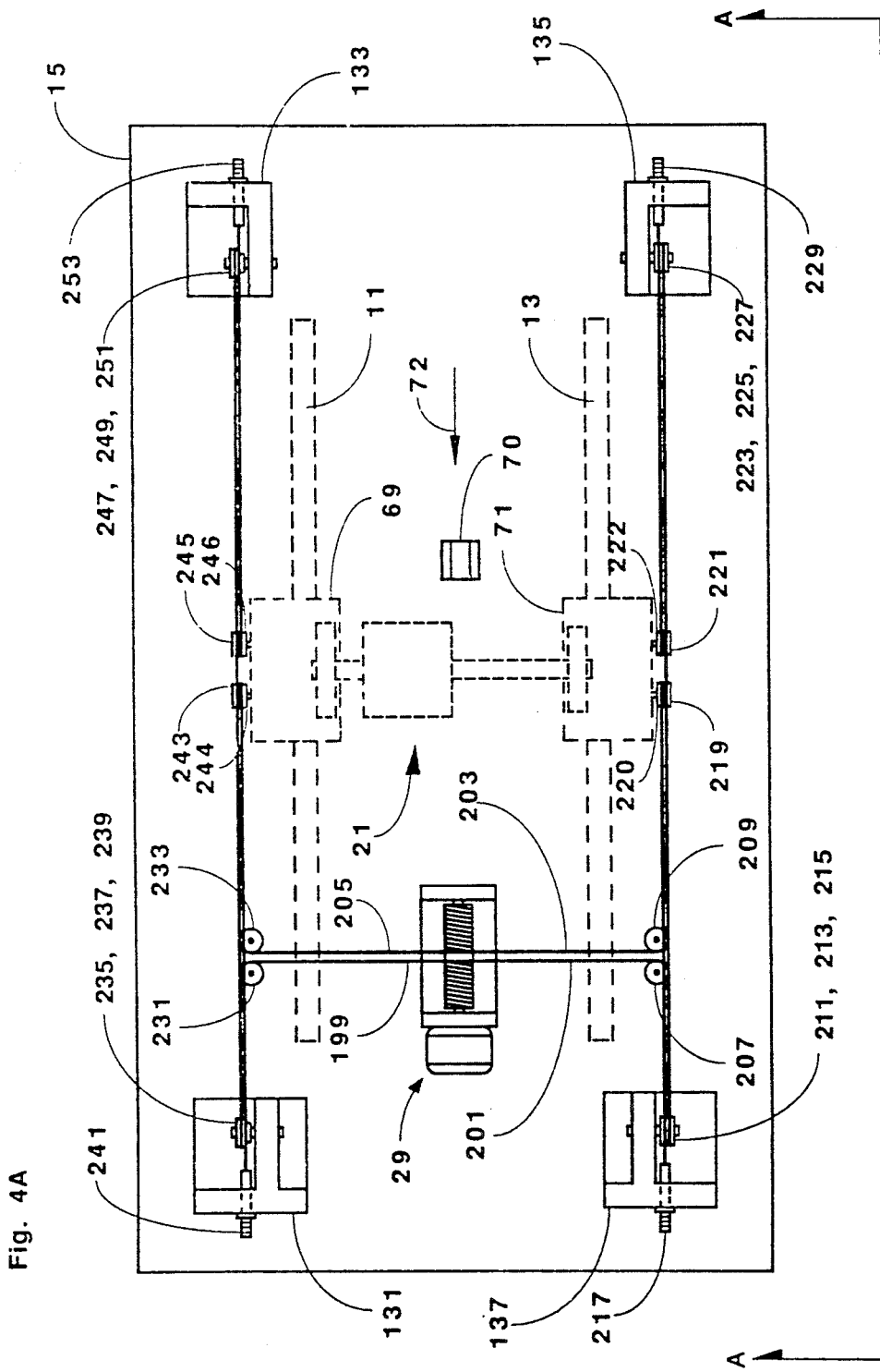
FIG. 4A shows a plan view of an x-motion assembly according to the invention.

X-direction movement is accomplished by a second cable drive independent of the y-direction drive. FIG. 4A is a plan view of the drive, similar to FIG. 3A, except y-direction cable drive 31 is not shown. Drive 29 shown is a motor driven drum cable drive similar to drive 31, but with a different cable arrangement, for moving the cross-rail assembly in the x-direction on the bearings associated with saddle carriages 17 and 19 on rail assemblies 11 and 13.

There are four extensions of cable from x-drive 29 shown in FIG. 4A. These are extensions 199, 201, 203 and 205, although the plan view of the x-drive in FIG. 4A is indicative only, and does not show detail of the wrap of the cables on the drum.

Figure 4B:
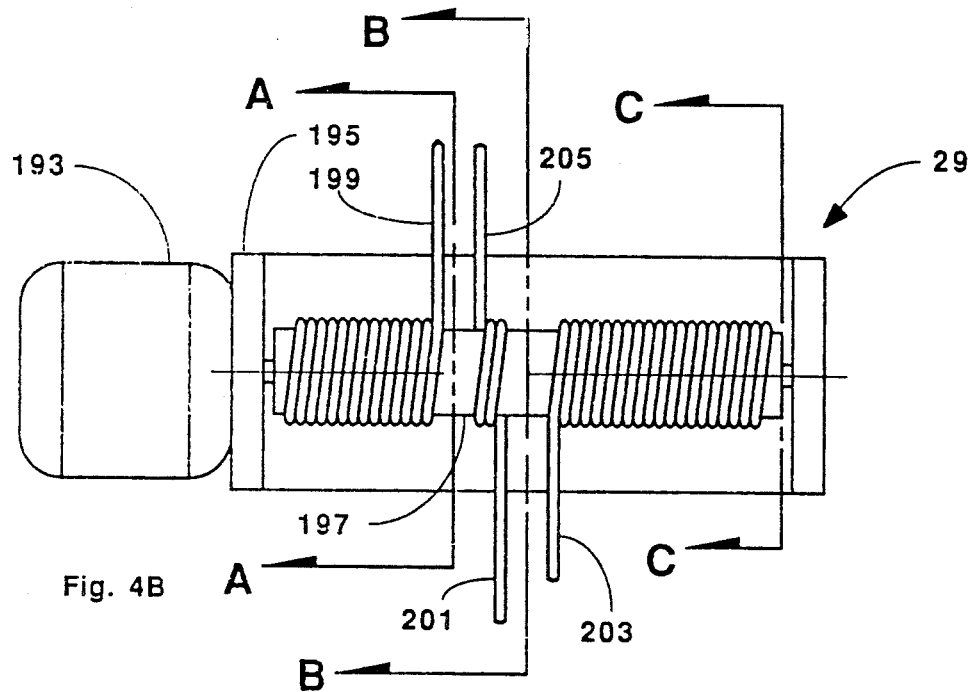
FIG. 4B shows an expanded view of a drive motor and drum used in the x-motion assembly of FIG. 4A, illustrating wrapping of cable on the drum.

FIG. 4B is an enlarged plan view of x-drive 29, and shows the elements and cable arrangements in further detail. The drive has a mounting bracket 195, a cable drum 197 and a drive motor 193 for turning the drum. Cable 199 is wrapped from the motor end of drum 197 and exits from the top of the drum to one side. Cable 203 is wrapped from the end of the drum away from the motor opposite to the wrap of cable 199 and exits from the top of the drum to the side opposite the exit direction of cable 199.

Cable 201 and 205 are seen to be a single cable wrapped on the drum between cables 199 and 203, with both end exiting from the bottom of the drum and in opposite directions. Extension 205 is in the same direction as cable 199, and extension 201 is in the same direction as cable 203. For convenience sake in description, the two extensions of the single central cable will be treated as two cables, and will be referred to as cables 205 and cable 201.

Figure 4C:
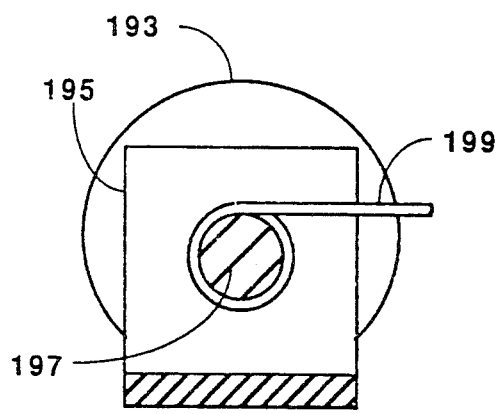
FIG. 4C shows a view through section A—A of FIG. 4B.
Figure 4D:
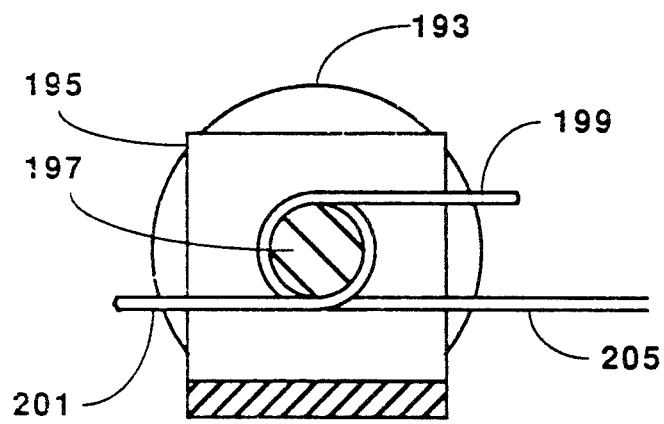
FIG. 4D shows a view through section B—B of FIG. 4B.
Figure 4E:
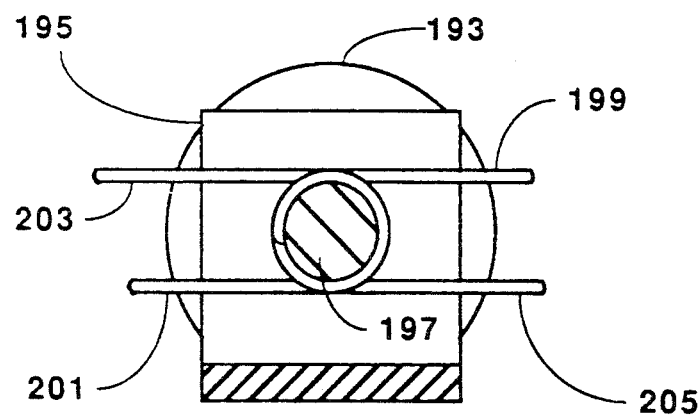
FIG. 4E shows a view through section C—C of FIG. 4B.

FIG. 4C is section A—A of FIG. 4B, and shows cable 199 extending to one side from drum 197. FIG. 4D is section B—B of FIG. 4B and shows cables 201 and 205 in addition to cable 199. FIG. 4E is section C—C of FIG. 4B and shows cable 203 in addition to the other cables. In the view of FIG. 4E clockwise rotation of drum 197 will extend cable 199 to one side and cable 201 to the other, while taking up cable 205 and cable 203.

Referring to FIG. 4A, cable 201 extends to one side of the circuit writer to a pulley 207 mounted on a stanchion 255 mounted in turn to baseplate 15, then extends to corner post 137. At the corner post cable 201 passes around two pulleys 215 and 213 which change the direction and the height. Cable 201 then extends toward mounting block 71. These elements and arrangements are shown also in FIG. 4F, which is an elevation view from vantage A—A of FIG. 4A, and in FIG. 4G, which is an oblique view looking toward corner post 137. It is helpful to refer to each of these views to understand the relationships.

At mounting block 71 cable 201 turns 180 degrees around a pulley 219, extends back to corner post 137, turns around a pulley 211, and extends back toward mounting block 71. At the mounting block cable 201 turns around another pulley 220 which is mounted adjacent to pulley 219 but turns independently. The cable then returns to corner post 137 where it is fastened to a cable anchor 217 which may be adjusted with a nut 218. There are four "passes" of cable 201 between corner post 137 and mounting block 71. As a result, taking up 4 centimeters of cable 201 onto drum 197 will move mounting block 71 by 1 centimeter.

Figure 4H:
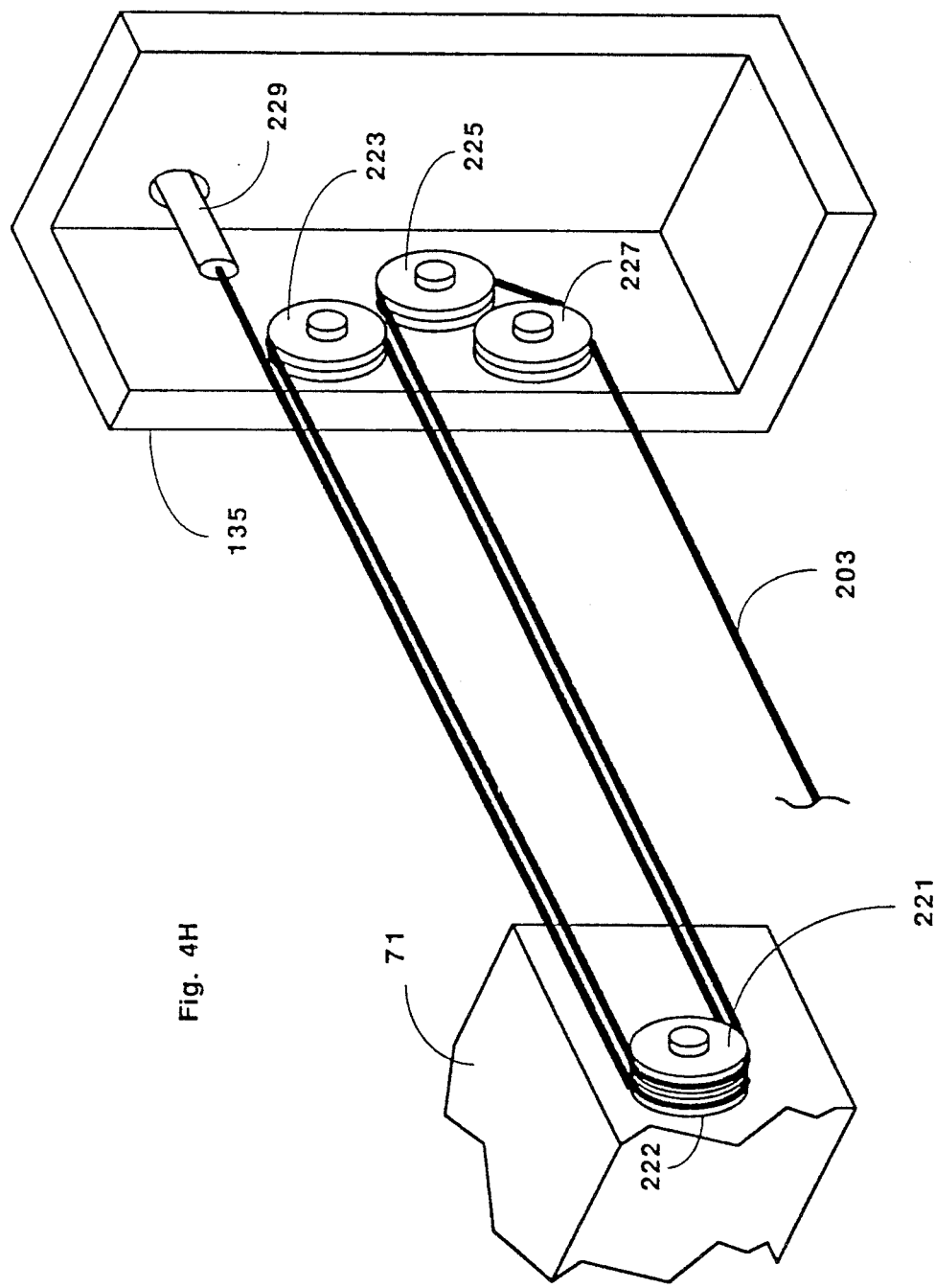
FIG. 4H shows an oblique view of a portion of the other end of the preferred embodiment illustrated in FIG. 4G.
Figure 41:
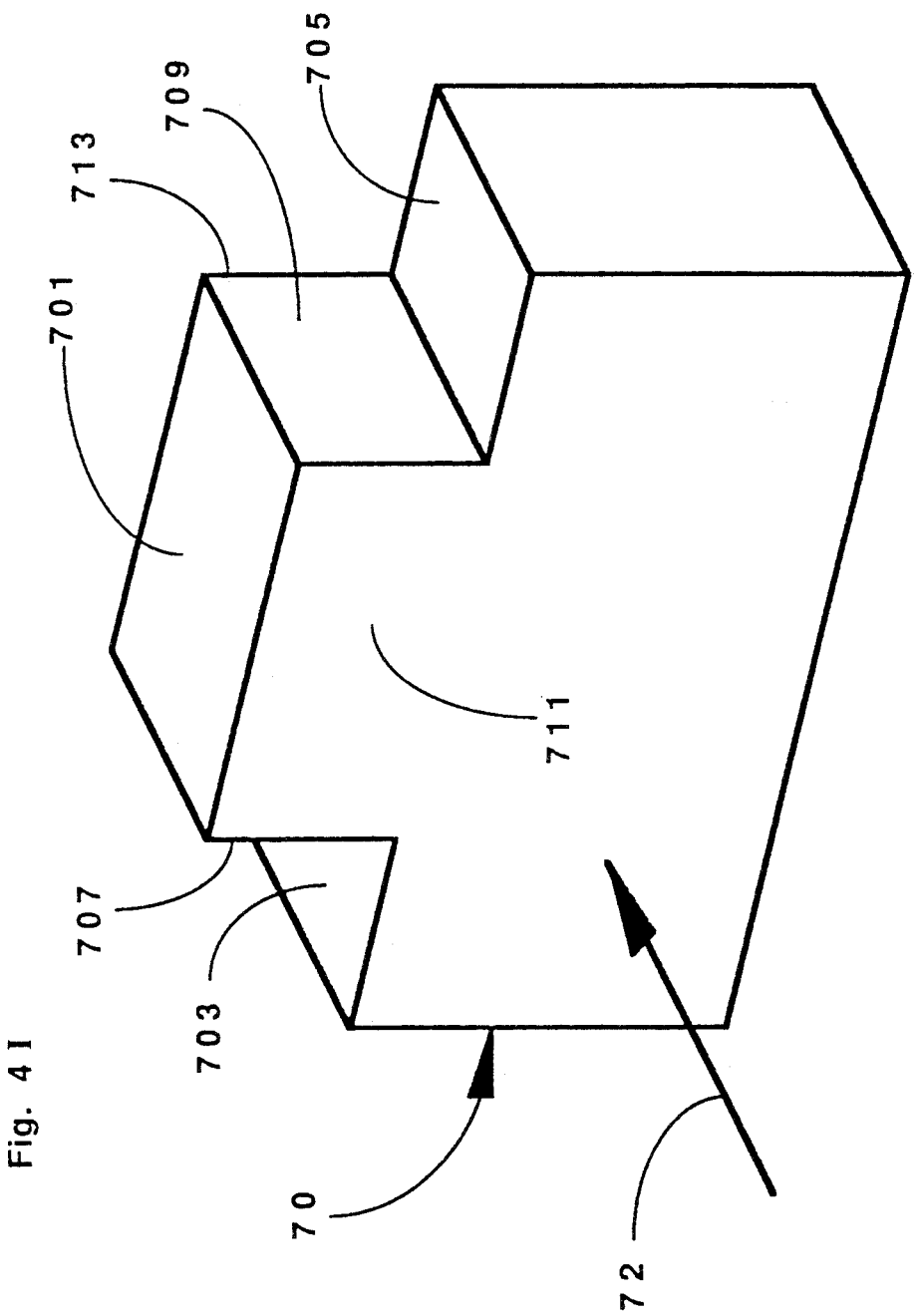

Cable 203 extends to the same side of the circuit writer as does cable 201, turns around a pulley 209 on a stanchion 257, then goes to corner post 135 at the opposite end of the circuit writer from corner post 137. FIG. 4H is an oblique view looking toward corner post 135 showing these arrangements. At corner post 135 cable 203 turns around pulleys 227 and 225, changing height and direction, and extends toward mounting block 71. At mounting block 71 the cable turns around a pulley 221, goes back to corner post 135, around a pulley 223, goes back to mounting block 71, around a pulley 22 mounted adjacent to but separate from pulley 221, and extends back to corner post 135 again, where it anchors to cable anchor 229. As cable drum 197 turns in one direction, cable 201 is extended while cable 203 is taken up by the same amount, urging mounting block 71 in one direction. Turning the cable drum in the opposite direction has the opposite effect, moving the mounting block in the opposite direction.

Cables 199 and 205 extend to the opposite side of the circuit writer from cables 201 and 203 (FIG. 4A) and move mounting block 69 in concert with mounting block 71 so that the cross rail assembly is moved smoothly in the x-direction along the x-rail assemblies 11 and 13. Cable 199 utilizes pulleys 231, 235, 237, 243, 239, and 244, and terminates at anchor 241. Cable 205 utilizes pulleys 233, 247, 249, 245, 251 and 246, and terminates at anchor 253 at corner post 133. Rotation of drum 197 in one direction will take up cables 199 and 201 while extending cables 203 and 205 by the same amount, urging the cross rail assembly toward corner posts 131 and 137. Opposite rotation urges the cross rail assembly the other direction. The cable anchors may be adjusted to apply tension to the cables to remove any minute kinks and to pre-stretch the cables to near the elastic limit, removing discrepancies due to cable strain. In this preferred embodiment, motors 139 of the y-drive and 193 of the x-drive are each preferably DC stepper motors. Those skilled in the art will understand that one could also use a high resolution servo-motor, or other motors having high resolution. In the preferred mode, the operation of these motors is managed by computer control system 43 (FIG. 1), which is used to drive these DC stepper motors as if they were synchronous to provide quite accurate motion, without taxing the computer system as would normally occur with a microstepped operation. Such an approach also is exceedingly quiet compared to many other approaches. The two motors are operated forward, reverse, start, stop, and at various speeds from 0 to about 5 rpm, independently of one another. The motors operate in response to a computer program generated from routing information for traces on a printed circuit board to be manufactured. As indicated earlier, the cable arrangements from the drives move cross-rail assembly 21 in the x-direction along rail assemblies 11 and 13, and write carriage 23 in the y-direction along cross-rail assembly 21. The coordinated movement of the two drives moves write extension 37 with two degrees of freedom above write table 33 in a manner that patterns in two dimensions may be traced using a pencil or pen.

FIG. 5 provides an example of a simple geometry that might be required for a trace on a pcb of a simple geometry that might writer. Trace 259 represents a conductive trace applied by write extension 37 (not shown). Arrow 263 designates the x-direction with a + and a − to indicate an arbitrary convention of forward and reverse movement for the x-direction. Arrow 261 designates the y-direction, also with a + and a − indicating an arbitrary convention for forward and reverse drive.

Beginning at point 265, trace 259 extends along portion 269 at an angle of about 45 degrees with the x- and y-directions. For purposes of illustrating the operations of the circuit writer, it is assumed that trace 259 is written from point 265 to point 297. Portion 267 is written as a straight line at the angle by running the x-drive to move the write carriage in the +x-direction and the y-drive in the +y-direction at the same rate. Beginning at point 269, the speed of the x-drive is slowed relative to the y-drive, until at point 273 the y-drive has stopped and only the x-drive is running. The result is a curved portion 271. The rate of curvature is controlled by controlling the relative drive speeds. Portion 275 is a straight line extending in the + x-direction, and is accomplished by running only the x-drive. At point 277 the y drive begins to operate again. For the circular portion 279 extending to point 281, the x-drive speed decreased in a harmonic function while the y-drive speed increases in the same harmonic function out of phase with the x-drive function by a phase angle of 180 degrees. The result is the generation of a circular arc of 90 degrees, and at point 281 the x-drive is stopped and the y-drive is operating in the + y-direction.

Portion 283 of the trace is generated by the y-drive running with the x-drive stationary. There is no x-direction movement for this portion of the trace. At point 285 the x-direction drive starts again, and the x-direction speed increases in a harmonic function to point 287, then decreases in the same harmonic function to stop again at point 289. During this time the y-drive speed decreases in the + y-direction to point 287, then increases in the − y-direction to point 289. The result is a 180 degree circular arc from point 285 to point 289, generated in the same manner as circular arc 279, but for an additional 90 degrees. At point 289 the y-drive is running in the −y-direction, and the x-drive is stopped, generating a vertical portion from point 289 to point 291. At point 291 another circular arc is generated in the same manner as the other circular arcs, but with x-drive speed increasing harmonically and y-drive speed decreasing in the same harmonic function for a 90 degree arc. Portion 295 is a straight portion generated with the x-drive operating in the + x-direction, and the y-drive stopped, to point 297.

Computer control of the x-drive and y-drive stepper motors in response to pre-programmed information about desired trace locations and dimensions allows the desired traces to be generated by the circuit writer. The pre-tensioned cable arrangements illustrated allow the x-y information to be transferred to a pcb accurately. Traces can be generated at any angle and with both constant and variable rates of curvature relative to the x- and y-directions.

In practice, it has been found, however, that for simplicity in process control and in automatically determining routing paths for the various traces, it is generally preferable to avoid long sweeping arcs, and to avoid long runs at angles not parallel with the x-and y-axes of the apparatus, e.g. the line running at 45 degrees. Such traces are avoided by permitting only certain kinds of motions in the computer program that determines the optimum sequence of traces to be written. The program will be discussed subsequently when describing software control of the apparatus, and hereinafter will be called the "router".

FIG. 6A is a side elevation view of write carriage 23, and is in the same direction as FIG. 2E, and shows a section through the cross-rail assembly adjacent to the write carriage. The bearing and spacer assembly elements by which base block 119 rides in the y-direction along the cross-rail assembly are not identified in FIG. 6A. Mounting plates 277, 279, 281, and 282 fasten securely to base block 119, and form a structure upon which other elements of the write carriage are mounted. The particular arrangement of plates to form a mounting structure is not important as long as the various elements can be attached in the proper physical orientations. Hence, there are many other ways a mounting structure may be formed.

Clamp bracket 283 secured to the write carriage holds a three-way rotary valve 285 in a substantially vertical orientation, and material reservoir 35 is mounted to an opening through the valve by a gas-tight seal. Reservoir 35 contains uncured PTF material suitable for forming traces on a pcb. As indicated earlier, the material is in some instances an electrically conductive material, and in other instances is an electrically insulating material. A stepper motor 287 operates rotary valve 285 to start and stop the flow of material. A semi-rigid tubing 291, such as stainless steel tubing, extends from a lower opening of valve 285 to a write tip 293. A stepper motor 295 raises and lowers write tip 293 at the beginning and end of traces on a pcb, and maintains a critical height of the write tip above the surface of a pcb during the time that a trace is being written.

Figure 6B:
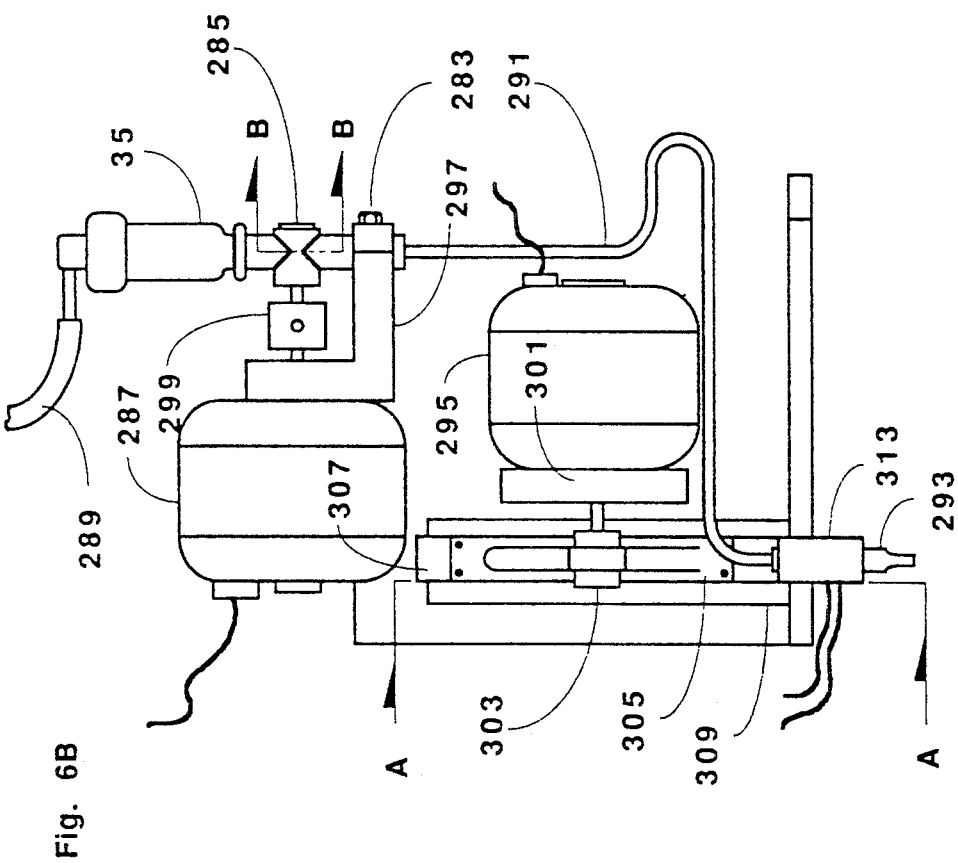
FIG. 6B shows an elevation view of the write carriage at an angle of 90 degrees relative to the view of FIG. 6A, from the vantage of line A—A of FIG. 6A.

FIG. 6B shows an elevation view of the write carriage at an orientation of 90 degrees relative to the view of FIG. 6A, from the vantage of line A—A. Clamp element 283 that holds valve 285 is part of a bracket 297 which is mounted to plate 281. Bracket 297 also serves to mount motor 287 which manipulates the rotary stem of valve 285 through coupling 299. Motor 295 mounts to the frame by means of a bracket 301. This motor provides z-direction (vertical) movement of the write tip by rotating a spindle 303 which wraps the tongue of a tongue-strip 305. The tongue-strip is bolted to a slide 307 which is guided vertically in a pair of bearing guides 309.

Tubing 291, through which uncured PTF material passes on the way to the pcb, makes several turns and broad curvature between the valve 285 and a heater block 313 through which material is forced to pass before reaching write tip 293. The purpose of the turns and curvature is to provide the necessary freedom of motion for the write tip while maintaining a steady flow of material. There are other tubing configurations, such as a loop, that could be used to provide the necessary mechanical freedom. However, it is generally desired to keep the length of the PTF path relatively short.

The purpose of the heater block 113 is to maintain uncured material at a known temperature to control viscosity. Heater block 313 is resistance heated by electric current, and measurements of the temperature of the block are fed back to computerized control system 43 (not shown in FIG. 6B) preferably by a thermocouple element in the block (also not shown in FIG. 6B). The control system maintains the temperature according to a pre-programmed set-point. The temperature of material flowing through the write tip is typically controlled to 40 degrees centigrade for the preferred PTF material used (to be described later), but can be at a different temperature depending on the physical characteristics of the particular trace material to be extruded.

Figure 6C:
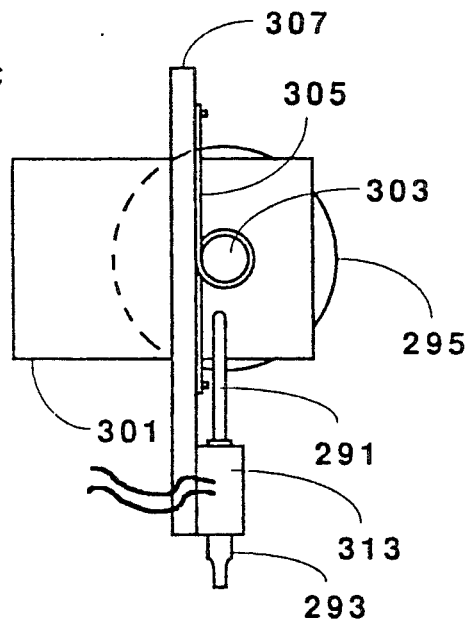
FIG. 6C shows a view through section A—A of FIG. 6B of a portion of the write carriage.
Figure 6D:
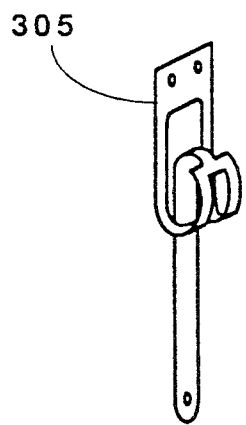
FIG. 6D shows an oblique view of a portion of a tongue strip illustrated in FIG. 6C that is used for converting rotary motion to linear motion along the z-axis of the apparatus.

FIG. 6C shows a section A—A of FIG. 6B along one edge of slide 307. Spindle 303 extends inside a loop of tongue strip 305 and the strip is fastened to slide 307. FIG. 6D is an oblique view of tongue strip 305 alone. The tongue strip is used for joining a linear motion and a rotary motion element so that rotation may be converted to linear translation without backlash. Zero backlash is also very important for the z-drive, because controlling the height of the write tip above the pcb while writing a trace is important to achieve high quality traces and to be able to provide traces that can cross over other traces.

Resistance heater 313 is fastened to slide 307 at the lowermost end of the slide, and write tip 293 is secured to the resistance heater. By this arrangement, precise rotation of spindle 303 provides precise vertical movement of write tip 293, and the movement is repeatable by repeating step positions of motor 295 without mechanical hysteresis.

Figure 6E:
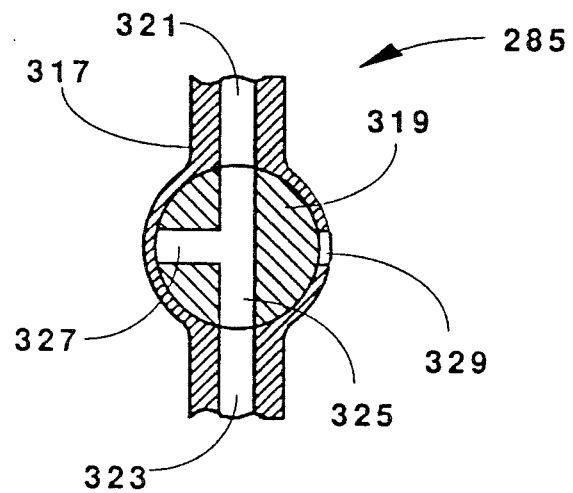
FIGS. 6E and 6F illustrate two positions of a three-way valve according to the invention that is used to control the flow of extruded material during circuit writing.

FIG. 6E shows section B—B through valve 285 of FIG. 6B. The valve has a body 317 with an upper passage 321 and a lower passage 323 that are each substantially the diameter of the inner diameter of tubing 291. The valve body has a cylindrical central opening filled with a close-fitting central drum 319. Drum 319 is rotatable within the valve body, and is rotated by motor 287 through coupling 299 (FIG. 6B). The central drum has a straight-through passage 325 and a connecting side passage 327. In the position shown in FIG. 6E, the straight-through passage of drum 319 is aligned with passages 321 and 323. This is the position maintained by the valve to feed PTF during writing of a trace.

Figure 6F:
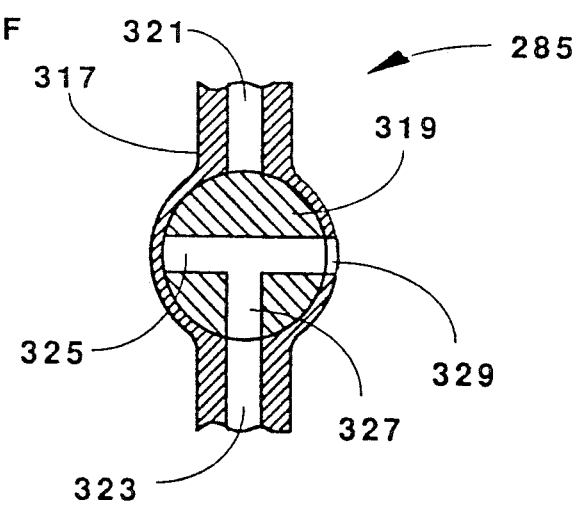

By way of illustration, from the position of FIG. 6E, rotation of drum 319 to "close" the valve is counterclockwise. Because of the small diameter of the passages relative to the diameter of the drum, and because the passageway 323 is typically over one hundred times larger in cross-sectional area than the exit orifice of the write tip, only a small rotation is necessary to completely close off the flow of material. Hence, the flow can be stopped exceedingly quickly, typically in less than 500 microseconds. As a practical matter, to obtain accurate traces, it is preferred that the flow be stopped in a time at most on the order of a millisecond. In the illustrated embodiment, the drum is rotated 90 degrees when closed, and goes to the position shown by FIG. 6F, with side passage 327 aligned with opening 329. Valve 285 is typically a bronze valve plated with stainless steel, and is a valve often used in hospital environments. An example of such a valve is part number 6011 or 6014 available from Poper & Sons.

In FIG. 6A, elements are shown with one reservoir for writing traces with a single material, which may be either a conductive or a non-conductive PTF material. FIG. 6A shows a plate 282 forming a part of the write carriage structure, extending outward from both sides of the write carriage. In practice, a second assembly of elements may be added to the side of the write carriage opposite the first assembly and attached to plates 282 and 277, and traces may be written with two different materials.

In operation, an inert gas, such as nitrogen, is introduced via line 289 to form a gas pressure over uncured PTF material in reservoir 35. The gas introduced is from a supply (not shown) outside the circuit writer, and the pressure is typically maintained in a range of from 25 to 55 psi. When writing is not being performed, valve 285 is closed, and write tip 293 is raised by the z-direction drive to a point about 1 centimeter above the surface of the pcb blank. To write a trace, the x-drive and the y-drive are operated to move the write tip over the point that a trace is to being on the pcb. The z-direction drive then operates to move the write tip to close proximity of the surface of the pcb.

Figure 6G:
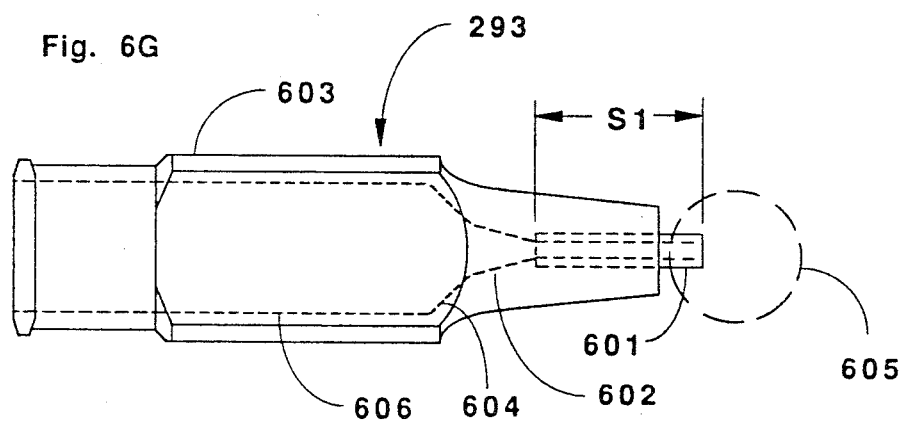
FIG. 6G shows the elements that compose a write tip according to the invention.

There are two different write tips used in the operation of the circuit writer, one for writing traces of conductive PTF and the other for writing traces of insulating PTF, which are typically, but not always, laid over traces of conductive PTF. FIG. 6G shows a typical construction of a write tip. A machined section 601 of stainless steel, regular wall, 26 gauge hypodermic tubing with 0.010 ID, is fixedly attached in a tubing fitting 603. In the preferred mode, the inside of the fitting has a bore 606 that meets a relatively steep region 604 of decreasing diameter which in turn meets a second region 602 of decreasing diameter at a relatively shallower angle than region 605. Region 602 reduces the diameter to the inside diameter of tubing 601. Tubing 601 is inserted against a shoulder such that there is not abrupt impediment to flow of material into tubing 601. Generally the length of tubing 601 is an important consideration in controlling the flow of the PTF because of its relation to the back pressure created. For a fitting 603, which by way of example, could be a Leur-Loc female fitting made by Becton-Dickson, No. 462 LNR without the stylette indexing notch, the length S1 of tubing 601 is typically 0.200 in. Clearly there are other fittings that would be suitable, and special fittings may be machined.

Figure 6H:
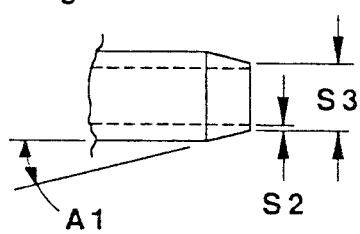
FIG. 6H shows the preferred shape of a hypodermic tubing tip for extruding traces of conductive PTF material.

FIG. 6H is an enlargement of the end of a hypodermic tubing as indicated by circle 605 in FIG. 6H. This is the treatment for a tip that is used for writing an original trace of conductive PTF material, and an outside bevel A1 of about 30 degrees is machined on the hypodermic tubing. The bevel is not machined to produce a sharp edge with the inside diameter of the tubing, as the sharp edge is fragile and subject to erosion and damage. Typically a land S2 of about 1 mil is provided. The diameter S3 is then about 12 mils. FIG. 6J shows how the outside beveled tip of FIG. 6H relates to the surface of a pcb when writing. The width S3 of FIG. 6H is a controlling factor in the formation of trace 605 of FIG. 6J, and the height H1 of the tip above the surface 607 of a pcb is maintained at about 0.5 times the width S3 of the tip. In this case H1 will be about 6 mils. It has been found in practice, however, that for the preferred range of viscosities and flow rates and the preferred PTF formulations, that trace width is nearly independent of the needle flying height, and can vary from about −100% to +50% without appreciable changes in trace width. This relative insensitivity to flying height is very important in being able to provide high density traces that are well defined.

Figure 6I:
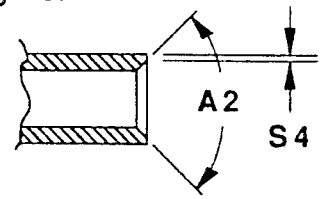
FIG. 6I shows the preferred shape of a hypodermic tubing tip for extruding traces of nonconductive PTF material.
Figure 6J:
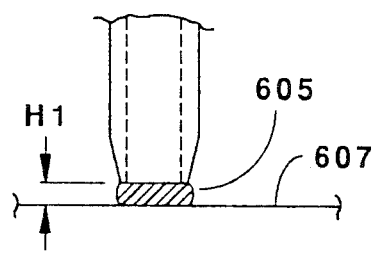
FIG. 6J illustrates the use of the tip of FIG. 6H in writing a trace.
Figure 6K:
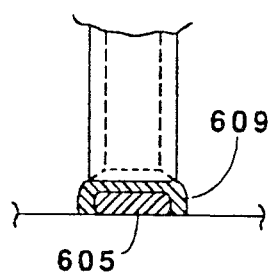
FIG. 6K illustrates the use of the tip of FIG. 6I in writing a trace.

FIG. 6I shows a different machining treatment for the end of a hypodermic tip. In this case an internal bevel has been machined on the tip of a tubing of the same original specs as the tip of FIG. 6H. The included angle A2 is about 118 degrees. Again, a land of about 1 mil is left rather than machining to a sharp edge. S4 is now the outside diameter of the 26 gauge tubing, which is about 18 mils. FIG. 6K shows how an inside beveled tip may be used to write a trace 609 of insulating PTF over an already written traces 605 of conductive PTF material. It should be appreciated that as a general rule the controlling dimension in the trace width is the effective outside diameter of the tubing, i.e. in the outside bevel, the diameter S3 is the effective outside diameter of the tubing relative to the PTF being extruded. Similarly, for the inside bevel, the diameter S4 is the effective outside diameter of the tubing relative to the PTF being extruded.

To begin writing a trace, valve 285 opens allowing PTF material to flow to the write tip, and the x-drive and the y-drive operate to move the write carriage, via the associated cable arrangements, in the desired trace pattern which has been pre-programmed into computerized control system 43. During writing of a trace, resistance heater 313 operates to maintain a constant temperature for the PTF material flowing to the write tip. The temperature is pre-programmed according to such variables as required for the particular PTF material being used, the write tip, and the width and thickness dimensions desired for the trace.

A typical "writing height" for a trace is in the range of 5 to 10 mils, depending on the particular effective diameter of the exit end of the write tip that is used. The height of a surface of a pcb upon which traces are to be written may easily vary more than this amount. As a result, if traces were to be written with the z-drive stationary and the write tip therefore at a fixed height, the height of the write tip relative to the pcb surface would vary to an unacceptable degree. To prevent this anomaly, a pcb surface is first plotted for height relative to a frame reference of the circuit writer. The pcb is divided into zones of about 3 cm. square, and a reference height of each zone is determined. The height for such a zone is known not to vary by enough to seriously effect the operation of the circuit writer. This information is entered to the computer of the control system, and is correlated with the location of traces on the pcb surface. Then during trace writing, the z-drive is operated to vary the writing height to account for the zone on the pcb where writing is currently being done.

When a trace is finished, valve 285 is closed to prevent further extrusion of PTF material at the write tip. The internal drum of the valve rotates 90 degrees in about 18 milliseconds. As indicated earlier, however, since only a few degrees of rotation are needed to completely block off the passage through the valve, the flow is effectively shut off in much less than 1 millisecond. At the point that the valve drum has rotated 90 degrees, side passage 327 is aligned with lower opening 323, and passage 325 is aligned with opening 329 through the valve body. The effect is to open the tubing passage 291 all the way to the write tip to atmospheric pressure, alleviating the pressure provided by the inert gas supply on the reservoir, so there is not continuing extrusion of PTF material from the write tip due to residual pressure after the valve has closed. At the end of writing a trace, the z-direction drive operates to raise the write tip as well.

Figure 7A:
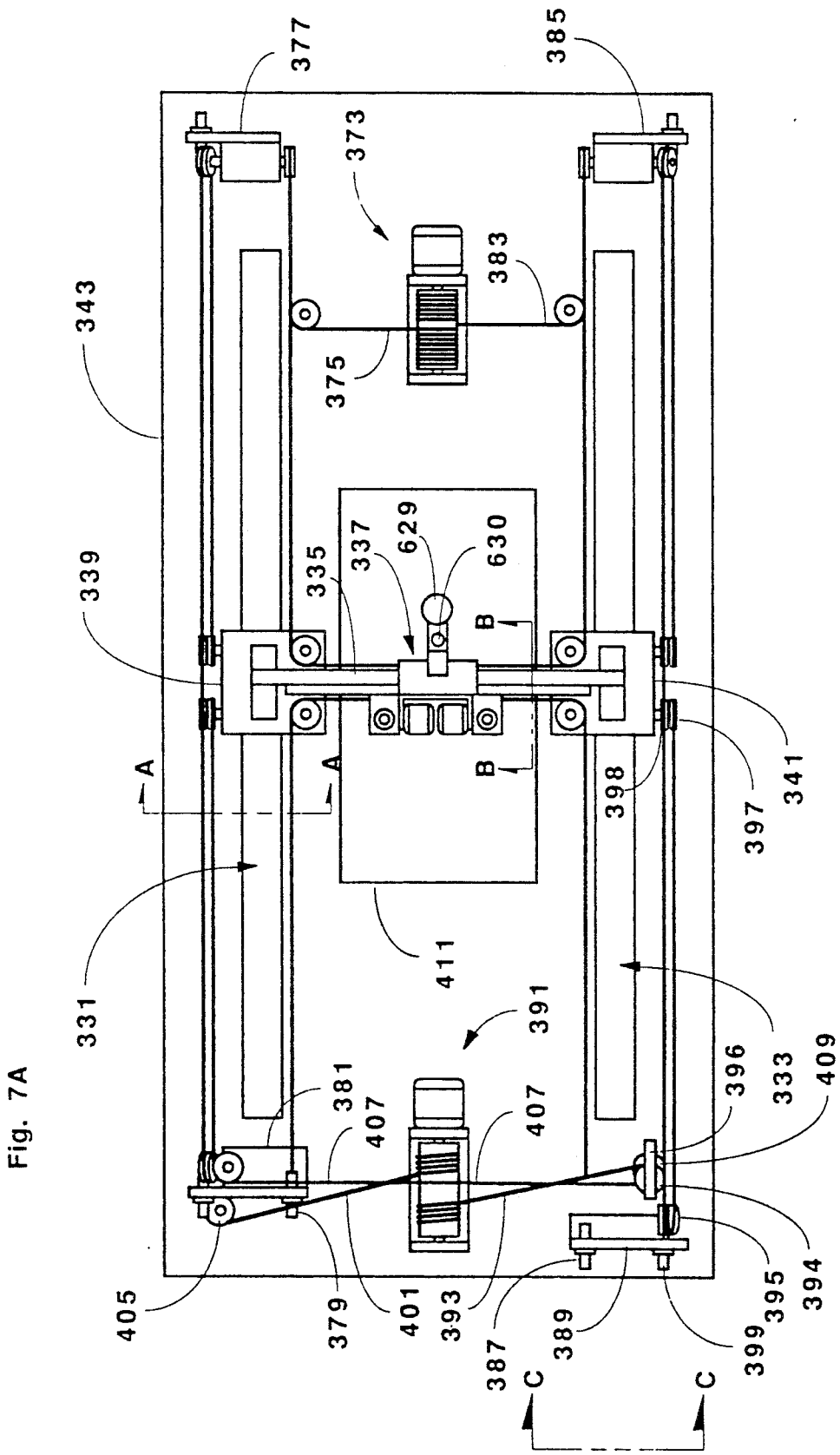
FIG. 7A shows a plan view of an alternative preferred embodiment of the invention.

Shown in FIG. 7A is an alternative preferred embodiment of the circuit writer, hereinafter called version2. The differences in the version2 from the first preferred embodiment described above are in the bearing rails for both the x- and the y-direction drives, the arrangement of the pulleys for the x- and the y-direction drives, and the orientation of the write carriage elements for providing two writing assemblies on the same carriage.

As illustrated in FIG. 7A, write carriage 337 rides on y-direction rail assembly 335, and the y-direction rail assembly mounts to mounting blocks 339 and 341, similar to the cross rail assembly of the previously described embodiment. Mounting block 339 rides along x-direction rail assembly 331 and mounting block 341 rides along x-direction rail assembly 333. The mounting blocks and the y-direction rail assembly are a rigid assembly, so the y-direction rail assembly is constrained to travel in the x-direction along the x-direction rail pair.

Figure 7B:
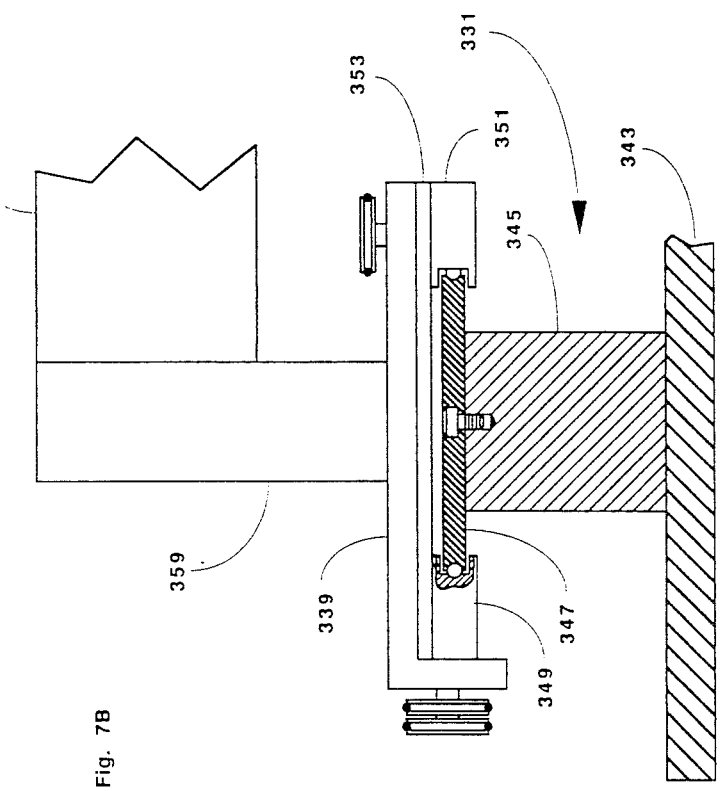
FIG. 7B shows a view of the alternative preferred embodiment through section A—A of FIG. 7A.

FIG. 7B shows section A—A of FIG. 7A, taken through x-direction rail assembly 331 adjacent to mounting block 339. The bearing arrangement for x-direction rail assembly 331 includes a rail 347, hereinafter called a Schneeburger rail after the name of the company from which such rails can be purchased. Also associated with the Schneeburger rail are two bearing blocks 349 and 351. The bearing blocks are mounted to a spacer plate 353, which serves to hold the blocks in a fixed position relative to the rail. Each bearing block has a complement of ball bearings that circulate in an endless path in a constrained track within the block and guide also in a groove along a side of the Schneeburger rail. The resulting arrangement, well known in the art, provides a substantially backlash-free, low friction bearing rail arrangement with particular load carrying capability in the horizontal direction at right angles to the x-direction.

The Schneeburger rail is supported above base 343 on a long support block 345 and fastened to the block by conventional fasteners. Mounting block 339 is securely fastened to spacer plate 353, and support 359 fastens to the mounting block. Support 359 carries a second Schneeburger rail. Rail 357 provides the tracks for constraining the cross-rail assembly to travel in the y-direction at 90 degrees to the x-direction travel. Rail assembly 333 comprises elements equivalent to those shown for rail assembly 331.

FIG. 7C shows section B—B of FIG. 7A, through the cross rail assembly. Schneeburger rail 357 is shown in section. A spacer plate 361 is used for spacing apart bearing blocks 363 and 365 and holds them in position to constrain the write carriage to travel in the y-direction along the crossrail assembly, similar to the assembly of equivalent elements of the x-rail assemblies.

Spacer plate 351 also serves as a mounting platform for assemblies of elements to feed conductive or non-conductive PTF material, which, together with the spacer plate and bearing blocks 363 and 365 make up the write carriage 337. The feeding and write-tip positioning assemblies for the first described are similar to the equivalent assemblies for the first described preferred embodiment. As with the first described embodiment, two such assemblies may be used, which makes it possible to feed conductive and non-conductive traces. Unlike the first embodiment, however, the two assemblies for feeding PTF material and controlling the writing height of the respective write tips are mounted side-by-side, instead of on opposite sides of the cross-rail assembly, as in the first described embodiment.

Figure 7D:
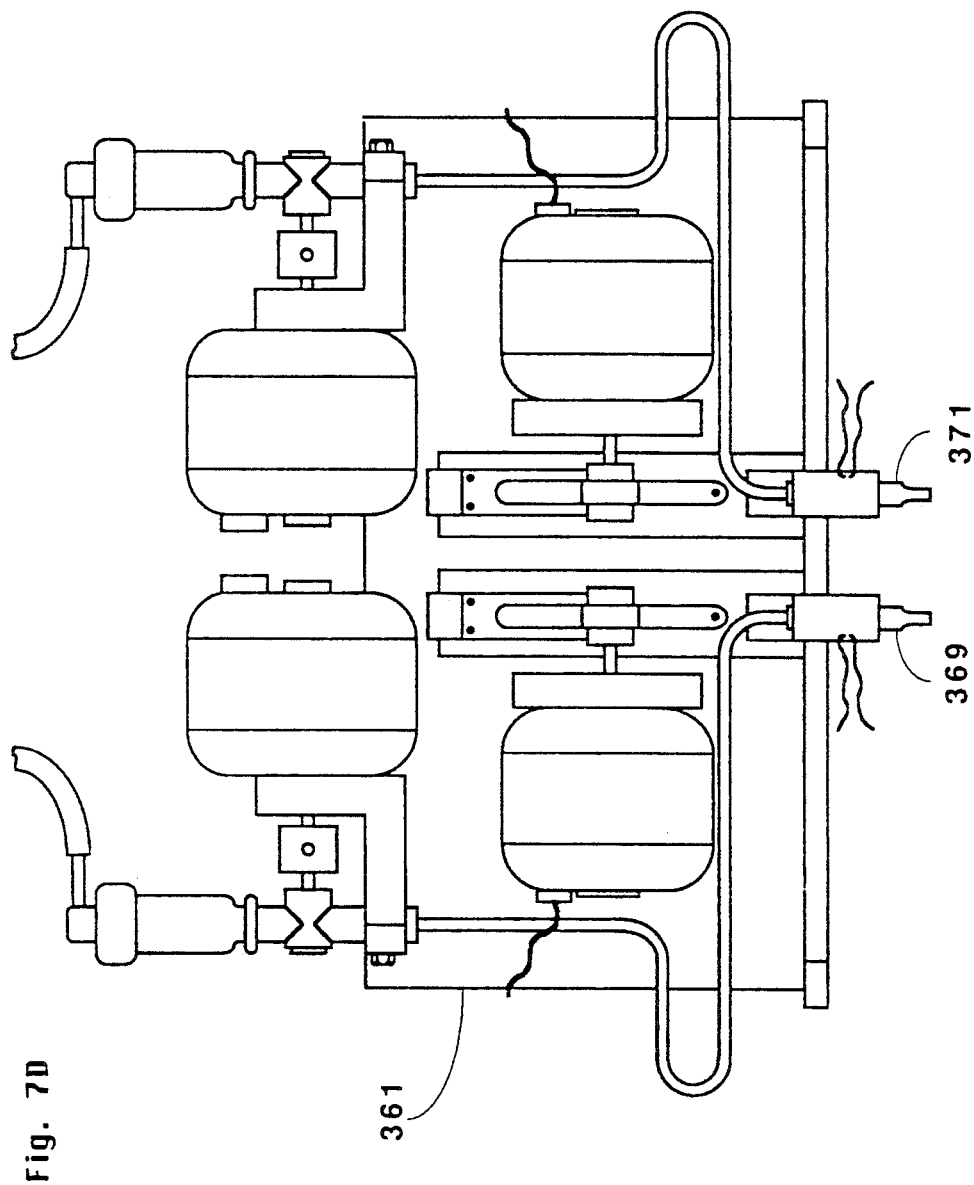
FIG. 7D shows a view of a write carriage from the vantage of line A—A of FIG. 7C.

FIG. 7D shows write carriage 337 from the vantage of line A—A of FIG. 7C, illustrating two PTF material feeding assemblies. The two assemblies are constructed and mounted as mirror images of one another, so that write tips 369 and 371 are quite close. This arrangement has the advantage that, in writing a circuit with one of the write tips, if it is desired to change to the other tip, a minimum translation of the write carriage is required to bring the second tip to the position reached by the first. A change from one top to the other might be wanted if, for example, a circuit were to be written with traces of two widths. One tip would be designed to write one width, and the other tip the other width. Such changes would also be wanted if a circuit needed both conductive and non-conductive traces.

For the version2 embodiment there are separate cable drives for x-direction motion and y-direction motion, just as for the embodiment first described. The y-direction cable system for moving the write carriage along the cross-rail assembly is quite similar in both the embodiments. A cable drive 373 has two cables single wrapped from opposite ends of the drum. Cable 375 exits from the top of the drum and traverse a system of pulleys, going first to corner structure 377, then to a pulley on mounting block 339, then 180 degrees around a pulley under the write carriage, back to mounting block 339 and finally to an adjustable anchor point 379 at corner 381, just as in the first described embodiment. Cable 383 exits from the bottom of the drum and traverses a similar system of pulleys on the other side of the circuit writer, going to corner structure 385, then to mounting block 341, then to a pulley under the write carriage. then back to mounting block 341, and finally to adjustable anchor 387 at corner structure 389. Operation of the y-drive drum, utilizing a stepping motor, moves the write carriage back and forth along the Schneeburger rail of the cross-rail assembly.

In some cases it is desirable that the y-drive have 2 cables to each side rather than a single cable, and this is accomplished by wrapping a third cable in the center of the cable drum of drive 373 in a similar fashion to the cable arrangement previously described for the x-drive of the first described preferred embodiment illustrated by FIGS. 4B, 4C, 4D, and 4E. The third cable provides an additional cable extension to each side, and additional pulleys are provided so that the new cable extension on each side follows closely the path of the original single cable. An additional anchor is needed in this case at each of corners 381 and 389. With such a doubled arrangement for the y-drive, there are two passes of cable between each point where there was one before, and the arrangement is thus strengthened.

The x-direction drive for the version2 embodiment is somewhat different from the x-direction drive for the first described embodiment. X-drive 391 includes a motor driven cable drum as before. There are two cables wrapped on the drum. Cable 393 is a single wrap from one end of the drum (away from the motor end), and exits the drum from underneath extending toward corner structure 389. Cable 393 turns around a pulley 394 in a pulley mounting bridge 396, extends to corner structure 389, passes over vertically oriented pulleys, and extends toward mounting block 341. At the mounting block, cable 393 turns around pulley 398, extends back to corner structure 389, and passes around a pulley 395. The cable then extends back to mounting block 341, turns around a pulley 398, mounted adjacent to but separate from pulley 397, and extends back to corner structure 389, where it is fastened to an adjustable anchor 399. Rotation of the cable drum taking up cable 393 urges mounting block 341 toward corner structure 389.

Pulley 395 is mounted to the corner structure at an angle such that the groove at the top is offset from the groove at the bottom by an amount equal to the measurement between the grooves of pulleys 397 and 398 at mounting block 341. This mounting allows the cable to enter and exit the pulley grooves straight-on, rather than at an angle, reducing friction effects, especially with the cables strongly tensioned, as they are in the preferred modes of operation.

Figure 7E:
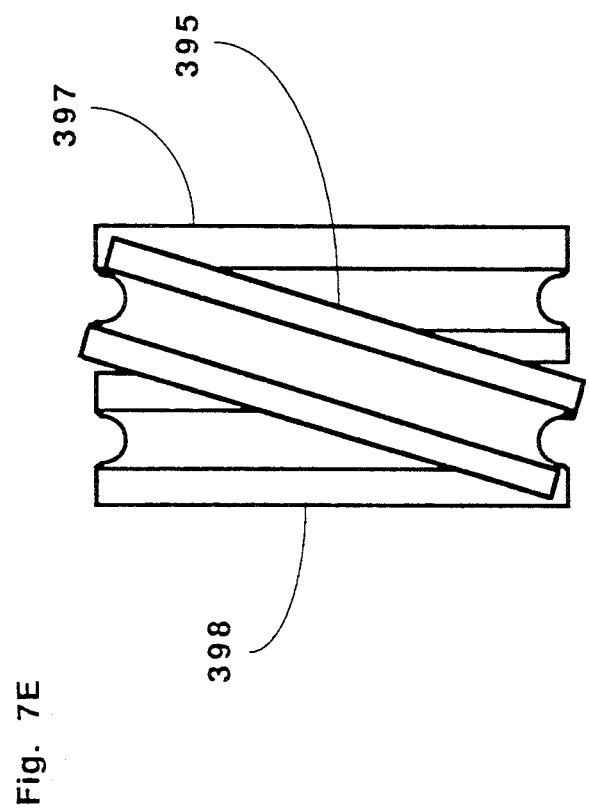
FIG. 7E shows a view from the vantage of line C—C of FIG. 7A illustrating a pulley arrangement in the alternative embodiment.

FIG. 7E, from the vantage of line C—C of FIG. 7A, illustrates the relationship between the two pulleys on the mounting block and the angle-mounted pulley at the corner structure. Only the three pulleys are shown.

Cable 401 is wrapped on the cable drum from the end closest to the motor drive, and exits from underneath the drum toward corner structure 381. Cable 401 turns around a pulley 405 mounted to a block near corner structure 381 and extends the length of the circuit writer to corner structure 377. At the corner, cable 401 turns around vertically oriented pulleys, goes to mounting block 339, around a pulley at the mounting block, back to corner 377, around a pulley mounted at an angle, back to mounting block 339, around a second independent pulley there, and extends back to corner structure 377 where it fastens to an anchor. This arrangement is similar to the arrangement of pulleys and the cabling between mounting block 341 and corner structure 389 for cable 393. When the x-drive cable drum turns taking up cable 401, mounting block 339 is urged toward corner structure 377.

Only the two cables, 393 and 401, are wrapped on the drive drum, and these two accomplish the drive. A third cable, 407, passes over the drum but is not wrapped on the drum. Cable 407 extends on one side toward corner structure 389, and passes around a pulley 409 mounted at an angle in pulley mounting bridge 396. From this point it extends the length of the circuit writer to corner structure 385. Cable 407 passes around pulleys and between corner structure 385 and mounting block 341 in a manner similar to that described for cables 393 and 401 above. On the other side of the circuit writer, cable 407 extends to corner structure 381, and around pulleys and between corner structure 381 and mounting block 339 in the manner already described for other pulleys. Cable 407 is anchored at corner structures 381 and 385, and the arrangement serves as an idler assembly balancing against the pull of the arrangement of cables 393 and 401.

Figure 7F:
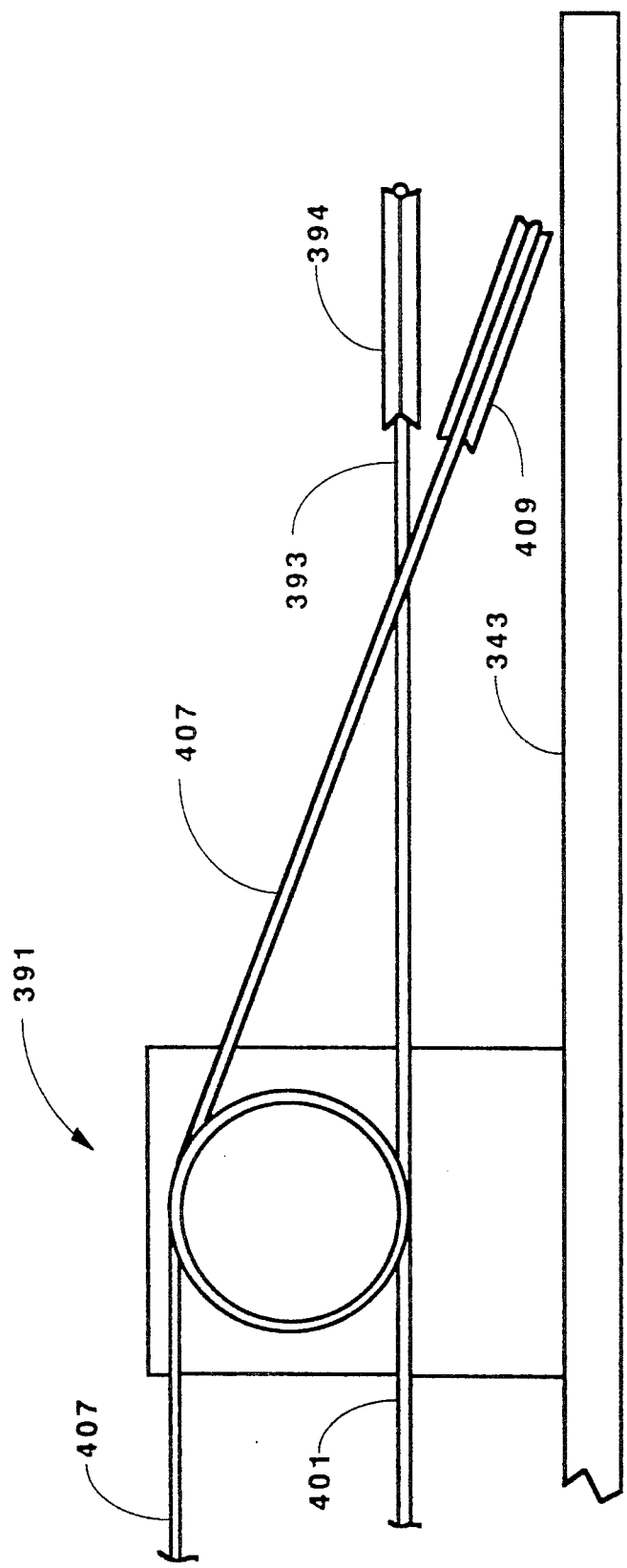
FIG. 7F shows another view from the vantage of line C—C of FIG. 7A illustrating a path for cabling in the alternative embodiment.

FIG. 7F is a view from the same end as line C—C but at the center of the circuit writer, and shows the drum of drive 391 with cable 393 extending to pulley 394, cable 401 extending to the opposite side, and cable 407 passing over the drum to angled pulley 409 on one side. Pulleys 394 and 409 are both mounted in pulley mounting bridge 396, but the bridge is not shown in FIG. 7F so that the relationship of the pulleys may better be seen.

The arrangement of pulleys and cables for x-direction movement is such that rotating the drum of drive 391 on way and the other moves the cross-rail assembly back-and-forth along the x-direction rail assemblies. Turning the drum of y-drive 373 one way and the other moves the write carriage back-and-forth along the cross-rail assembly in the y-direction. Hence, by running the two drives selectively, intricate patterns may be described by the write tips on a printed circuit board positioned on write table 411.

The height of either of the write tips in the version2 embodiment is controlled by motor driven mechanisms similar to those explained for the first described embodiment. The version2 embodiment has the advantage of being lighter than the first described embodiment, partially because the Schneeburger rail elements are lighter than the rail elements used in the first described embodiment. Moreover, the Schneeburger rails are arranged so that the forces generated by cable tension and movement are bending forces across the long dimension of the rectangular rails, providing for a very rigid structure and thus assuring dimensional stability. There need be fewer pulleys used, as well, due to the placement and wrap of the x-drive and the use of angle mounted pulleys. The use of the angle mounted pulleys provides improved cable-to-pulley alignment and lowered drive friction.

Set Up Procedures

There are series of set up procedures to be followed to be ready to process a blank into a pcb by the circuit writer. The first step is to mount a blank to the write table, which may be done, as indicated earlier, by a vacuum chuck and using tape to hold the board to the chuck. In either case, the blank must conform to certain published specifications, and is mounted visually at a specific position. As the circuit writer works to very close tolerances, visually aligning and positioning a board as set up is not sufficient to ensure that traces will be written at precisely the correct positions on the board.

It was indicated previously in this specification that a blank mounted on the write table cannot be perfectly level, and that to form traces with the precision required, the write tip must travel at a closely controlled height above the surface of the pcb upon which a trace is written. Because of this, part of the set up procedure is to measure the height of the surface of the mounted blank at a number of positions in a matrix over the area of the blank, with respect to the frame of the circuit writer. This is accomplished by means of a gauging probe mounted to the write carriage of the circuit writer. Element 630 in FIG. 7A indicates an LVDT gauging probe mounted to the write carriage. After initializing the gauging probe both vertically and horizontally, an operator moves the write carriage to the positions in the matrix by keyboard commands through the computerized control system, and a relative height at a point in each of a number of small areas (each approximately 1 cm. square) over the total area of the blank is read into the computer according to the indication of the gauging probe riding on the write carriage and contacting the surface of the mounted blank. This array of data is used subsequently in process control to control the height of the write tip (z-direction) relative to the surface of the blank upon which a trace is being written.

Alignment of the blank in the x,y plane and rotationally is accomplished by means of a video camera fixedly attached to the write carriage of the circuit writer, which projects a display for the operator including crosshairs that the operator can coincide with specific marks on a blank and on the write table for input to the computerized control system. Element 629 in FIG. 7A indicates a video camera mounted to write carriage 337.

An alignment block is mounted to the circuit writer for aligning and zeroing the write tips (also called the pens) and the camera crosshairs. As the control system "knows" the step position of each of the stepping motors in the x-, y-, and z-drives, the operator may develop offset information for the computer by moving the pens and the camera crosshairs each to the "standard" position of the alignment block, which is done typically with the cursor control keys of the computer keyboard, and noting the positions (entering them to the computer database). In the preferred mode, the operator should take care to approach each reference from the same direction to minimize hysteresis problems that might otherwise introduce errors in the data, and be careful to align to the nearest step position attainable by the write carriage, which is 1 mil increment.

An alignment block, also called a touch pad, is shown as element 70 in FIG. 4A, mounted to the base frame of the circuit writer. FIG. 4I is a view of the alignment block with arrow 72 shown the indicate direction as in FIG. 4A. The alignment block is carefully machined and mounted to the circuit writer frame to provide an absolute positional reference for the moving elements. An operator would use this reference, as an example, by moving the pens to surfaces 701, 703, and 705 to develop absolute reference for the z-direction; to parallel surfaces 707 and 709 to develop absolute references in the y-direction; and to parallel surfaces 711 and 713 to develop absolute references in the x-direction.

As a part of the set up procedure, the operator also uses the camera crosshairs to input the position of each of three reference points located in an orthogonal pattern on a pcb blank, again being careful to approach the points from the same direction and to the nearest possible step. These points are entered to the data base, and allow the computer program to computer scale factors, offsets, and rotational correction. After the computations, the write table is rotated by the computer through the rotational mechanisms shown previously by FIG. 2H, and the scale factors and the rotational angle are displayed. If the correction angle is relatively large, the operator may elect to repeat the alignment process. The alignment is typically repeated until the rotational correction is less than 0.001 degree. Illumination during the alignment process is provided by a ring light, and the goal is to provide uniform illumination which does not bias the operators's perception of the target. It is planned that machine vision techniques will be used in future to replace the operator and to automate the alignment procedure.

Process Control

Control of the elements to accomplish circuit writing is similar in the two described embodiments, since there are a large number of corresponding elements between the two embodiments. FIGS. 8A, 8B and 8C are block diagrams indicating the gross requirements for translating raw data pertaining to a printed circuit board (pcb) design to a board with the traces written by the circuit writer. FIG. 8A indicates the three main processes. Block 549 indicates processes of computer aided engineering (CAE), which compute such things as the width and cross section needed for traces to carry required current loads with an adequate margin of safety. Block 551 indicates the processes of computer aided design (CAD), which accomplishes such tasks as routing the traces between the various devices to be mounted on the pcb. Block 553 indicates the information from the CAD processes fed to the circuit writer to cause the x-, y-, and z-drives and the various actuators to write the traces on a pcb.

FIG. 8B expands the CAE processes to indicate the processes of schematic capture 555 and net list extraction 557, resulting in a net list (i.e. a list of components) to be used as input data for the CAD processes.

FIG. 8C expands the CAD processes to show the process of feeding physical location data 559 and the net list to a routing engine 561 (router), which does the layout of traces for the pcb, resulting in a database called a route. The router operates by programmed rules, such as a number of allowed trace connections to a single connector pad where a device is mounted on a board, the minimum allowable spacing between traces on the board (to avoid shorting or other interference across the space), the minimum bend radius allowed, and more as will be described later.

Various standard computer programs for performing CAE and CAD are well known in art, and can be used for producing the net list and the physical layout of the pcb. Similarly, routers are also commercially available, and can be used directly to produce the route, provided that the particular rules related to this extrusion method of providing traces are incorporated into the command set.

Figure 9:
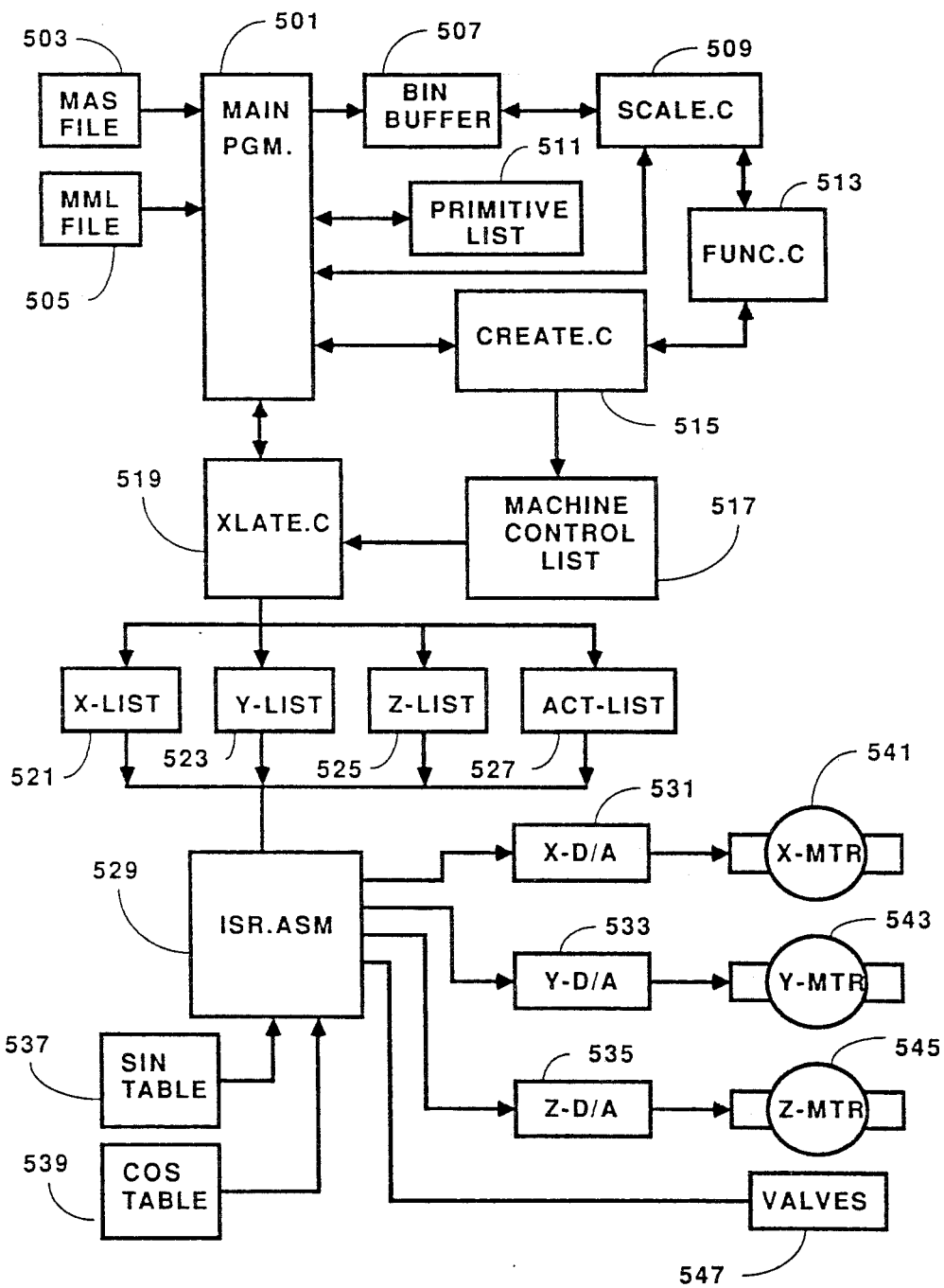
FIG. 9 shows a block diagram illustrating process control functions used in operating the invention.

FIG. 9 is a block diagram of process control for the circuit writer performed by computerized control system 43 (FIG. 1). Program element 501 is the main program, which handles overall tasks such as loading and manipulating data and calling sub-programs to convert loaded data to a form usable by the operating elements of the circuit writer. Element 503 is a machine action sequence (MAS) file, which is loaded by the main program from peripheral storage, such as a disk drive, and stored in program element 507, the binary buffer. Element 505 is a precomputed mechanical motions list (MML) which is also loaded from peripheral storage and stored internally as element 511, the primitive list. The primitive list is principally a list of acceleration vectors in a form recognizable by the driven elements (motors) for doing certain primitive actions that may be combined in sequence to cause the circuit writer to write traces corresponding to the layout developed by the routing engine and stored in the binary buffer. Sine and Cosine tables are also loaded from peripheral storage and stored internally as represented by program elements 537 and 539.

Elements 509 is a sub-program, called SCALE.C in the preferred embodiments, that scales all of the addresses of current record in the binary buffer during operation, and returns the scaled results to the binary buffer. Element 513 is a preprogrammed file of various functions used by SCALE.C and another sub-program called CREATE.C, element 513, in the preferred embodiments. CREATE.C, at direction from the main program, reads trace data from the binary buffer, finds the correct set of motor primitives from the primitive list, element 511, and builds elements 517, called the machine control list in the preferred embodiment.

Directed by the main program, element 519, called XLATE.C (for translate.C) in the preferred embodiments, translates the machine control list and builds four separate lists represented by element 521, the X-LIST; element 523, the Y-LIST; element 525, the Z-LIST; and element 527, the actuator, or ACT-LIST. Each of these lists is a sequence of actions to be taken by the corresponding control element, these being the x-drive, the y-drive, the z-drive, and the valve actuator, in the order in which they must occur to write the desired traces, and with a time reference for each.

Element 529 is a subprogram called the interrupt service routine, ISR.ASM in the preferred embodiment. This program element is activated on a repeating timed basis, 0.5 milliseconds in the preferred mode. Each time activated, it compares the current time with the times listed in the various action lists. If the time values match, it is time to update the acceleration or actuator for that control function. The ISR maintains the current position for each axis, and every 0.5 milliseconds, in the preferred embodiment, the position is updated by the formula $X=VT$, and the velocity is updated by the formula $V=AT$.

The interrupt service routine causes signals to be sent to interface 531 for the x-axis, 533 for the y-axis, and 535 for the z-axis, and also to the valve or valve actuators to be controlled. Elements 531, 533, and 535 are digital to analog converter modules where the digital information is converted to analog signals to control the x-motor 541, the y-motor 543, and the z-motor 545. Through the motions of the three motor drives and the actuation of at least one valve to start and stop the feeding of PTF material, the traces are written on the pcb.

Board Requirements

The circuit writer, in the preferred embodiments described, is generally supplied with a blank conforming to certain specifications. This is important so that the positions of conductive pads, where component leads will be soldered or otherwise connected, can be supplied as data to the computerized control system. Preprogrammed procedures very similar to those that are commonly used in the art can then be used to "route" connecting conductive traces between the pads, the conductive traces forming the circuit connections between the pads, and hence between the component leads. It is the conductive traces written by the circuit writer that form the circuit connections. Insulative traces may also be written over the conductive traces to provide protection from the environment, to insure against shorting across traces, and to permit one to write conductive traces crossing over conductive traces previously written, increasing the density and complexity of circuits that may be accomplished by the circuit writer. The specifications of a blank, as they relate especially to sizes and positions of pads, are determined by the set of "primitives" available to the carriage and pen tip, i.e. the minimum set of movements from which all desired movements can be constructed, and the "router rules", i.e. geometrical constraints typically required for traces constructed by extrusion. The primitives and router rules are software preferences, and may be changed to accommodate different needs, so blanks of many different specifications may be accommodated through program changes, without departing from the spirit and scope of the invention. (See Appendix A for a listing of software primitives.)

Figure 10:
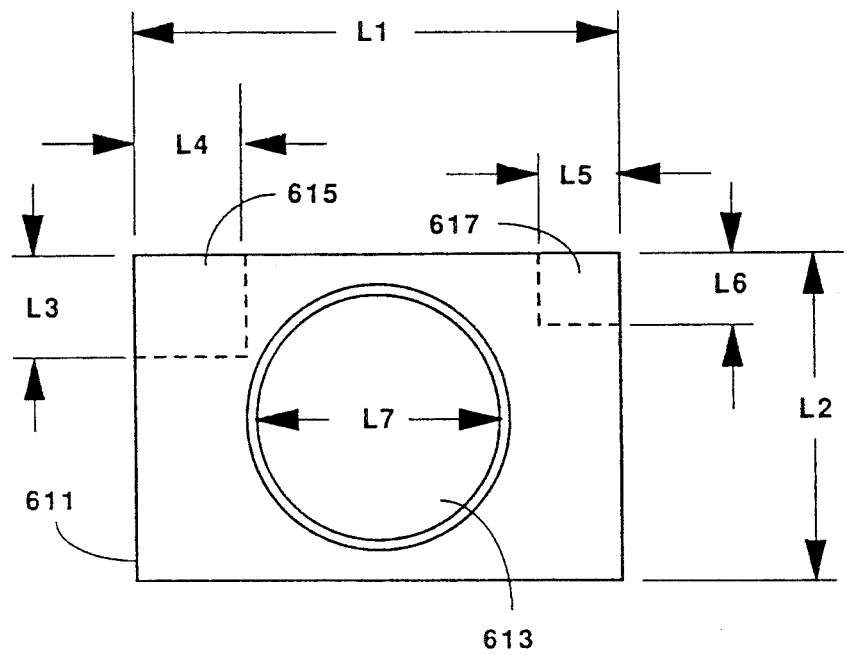
FIG. 10 shows a typical pad on a printed circuit board as used by the invention.

FIG. 10 shows the standard and preferred pad dimensions for a typical board according to a preferred embodiment. The length L1 of typical pad 611 is 60 mils with a tolerance of about 5%, and the width L2 is 40 mils, again within a tolerance of about 5%. A pad typically has a through-hole 613 with diameter L7 of 31 mils within a tolerance of about 10%, for the lead from a circuit component, such as a resistor, to fit into, where the lead will be soldered or otherwise adhered to the pad. The pad material is preferably copper with a nickel and gold plating to ensure adhesion of a trace to a pad. The hole is not required for components that are designed to be surface mounted.

A blank for use by the circuit writer typically begins as a laminated board with copper sheet adhered to one or both sides, just as in the conventional pcb process. Unwanted copper is etched away to leave isolated pads of desired size and shape where required, and often other areas of copper surface separate from pads, to be used for ground planes or power planes.

An area 615 at each of the four corners of the pad is specified as the "landing zone" with dimensions L3 of 12 mils and L4 of 14 mils in the preferred mode. This is the area of a pad that can nominally be covered by a connecting trace. One such area at one corner is shown in FIG. 10. A smaller area 617 is known as the critical landing zone, which is the minimum allowed area of a pad where a trace may attach. In the preferred constructions, the dimensions of the critical landing zone are L5=9 mils and L6=8 mils. PTF traces may terminate at any of the four corners for a total of up to four trace terminations for a single pad on one side of a board. A plate through-hole may have a pad to the same specifications on the opposite side of a board, and up to four more traces may terminate there, raising the total of possible traces for a single pad to eight. Those skilled in the art will appreciate that other shapes could also be used for the pads provided they permit adequate area for trace connection. For example, a circular pad could be used, or a pad having a different number of corners could be used. In each instance, however, there is a tradeoff of board "real estate" available for traces versus the difficulty of hitting a corner very precisely at the beginning and end of a trace, as well as concern for the number of traces that might be needed for a particular component.

Figure 11:
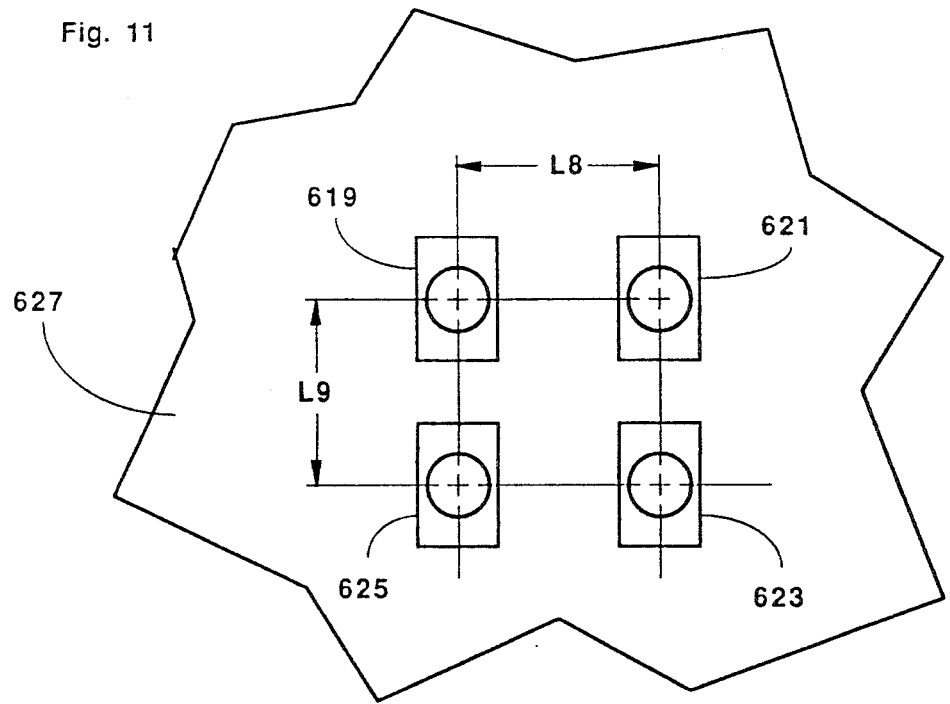
FIG. 11 shows a typical relationship between pads on a printed circuit board as used by the invention.

FIG. 11 shows four pads 619, 621, 623, and 625 on a typical board 627 according to a preferred embodiment. Only a small area representing a portion of the board is shown. The relationship, centerline-to-centerline, of the pads is L8=L9=100 mils for the preferred programming of the circuit writer.

Figure 12A:
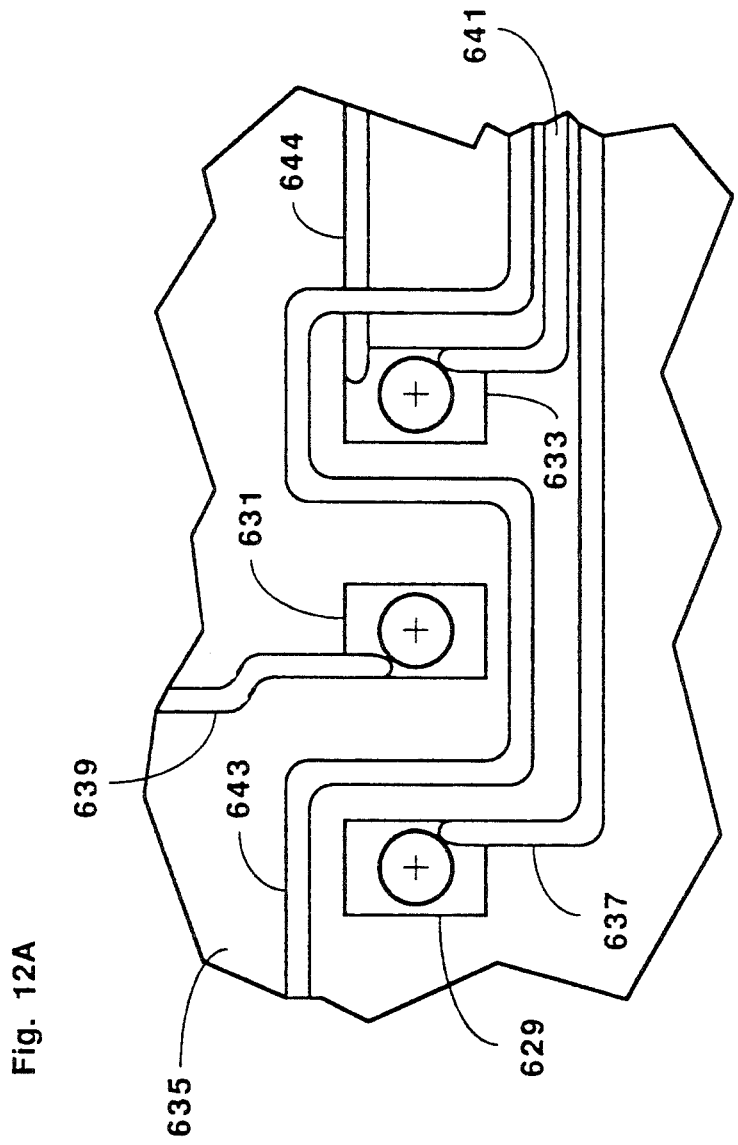
FIG. 12A shows a portion of a printed circuit board with pads and with traces written by a circuit writer according to the invention.

FIG. 12A shows three pads 629, 631, and 633 according to the preferred dimensions and placement with connecting traces on a portion of one side of a board 635. Trace 637 contacts one corner of pad 629, trace 639 contacts one corner of pad 631, and trace 641 contacts one corner of pad 633. Trace 643 passes through the area of the three pads, but doesn't make contact with any of the three pads shown. Trace 644 contacts a corner of pad 633 and crosses under trace 643. By covering conductive traces with insulative material, another layer of traces may be added crossing over a first layer of traces, without causing shorts or other interference.

In writing a board with multiple layers of traces, multiple writing passes are typically made. A pass is the procedure of writing a series of traces with one PTF material without crossing patterns. After a first pass making a number of connections between pads, a second pass may be made covering all or part of the first pass traces with insulative PTF material, then a third pass may be made, and conductive PTF traces may be allowed to cross over conductive traces from the first pass where the first pass traces are protected by an overlayer of insulative PTF material. The number of layers that can be formed is theoretically limited by the use of landing zones on the pads, and as a practical matter by complicated topography that results requiring careful control of position of extruder tip height.

Figure 12B:
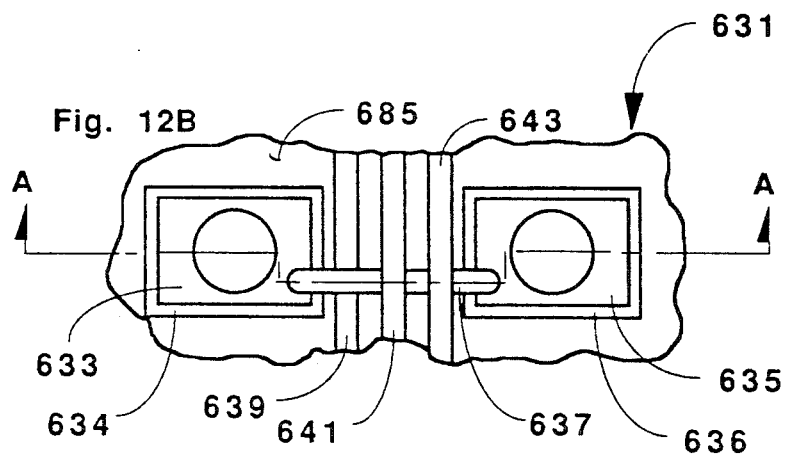
FIG. 12B shows two pads and extruded traces on one side of a two-layer printed circuit board according to the invention.

FIGS. 12B, C, and D show different views of portions of a 2-layer board as prepared by a circuit writer in which crossing patterns are used. FIG. 12B shows a portion 631 of the surface of one side of the board, showing two rectangular pads 633 and 635. The pads are separated from a power plane area 685 by etched channels 634 and 636. A trace 637 is written between the pads. Three more traces 639, 641, and 643 written by the circuit writer are shown passing through the area between pads 633 and 635, but not contacting either pad.

Figure 12D:
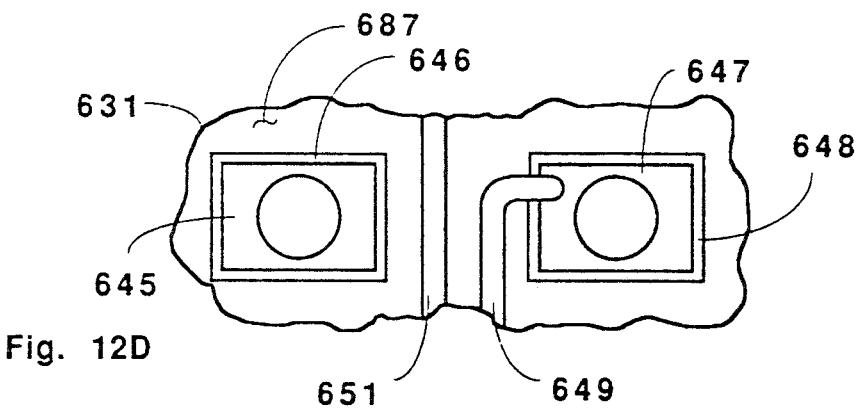
FIG. 12D shows two pads and traces on the opposite side of the printed circuit board from FIG. 12B.

FIG. 12D is a view of a portion of the other side of the pcb showing two additional pads 645 and 647, a trace 649 contacting pad 647 and a trace 651 passing through the area between the pads without contacting either pad or crossing over or under trace 649. Pads 645 and 647 are closely aligned with pads 633 and 635 on opposite sides of the pcb.

Figure 12C:
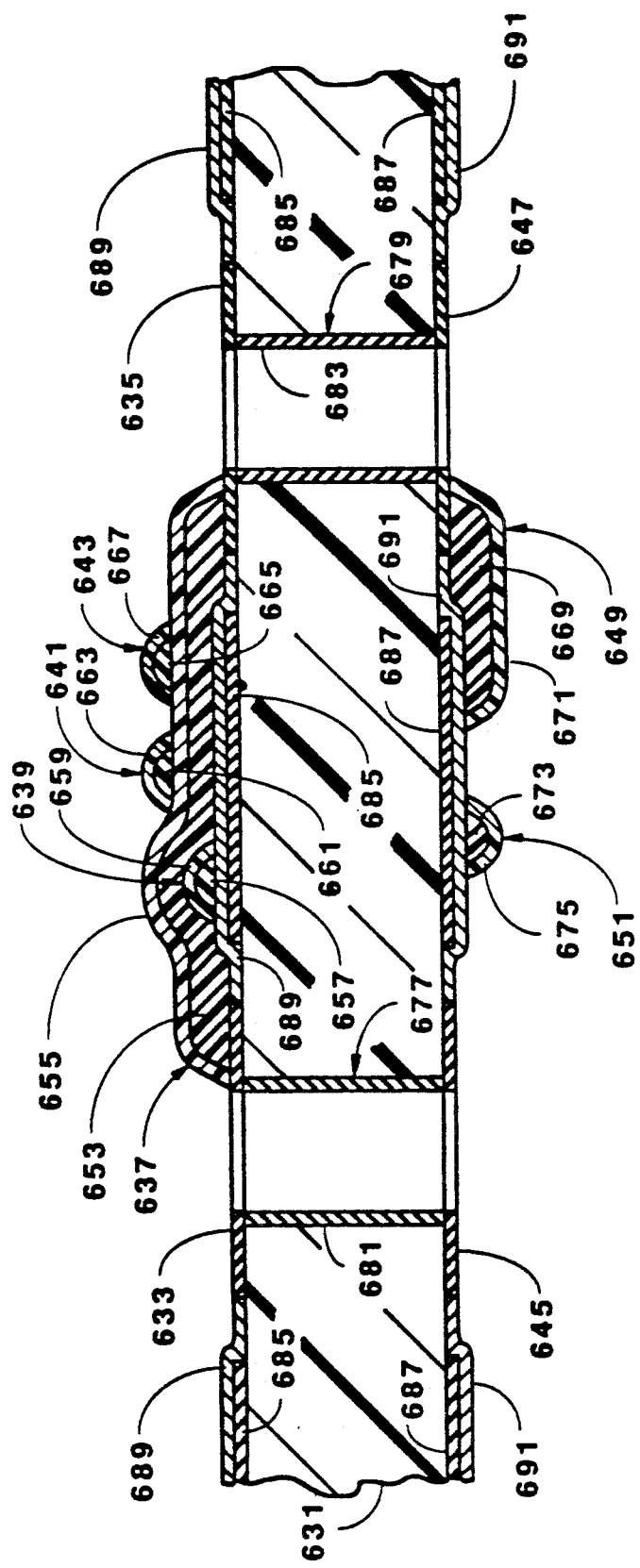
FIG. 12C shows a section along line A—A of FIG. 12B.

FIG. 12C is a section of the pcb taken along line A—A of FIG. 12B. All of the elements of FIG. 12B and FIG. 12D are shown. It is clear in FIG. 12B that trace 637 passes over trace 639, but both traces 641 and 643 pass over trace 637. This relationship is more clearly seen in section view FIG. 12C. Moreover, the traces are compound traces formed of two materials. Trace 637 is formed of a trace 653 of electrically conductive material and a covering trace 655 of insulative material. Similarly, trace 639 has a conductive trace 657 and an insulative covering trace 659, trace 641 has an electrically conductive trace 661 and an insulative covering trace 663, and trace 643 has an electrically conductive trace 665 and an insulative covering trace 667. It is the insulative covering of the traces that allow crossovers to be made without electrical shorting between conductive traces.

On the opposite side of the pcb, trace 651 has a conductive trace 673 and an insulative covering trace 675 while trace 649 has a conductive trace 669 and an insulative covering trace 671. This is true even though no crossovers are shown for these traces. Elsewhere on the pcb there may well be crossovers involving these two traces, and even in the absence of crossovers, the insulative covering has a protective effect for the conductive traces and prevents shorting between traces by intrusion of a foreign object or material.

In FIG. 12C a hole 677 through the pcb is shown between pads 633 and 645 on opposite sides of the pcb, and a hole 679 connects pads 635 and 647. Hole 677 is lined with copper material 681 and hole 679 is lined with copper material 683. The copper material is applied in the fabrication of the pcb blank typically by electroless plating, and typically in the preparation of the blank before writing of traces by the circuit writer. It is the conductive lining of the holes that establishes electrical contact between the pads on opposite sides of the pcb.

Also shown in FIG. 12C are surface power planes 685 and 687, which are copper sheet formed in the fabrication of the blank at the same time that the pads are formed, typically by etching away portions of copper cladding adhered to the nonconductive board. There are also dry film solder masks 689 and 691 that are formed by conventional techniques, typically before circuit writing.

Figure 12E:
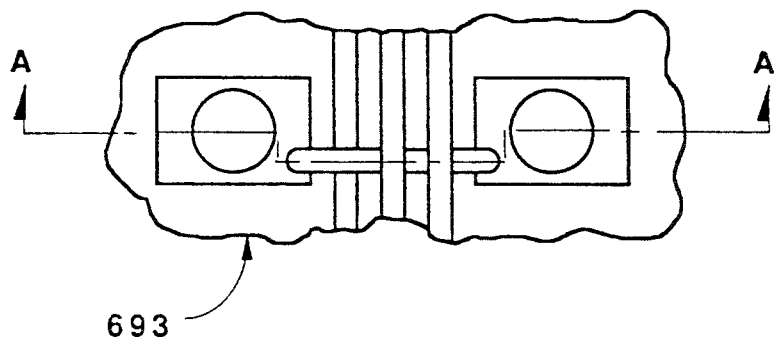
FIG. 12E shows two pads and extruded traces on one side of a four-layer printed circuit board according to the invention.
Figure 12G:
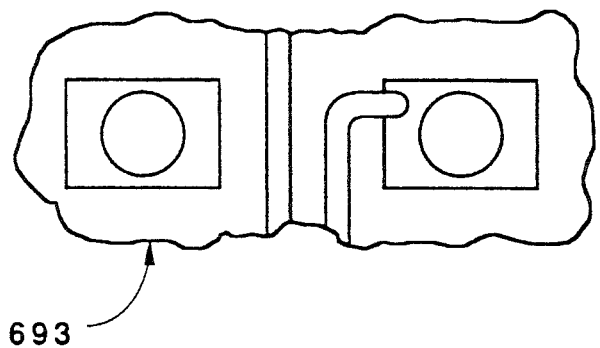
FIG. 12G shows two pads and traces on the opposite side of the four layer board from FIG. 12E.
Figure 12F:
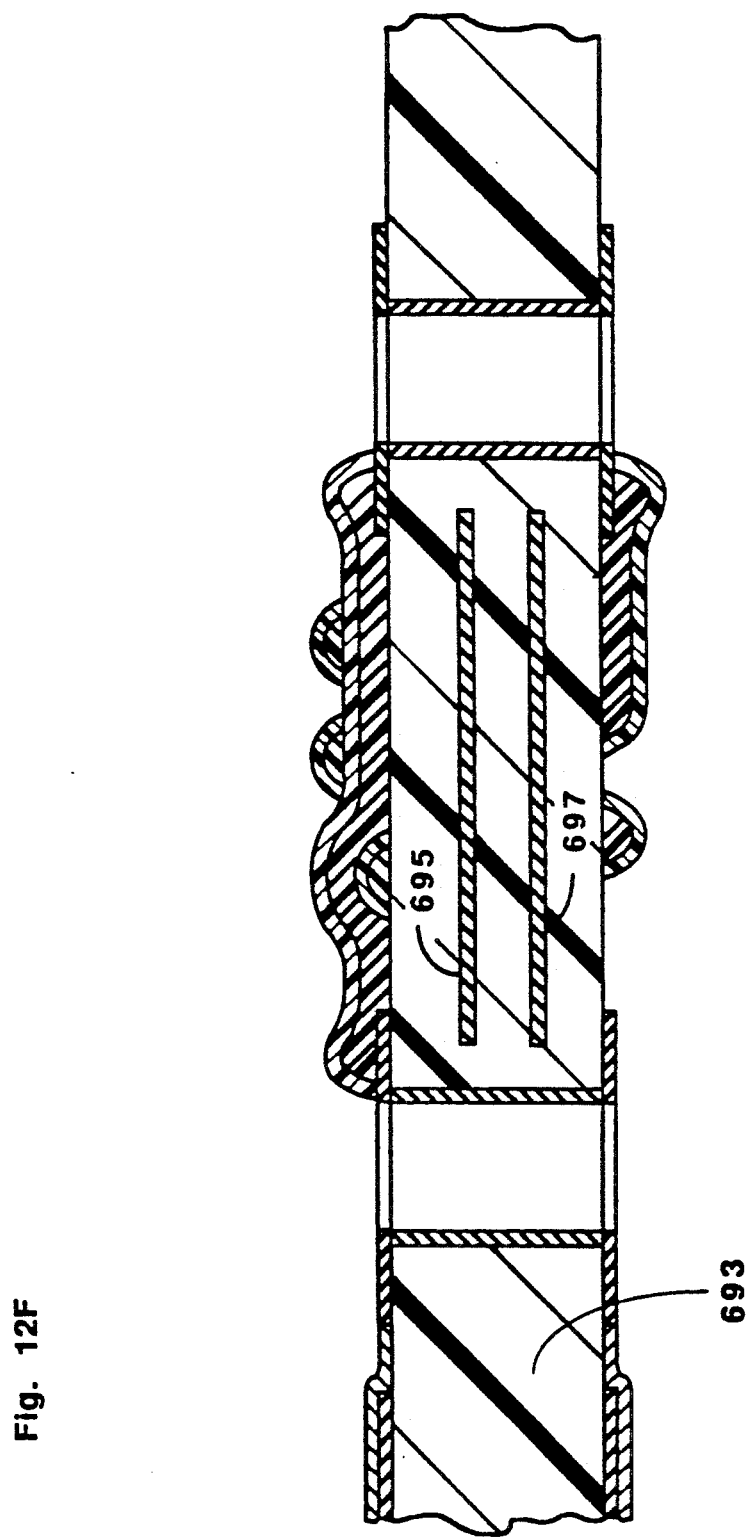
FIG. 12F shows a section along line A—A of FIG. 12E.

FIGS. 12E, F, and G show different views of a portion 693 of a printed circuit board similar to the board shown in FIGS. 12B, C, and D. The main difference between the two boards is that in the board of FIGS. 12B, C, and D, which is known in the art as a two-layer board, all elements are on one surface or the other of the board, the two board surfaces constituting the two layers. In the board of FIGS. 12E, F, and G there are conductive elements internal to the board. Power planes 695 and 697 are copper conductive traces formed on the surface of thinner boards that are subsequently laminated together so that the power planes are buried in the resulting board at two different levels. The elements on each surface, including traces written by the circuit writer, and the power planes within, comprise the four layers of this four-layer pcb.

One prior art method of preparing circuit boards, particularly prototype boards, is by connecting fine wire between electrically conductive through holes on a board. Such a board is called in the art a "wire wound" or "wire wrap" board, or pwb, and this practice is a typical method in the prior art of prototyping boards. A board prepared by the circuit write can achieve a circuit density equivalent to the density of a wire wound board of at least 6 layers and in some cases 8 or 10 layers.

As indicated earlier, the use of extruded polymer thick film for traces results in a few changes in the router rules from what would normally be used in a wet process manufacture. In the preferred embodiment, since boards in the industry do not typically have landing pads for connecting component leads, one new router rule is that the extruded PTF must end on a corner of a pad, and that there can be only one trace on a corner. Similarly, when a trace enters or leaves a pad, it generally is constrained to extend a given distance before turning, in order to leave a room for attachment to the other pads. A typical distance is to use the sum of the trace spacing and half the width of the trace. Another rule is to avoid a sequence of turns that are too close together. This is typically done by requiring that once a turn has been made, that the trace continue some minimum distance before another turn is made. A typical example of such a requirement would be to require the distance before a second turn could be made to be half of the sum of the trace width and the trace spacing. Another rule is that crossovers are permitted. However, for convenience in the presently implemented apparatus, only one crossover is allowed at a particular point. An additional rule is that the traces should cross at right angles. This latter rule, and all of the above rules are predicated on the convenience of having each line segment of a trace lying along the directions of the x- and y- axes. Clearly many of these rules can be relaxed or completely eliminated if one is willing to lose the convenience of the x-y orientation of the line segments making up the traces. An additional rule that is presently used for convenience, is that there are no traces on top of, and along the same direction as, another trace. As will be described subsequently, however, this rule can be relaxed when higher densities are very important. With the above changes in router rules, it is possible to take convenient advantage of the x-y nature of the stage assembly and still simulate the routing of a wet process board or wire wrap construction.

Figure 12H:
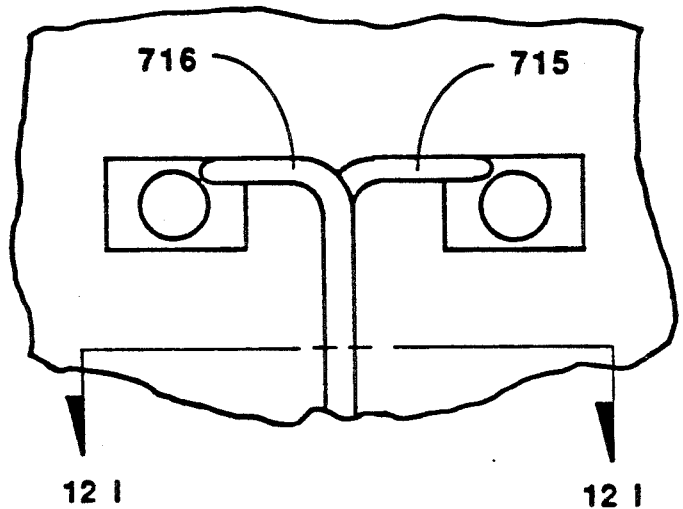
FIG. 12H shows a plan view of two pads and a compound trace.
Figure 12:
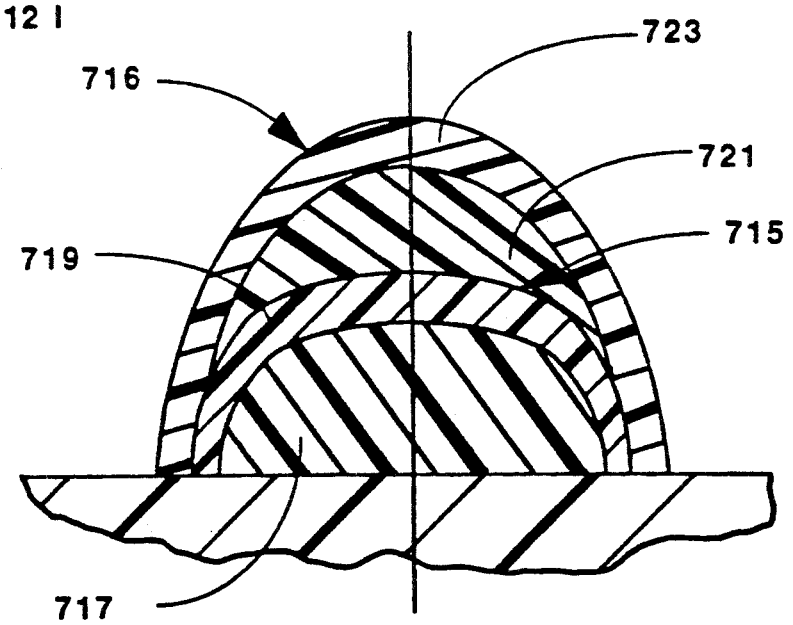
FIG. 12I shows a section of the compound trace from FIG. 12H along line A—A.

As indicated above, there are instances in which it is desirable to have one trace along the top of another trace. By relaxing the router rules, this arrangement conserves board space by increasing the number of traces that can pass by between adjacent pads. FIG. 12H shows two pads, each with a trace contacting one corner. Trace 715 extends from one pad and turns ninety degrees, and trace 716 extends from the other pad and turns in the same direction as trace 715 and lays over the top of trace 715. FIG. 12I is a view of section A—A of FIG. 12H, and shows the two traces. Trace 715 has two portions, a conductive portion 717 and an insulative portion 719. At the position of section A—A where the two traces are superimposed, one above the other, trace 716 lies directly over trace 715. Trace 716 also has two portions, a conductive portion 721 and an insulative portion 723. Typically each portion of each trace is written in a separate pass of the write carriage. The conductive portions of the two traces do not contact, and there is therefore no electrical interference between the traces.

PTF Materials Considerations

The polymer thick film materials that are applied by the circuit writer are formulated to have certain preferred characteristics to operate satisfactorily in the apparatus and to form desireable conductive and insulative traces on a pcb. Rheological characteristics (thixotropy and viscosity) are achieved such that the materials can be applied onto a circuit board by extrusion under pressure through a small aperture, such as the hypodermic tips described hereinbefore. Drying characteristics are important as well. Formulations are such that a PTF, when deposited as a layer and then subjected to a stream of heated air for a short period of time, will develop enough firmness, physical integrity and rigidity (before curing), that a next layer can be applied without interference with the properties of, or the performance of, previously deposited or later deposited layers. PTF materials for a circuit writer are formulated also so that after curing they will have the desired properties (excellent conductivity or resistivity) and the needed mechanical properties for a printed circuit board.

In an electrically conductive PTF, typical ingredients include a mixture of metal particles, such as silver, which may be in several forms, such as flakes or spheres, of from 85 percent to 95 percent by weight; a resin and hardener from 10 to 15 percent by weight; and optional adjuvants of from 0 to 2 percent by weight. Also, in the preferred mode, included typically are at least two solvents of substantially different volatility, one being relatively nonvolatile while the others are relatively more volatile so that when a newly deposited PTF layer is subjected to a stream of hot air, the solvent will substantially evaporate leaving a firm paste behind over which another layer of PTF material can be written without engendering mutual interference of performance between layers. The ratio of the nonvolatile ingredients to the volatile solvents typically ranges from 1:2 to 1:5 by volume.

In an electrically insulative PTF, typical ingredients include a mixture of a resin and hardener from 90 to 99 percent by weight; a gelling agent of from 1 to 10 percent by weight; and optional adjuvants of from 0 to 2 percent by weight. Also included are at least two solvents, one being relatively nonvolatile and the others relatively more volatile for the same reasons as described above for conductive PTF.

With regard to the mechanical characteristics of the PTF, the material must flow conveniently out of the write tip, but once applied to the surface of the pcb should not flow, but instead have enough mechanical stability to maintain a relatively narrow trace width and adequate thickness to provide good current carrying capacity, or insulating capability, as the case may be. As a practical matter, in the preferred embodiments, these mechanical characteristics correspond to a having practical a range of viscosities for the conductive PTF of between 15,000 and 30,000 centipoise at a static sheer rate of 20/sec., while at a low shear rate of less than about 0.01sec., the practical range of viscosities should be between one million and five million centipoise, which is quite stiff. As a general rule, however, a somewhat reduced range of viscosities between 20,000 and 27,000 is more preferred at the higher shear rate, and the most preferred range is between 22,000 and 25,000 centipoise. For the insulator materials, the practical range of viscosities for a high shear rage of 20/sec., appears to be about 15,000 centipoise to about 30,000 centipoise, with a more preferred range of about 20,000 to 22,000 centipoise. For the low shear rate, below about 0.01/sec., the practical range appears again to be about one million to five million centipoise, with a preferred operating point of 2.5 million centipoise, as it is also for the conductive PTF. It should be appreciated, however, that the viscosity is highly dependent on temperature, and, using the preferred materials and apparatus, the typical PTF temperature to achieve the desired flow characteristics out of the write tip is 40 degrees C. Furthermore, because the viscosity is such a strong function of temperature, it is important that the temperature be well controlled during circuit writing in order that the shape and repeatability of the traces be adequately controlled. Hence, in the preferred embodiment, the temperature is maintained at 40 degrees C. to within +1 degree C. Higher temperatures could be used, for example 60 degrees C., which would relieve somewhat the temperature constraints. However, as the temperature is raised, the operating temperature more closely approaches the polymerization temperature.

A specific example of an electrically conductive PTF for use with the circuit writer was prepared by the following recipe: To a mixture of silver flake (96 parts, Handy and Harman Silflake 282), silver clusters (24 parts, Handy and Harman Silpowder 228) and silver spheres (5 parts) was added acetone (15 parts), N-methylpyrrolidone (10 parts) and the dimethyl ether of diethyleneglycol (diglyme, 3 parts). The resultant paste was passed through a 150 mesh screen. A part of the paste (containing 65 parts of silver) was mixed with an epoxy resin (Ciba-Geigy Corp., Araldite GZ 488 N-40, 6 parts) and a curing agent (m-phenylene diamine, 1.8 parts) and stirred to obtain a uniform blend. To this mixture acetone was added (10 ml) with stirring to obtain a uniform mixture. The mixture was then subjected to a reduced pressure (29 inches of mercury vacuum) for 30 minutes to obtain a thixotropic paste that could be applied to a board by extrusion under pressure (5-100 psi) through a small aperture having a diameter of from 5 to 29 mils. This extrudate subjected to a stream of hot air for 5 minutes dried to a firm line upon which a layer of insulating PTF could be applied without damage to the performance of either layer. It was found that this conductive layer could be cured in a heated over along with the applied insulative layer to form an insulated conductive trace of low resistivity.

Those skilled in the art will appreciate that each layer could have been separately cured, but that this one step curing process saves considerable time and avoids realignment problems if cuing is attempted between a conductive layer and its corresponding insulative layer.

A specific example of an insulative PTF was prepared by the following formula: To an epoxy resin (Araldite GZ 488 N-40, 20 parts) was added dioxan (5 parts) and bisphenol A dicyanate (Interez RDX 80352, 16 parts). Into the solution obtained, erogenic silica (Silanox 101, Cabot Corp., 1.6 parts) was dispersed. The dispersion was then blended with acetone (15 mL) and subjected to a reduced pressure (29 inches of mercury vacuum) to obtain an insulative paste having characteristics similar to the rheological and drying characteristics described above for a conductive PTF.

It will be evident to those skilled in the art that there are many changes that may be made in the circuit writer without departing from the spirit and scope of the invention. Materials may be substituted for those specified, dimensions may be altered, positions of elements may be changed, and much more. As an example, although stepping motors are used in the preferred embodiments described there are other kinds of motors, such as synchronous motors, that might be used with appropriate sensors. Stepping motors are preferred because the computer can sense positions without the use of external sensors. Similarly, the pad materials may be different from those of the preferred mode, and in the case of surface mount components would not be required at all. Also, the pads could themselves be constructed of PTF. It will also be apparent to those skilled in the art that different drive systems completely could be used, for example a system of lead screws could be used to provide the x-, y- motions. As another example, although specific sizes are provided for elements of the circuit writers described, and pcb blanks are restricted to a certain maximum size to mount on the write table, circuit writers may be built to do larger or smaller boards without departing from the spirit or scope of the invention. It would be possible, too, to mount more than two writing assemblies on the write carriage, each applying a different material, or all applying the same material. Also, although the system has been described as producing boards that are via-less, in some instances vias may be desired, so that using this extruded PTF approach preserves the option of using vias or not using vias. Also, in some instances, it may prove desirable to mix various method, for example it may prove useful to provide the conductive traces by extrusion, but to provide an insulative layer over the whole board, rather than only over the conductive traces. In addition, although the circuit writer has been described in the context of a flat circuit board, there is no inherent limitation restricting the method of the invention to such two dimensional substrates, and in fact three dimensional structures could be constructed according to the method as well. There are different computer platforms and data storage devices that might be used, and there are many variations that might be made in the programming and data handling elements, all without departing from the spirit and scope of the invention as outlined in the appended claims.

APPENDIX A

```
;**********                 ....         ....    ..........
;*                 ARIEL ELECTRONICS, INC.
;***************************************************************
;*  PRIMITIVE MOTIONS LIST used on the CIRCUIT WRITER
;***************************************************************
;* REVISION BLOCK
;*      Version 1.0
;***************************************************************
;* The Following file is a list of the machine primitive motions
;* used by the Process Control Module to control the extrusion
;* system for creating a circuit board.
;***************************************************************
file_name Motion File
;***************************************************************
;*     DESCRIPTION
;*
;List of precomputed motor motions
;
; Valid commands are primitive, mcitem, and end
; describe a primitive in the following method
; primitive x_delta, y_delta
; mcitem x_acceleration, y_acceleration, z_acceleration, actuator, time
; end must be included at the end of the file
;
; All values are ((acceleration in mills/sec^2)(delta t)^2)10240000
;        where delta t = .0005 seconds
;                                       so (delta t)^2 = .00000025
;    For example if 50 inches/sec^2 is the desired acceleration
;       then
;          value = ((50,000)(.00000025)(10240000) = 128000
;
; The actuator byte has the following values
;   bit 7 | bit 6 | bit 5 | bit 4 | bit 3 | bit 2 | bit 1 | bit 0
; 1 = Z1 |1 = Z2 | spare |1 =v2 off|1 = v2 on|1 =v1 off|1 = v1 on| pen lift
;
;   v1 = conductor pen valve
;   v2 = insulator pen valve
;   bits 6 & 7 are used to flag the z accelerations as z1 or z2
;
;*********************
; INSULATOR OFFSET   *
;*********************
;
; START_TRACE
;
;accelerates at 7.8125 inches/sec^2 for 65 milliseconds until vel = .5 inch/sec
primitive
mcitem 0, 0, -177766, 145, 24
mcitem 0, 0, 177766, 145, 24
mcitem 0, 0, 0, 145, 132
mcitem 0, 128000, 0, 145, 20
mcitem 0, 0, 0, 129, 1
;
; ARC_45_POS
;
primitive
mcitem 181988, -75383, 0, 129, 40
;
; ARC_45_NEG
;
primitive
mcitem -181988, -75383, 0, 129, 40
;
; ARC_90_POS
; arc radius of 12 mills
primitive
mcitem 26666, -26666, 0, 129, 96
;
; ARC_90_NEG
; arc radius of 12 mills
primitive
mcitem -26666, -26666, 0, 129, 96
;
; HOP_UP
;
primitive
mcitem 0, 0, 0, 129, 1
mcitem 0, -89600, 256000, 129, 16
mcitem 0, 0, 0, 129, 16
mcitem 0, 89600, -256000, 129, 16
mcitem 0, 0, 0, 129, 48
;
; HOP_DOWN
;
primitive
mcitem 0, 0, 0, 129, 48
mcitem 0, -89600, -256000, 129, 16
mcitem 0, 0, 0, 129, 16
mcitem 0, 89600, 256000, 129, 16
mcitem 0, 0, 0, 129, 1
;
```

```
; STOP_TRACE
; decelerates at 50 inches/sec^2 until velocity = 0
primitive
mcitem 0, -128000, 0, 137, 20
mcitem 0, 0, 177766, 137, 24
mcitem 0, 0, -177766, 137, 24
mcitem 0, 0, 0, 137, 185
mcitem 0, 0, 0, 128, 1
;
;*********************
; CONDUCTOR OFFSET   *
;*********************
;
; START_TRACE
;
;accelerates at 7.8125 inches/sec^2 for 65 milliseconds until vel = .5 inch/sec
primitive
mcitem 0, 0, 0, 68, 40
mcitem 0, 0, -128000, 68, 20
mcitem 0, 0, 128000, 68, 20
mcitem 0, 0, 128000, 68, 20
mcitem 0, 0, -128000, 68, 20
mcitem 0, 128000, 0, 68, 20
mcitem 0, 0, 0, 64, 1
;
; ARC_45_POS
;
primitive
mcitem 181988, -75383, 0, 64, 40
;
; ARC_45_NEG
;
primitive
mcitem -181988, -75383, 0, 64, 40
;
; ARC_90_POS
; arc radius of 12 mils
primitive
mcitem 26666, -26666, 0, 64, 96
;
; ARC_90_NEG
; arc radius of 12 mils
primitive
mcitem -26666, -26666, 0, 64, 96
;
; HOP_UP
;
primitive
mcitem 0, 0, 0, 64, 30
mcitem 0, -38400, 0, 64, 16
mcitem 0, 0, 192000, 64, 16
mcitem 0, 0, 0, 64, 20
mcitem 0, 0, -192000, 64, 16
mcitem 0, 38400, 0, 64, 16
mcitem 0, 0, 0, 64, 22
;
; HOP_DOWN
;
primitive
mcitem 0, 0, 0, 64, 45
mcitem 0, -89600, 0, 64, 8
mcitem 0, -89600, -192000, 64, 8
mcitem 0, 0, -192000, 64, 8
mcitem 0, 0, 0, 64, 20
mcitem 0, 0, 192000, 64, 8
mcitem 0, 89600, 192000, 64, 8
mcitem 0, 89600, 0, 64, 8
mcitem 0, 0, 0, 64, 1
;
; STOP_TRACE
; decelerates at 50 inches/sec^2 until velocity = 0
primitive
mcitem 0, -128000, 0, 64, 20
mcitem 0, 0, 0, 73, 5
mcitem 0, 0, 0, 64, 5
mcitem 0, 0, -128000, 64, 20
mcitem 0, 0, 128000, 64, 20
mcitem 0, 0, 128000, 64, 20
mcitem 0, 0, -128000, 64, 20
;
;*********************
; FAST MOVE OFFSET   *
;*********************
;
; START_TRACE
; accelerates at 100 inches per sec^2 till vel = 3 inches per sec
primitive
;mcitem 0, 128000, 0, 128, 20
mcitem 0, 192000, 0, 128, 80
mcitem 0, 0, 0, 128, 1
;
; ARC_45_POS
;
primitive
```

```
mcitem 1988737, -823762, 0, 0, 40
;
; ARC_45_NEG
;
primitive
mcitem -1988737, -823762, 0, 0, 40
;
; ARC_90_POS
primitive
mcitem 2880000, -2880000, 0, 0, 40
;
; ARC_90_NEG
;
primitive
mcitem -2880000, -2880000, 0, 0, 40
;
; HOP_UP
;
primitive
mcitem 0, 0, 5, 0, 10
mcitem 0, 0, -5, 0, 10
;
; HOP_DOWN
;
primitive
mcitem 0, 0, -5, 0, 10
mcitem 0, 0, 5, 0, 10
;
; STOP_TRACE
primitive
;mcitem 0, -128000, 0, 128, 20
mcitem 0, -192000, 0, 128, 80
mcitem 0, 0, 0, 128, 1
;
; The following parameter is the distance from the home position to
; the CAD system corrodanate 0,0.
x_board_offset 10364
;4560
;3714
y_board_offset 3396
;1168
;373
;
; The following parameter is the system scaling correction
; The value is in percent * 100. For example -1.31% has an entry of -131.
x_scale_const 0
;-131
y_scale_const 0
;-103
;
; The following parameter is the position of the height sensing pad in mills.
;   This position should be as close to the upper left corner as possible
;   so the system is able to do side touches. The intial value show below
;   are in scaled degrees assuming 13.92 deg/mill in x and 11.19 deg/mill
;   in y.
x_pen_sense_location 49252
;51340 e2's position
;49252 e1's position
y_pen_sense_location 80244
;81251 e2's position
;80244 e1's position
;
; The following is the location of the step location
x_pen_low_step_location 47252
y_pen_low_step_location 67375
x_pen_high_step_location 47252
y_pen_high_step_location 72970
; The following parameter is the place where the head goes when its finished
; a pass. These values are in mills.
x_done_place 0
y_done_place 0
;
; The following is an estimate of the distance between the insulator
; and conductor pens. These values are used by the automatic pen offset
; routine in TOUCH.C. The initial values are in scaled degrees
; after the real values are found, they are stored as mills
; to move insul pen west, abs value of number is larger (more neg)
insulator_pen_x_offset 0
;
; to move insul pen south, abs value of number is larger (more neg)
insulator_pen_y_offset -609
;
; The following parameter is the distance between the sagamo touch
; sensor and the center of the conductor pen in degrees
x_sagmo -32239
;-32239 e2's position
;-32485 e1's position
y_sagmo -3079
;-3079 e2's position
;-3496 e1's position
;
; The following parameter is the distance from the camera to the conductor pen
; The initial values are in scaled degrees.
```

```
camera_x_offset -48112
camera_y_offset -3228
;
; The following parameter is the number of ticks from the END of the
; stop primitive, that the approprate valve is turned off.
; The minimum value here is 2, because the last entry in the stop
; primitive always resets this bit.
conductor_off_delay 2
insulator_off_delay 150
;
; This is the deceleration value in inches/sec^2 that is used when a stop
; command is issued to the lsr. For example in the homming process, and
; the head is moving toward the home switch, a stop command is issued
; as soon as the home switch is activated.
x_stop_decel 100
y_stop_decel 100
;
; The pen_height is the height,in mills, above the board that the pen
; is normally located.
; The drop_height is the distance the pen has to drop to be at the correct
; distance for extruding PTF.
conductor_pen_height 130
conductor_drop_height 121
insulator_pen_height 130
insulator_drop_height 107
;
; The following varibles are used in the TOUCH module when doing side
; touches for finding insulator to conductor pen distance.
; _zone_touch_distance is the distance from the touch plate that the pen
;    is droped when doing side touches.
; Touch_drop_height is the distance the pen is dropped when doing side touches
; max_slow_distance is the number of mills that is possible befor the
;    random move process goes from slow speed to fast speed.
x_zone_touch_distance 2000
y_zone_touch_distance 1000
touch_drop_height 155
max_slow_dist 115
;
; The following parameters are the pen outer diameters and are in mills.
; These values are used in the TOUCH module to correct for side touch.
conductor_pen_diameter 18
insulator_pen_diameter 18
;
; The following parameter is the head delay after a trace has been compleated
; The value is in ticks so a delay of 2000 ticks is 1 second.
; WARNING -- the minimum value is 1
z_move_delay 10
;
; The following parameter is the number of elements in the kernal_shape array.
kernal_size 7
;
; The following array is the filter kernal value used by the kernal module
; This data is convolved with the input sample heights to form the surface
; in the z correction table. The values here are percent * 1000.
;  For example 75% is 750, 100% is 1000, ect.
kernal_shape 0 333 666 1000 666 333 0
;
; The following are the locations of the registration marks on the board
x_reg_1 400
y_reg_1 100
x_reg_2 400
y_reg_2 6200
x_reg_3 3500
y_reg_3 100
; The following array is the positions on the board where the height samples
; are to be taken. Values are in mills and are in board corrodanates.
; The height sample positions are x1,y1 x2,y2 x3,y3 ect.
height_position   250,  500    250,  800    250, 1100    250, 1400
height_position   250, 1700    250, 2000    250, 2300    250, 2600
height_position   250, 2900    250, 3200    250, 3500    250, 3800
height_position   250, 4100    250, 4400    250, 4700    250, 5000
height_position   250, 5300    250, 5600    550,  500    550,  800
height_position   550, 1100    550, 1400    550, 1700    550, 2000
height_position   550, 2300    550, 2600    550, 2900    550, 3200
height_position   550, 3500    550, 3800    550, 4100    550, 4400
height_position   550, 4700    550, 5000    550, 5300    550, 5600
height_position   850,  500    850,  800    850, 1100    850, 1400
height_position   850, 1700    950, 2000    850, 2300    850, 2600
height_position   850, 2900    850, 3200    850, 3500    850, 3800
height_position   850, 4100    850, 4400    850, 4700    850, 5000
height_position   850, 5300    850, 5600   1150,  500   1150,  800
height_position  1150, 1100   1150, 1400   1150, 1700   1150, 2000
height_position  1150, 2300   1150, 2600   1150, 2900   1150, 3200
height_position  1150, 3500   1150, 3800   1150, 4100   1150, 4400
height_position  1150, 4700   1150, 5000   1150, 5300   1150, 5600
height_position  1450,  500   1450,  800   1450, 1100   1450, 1400
height_position  1450, 1700   1450, 2000   1450, 2300   1450, 2600
height_position  1450, 2900   1450, 3200   1450, 3500   1450, 3800
height_position  1450, 4100   1450, 4400   1450, 4700   1450, 5000
```

What is claimed is:

1. An extrudable polymer thick film material for producing electrically conductive traces on a substrate comprising a mixture of an epoxy resin, a hardener for said epoxy resin, conductive particles, and at least two solvents,
   a first one of said solvents being relatively volatile as compared with a second one of said solvents, said solvents being present in quantities and in proportions relative to one another which permit said mixture to be extruded through a nozzle and such that said mixture has a viscosity of between 15,000 and 30,000 centipoise at a static shear rate of 20/sec and a viscosity of from one million to five million centipoise at a shear rate of about 0.01/sec
   said conductive particles comprising from 85% to 95% by weight of said mixture, and said resin and hardener comprising 10% to 15% by weight of the mixture.

2. A polymer thick film material mixture as in claim 1, wherein said conductive particles are a mixture of silver flake, silver clusters and silver spheres.

3. A polymer thick film material mixture as in claim 1, wherein said first one of said solvents and said second one of said solvents are present in a proportion of from 2:1 to 5:1 by volume.

4. A polymer thick film material as in claim 2 wherein said particles are a mixture of silver flake, silver clusters, and silver spheres in the ration of 96:24:5.

5. A polymer thick film material as in claim 1, wherein said first one of said solvents is acetone and the second one of said solvents is N-methylpyrrolidone.

* * * * *